US012288671B2

(12) United States Patent
Hasebe et al.

(10) Patent No.: US 12,288,671 B2
(45) Date of Patent: *Apr. 29, 2025

(54) FILM DEPOSITION APPARATUS FOR FINE PATTERN FORMING

(71) Applicant: Tokyo Electron Limited, Tokyo (JP)

(72) Inventors: Kazuhide Hasebe, Yamanashi (JP); Shigeru Nakajima, Yamanashi (JP); Jun Ogawa, Yamanashi (JP); Hiroki Murakami, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/524,767

(22) Filed: Nov. 30, 2023

(65) Prior Publication Data

US 2024/0096595 A1 Mar. 21, 2024

Related U.S. Application Data

(60) Continuation of application No. 17/808,375, filed on Jun. 23, 2022, now Pat. No. 11,881,379, which is a (Continued)

(30) Foreign Application Priority Data

Sep. 29, 2008 (JP) ................................ 2008-251679
Sep. 7, 2009 (JP) ................................ 2009-206443

(51) Int. Cl.
*H01J 37/32* (2006.01)
*C23C 16/02* (2006.01)
(Continued)

(52) U.S. Cl.
CPC ........ *H01J 37/32091* (2013.01); *C23C 16/02* (2013.01); *C23C 16/402* (2013.01); (Continued)

(58) Field of Classification Search
CPC ............ H01J 37/32091; H01J 37/3244; H01J 37/32834; H01L 21/0338; H01L 21/31138;
(Continued)

(56) References Cited

U.S. PATENT DOCUMENTS 4,233,109 A 11/1980 Nishizawa
4,437,961 A 3/1984 Routh et al.
(Continued)

FOREIGN PATENT DOCUMENTS

JP 2757983 5/1998
JP 2004-080033 3/2004
(Continued)

OTHER PUBLICATIONS

U.S. Appl. No. 15/440,406, filed Feb. 23, 2017, US-2017-0162381-A1, Tokyo Electron Limited.
(Continued)

*Primary Examiner* — Kurt Sweely
(74) *Attorney, Agent, or Firm* — IPUSA, PLLC

(57) ABSTRACT

In a mask pattern forming method, a resist film is formed over a thin film, the resist film is processed into resist patterns having a predetermined pitch by photolithography, slimming of the resist patterns is performed, and an oxide film is formed on the thin film and the resist patterns after an end of the slimming step in a film deposition apparatus by supplying a source gas and an oxygen radical or an oxygen-containing gas. In the mask pattern forming method, the slimming and the oxide film forming are continuously performed in the film deposition apparatus.

25 Claims, 46 Drawing Sheets

START
S11 THIN FILM IS FORMED ON SUBSTRATE
S12 RESIST FILM IS FORMED ON THIN FILM
S13 RESIST FILM IS PROCESSED INTO RESIST PATTERN BY PHOTOLITHOGRAPHY
S14 SLIMMING OF RESIST PATTERN IS PERFORMED IN PROCESS CHAMBER OF FILM DEPOSITION APPARATUS FOR SILICON OXIDE FILM
S15 SILICON OXIDE FILM IS DEPOSITED ON RESIST PATTERN AND THIN FILM CONTINUOUSLY FROM THE END OF SLIMMING STEP
CONTINUOUS PROCESS IN THE SAME CHAMBER
S16 SILICON OXIDE FILM IS ETCHED TO REMAIN AS SIDE WALLS ON SIDE FACES OF LINE PART OF RESIST PATTERN
S17 RESIST PATTERN IS REMOVED AND ORGANIC FILM IS ETCHED USING SIDE WALL PARTS AS A MASK
S18 THIN FILM IS ETCHED USING MASK PATTERN INCLUDING SIDE WALL PARTS AND ORGANIC FILM AS A MASK
END
PATTERNING STEP
SLIMMING STEP
FILM DEPOSITION STEP
ETCHING STEP

MEMORY PART
CONTROLLER
USER INTERFACE
OXYGEN CONTAINING GAS
Si SOURCE GAS
PURGE GAS

Related U.S. Application Data continuation of application No. 16/202,745, filed on Nov. 28, 2018, now Pat. No. 11,404,271, which is a continuation of application No. 13/848,849, filed on Mar. 22, 2013, now Pat. No. 10,176,992, which is a division of application No. 12/567,834, filed on Sep. 28, 2009, now Pat. No. 8,426,117.

(51) Int. Cl.

| | |
|---|---|
| ***C23C 16/40*** | (2006.01) |
| ***C23C 16/455*** | (2006.01) |
| ***G03F 7/40*** | (2006.01) |
| ***H01L 21/02*** | (2006.01) |
| ***H01L 21/027*** | (2006.01) |
| ***H01L 21/033*** | (2006.01) |
| ***H01L 21/311*** | (2006.01) |
| ***H01L 21/316*** | (2006.01) |
| ***H01L 21/3213*** | (2006.01) |
| ***H01L 21/768*** | (2006.01) |

(52) U.S. Cl.

CPC ...... *C23C 16/403* (2013.01); *C23C 16/45536* (2013.01); *G03F 7/40* (2013.01); *H01J 37/3244* (2013.01); *H01J 37/32834* (2013.01); *H01L 21/027* (2013.01); *H01L 21/0274* (2013.01); *H01L 21/0337* (2013.01); *H01L 21/0338* (2013.01); *H01L 21/31138* (2013.01); *H01L 21/31144* (2013.01); *H01L 21/31608* (2013.01); *H01L 21/31616* (2013.01); *H01L 21/32139* (2013.01); *H01L 21/76816* (2013.01); *H01L 21/02164* (2013.01); *H01L 21/02178* (2013.01); *H01L 21/02219* (2013.01); *H01L 21/02274* (2013.01); *H01L 21/0228* (2013.01)

(58) Field of Classification Search

CPC ......... H01L 21/31144; H01L 21/32139; H01L 21/76816; H01L 21/31616; H01L 21/31608; H01L 21/027; H01L 21/0274; H01L 21/02164; H01L 21/02178; H01L 21/02219; H01L 21/0228; H01L 21/02274; G03F 7/40

See application file for complete search history.

(56) References Cited

U.S. PATENT DOCUMENTS

| | | | |
|---|---|---|---|
| 4,534,389 | A | 8/1985 | Tullis |
| 4,950,956 | A | 8/1990 | Asamaki et al. |
| 6,482,720 | B2 * | 11/2002 | Sugino .............. H01L 29/66462 438/483 |
| 6,620,631 | B1 | 9/2003 | Tao et al. |
| 6,755,945 | B2 | 6/2004 | Yasar et al. |
| 6,861,334 | B2 | 3/2005 | Raaijmakers et al. |
| 7,625,460 | B2 | 12/2009 | Howard |
| 7,790,628 | B2 | 9/2010 | Clark et al. |
| 8,426,117 | B2 | 4/2013 | Hasebe et al. |
| 10,176,992 | B2 | 1/2019 | Hasebe et al. |
| 11,404,271 | B2 * | 8/2022 | Hasebe ............. H01L 21/31144 |
| 2002/0160628 | A1 | 10/2002 | Okoroanyanwu et al. |
| 2003/0049372 | A1 | 3/2003 | Cook et al. |
| 2003/0209324 | A1 | 11/2003 | Fink |
| 2005/0070111 | A1 | 3/2005 | Kushibiki et al. |
| 2005/0233598 | A1 | 10/2005 | Jung et al. |
| 2005/0287806 | A1 | 12/2005 | Matsuura |
| 2006/0032443 | A1 | 2/2006 | Hasebe et al. |
| 2006/0148151 | A1 | 7/2006 | Murthy et al. |
| 2007/0116888 | A1 | 5/2007 | Faguet |
| 2008/0081104 | A1 | 4/2008 | Hasebe et al. |
| 2008/0090419 | A1 | 4/2008 | Koh et al. |
| 2008/0149593 | A1 | 6/2008 | Bai et al. |
| 2008/0207007 | A1 | 8/2008 | Thridandam et al. |
| 2009/0239382 | A1 | 9/2009 | Zhu |
| 2009/0291232 | A1 | 11/2009 | Washio et al. |
| 2010/0019399 | A1 | 1/2010 | Kimura et al. |
| 2010/0041243 | A1 | 2/2010 | Cheng et al. |
| 2010/0055347 | A1 | 3/2010 | Kato et al. |
| 2010/0112496 | A1 | 5/2010 | Nakajima et al. |
| 2011/0003469 | A1 | 1/2011 | Kewley et al. |

FOREIGN PATENT DOCUMENTS

| | | |
|---|---|---|
| TW | 200819910 | 5/2008 |
| TW | 200832554 | 8/2008 |
| TW | 200837087 | 9/2008 |

OTHER PUBLICATIONS

U.S. Appl. No. 16/216,255, filed Dec. 11, 2018, US-2019-0115204-A1, Tokyo Electron Limited.

U.S. Appl. No. 15/714,052, filed Sep. 25, 2017, US-2018-0019113-A1, Tokyo Electron Limited.

U.S. Appl. No. 16/157,461, filed Oct. 11, 2018, US-2019-0041756-A1, Tokyo Electron Limited.

* cited by examiner

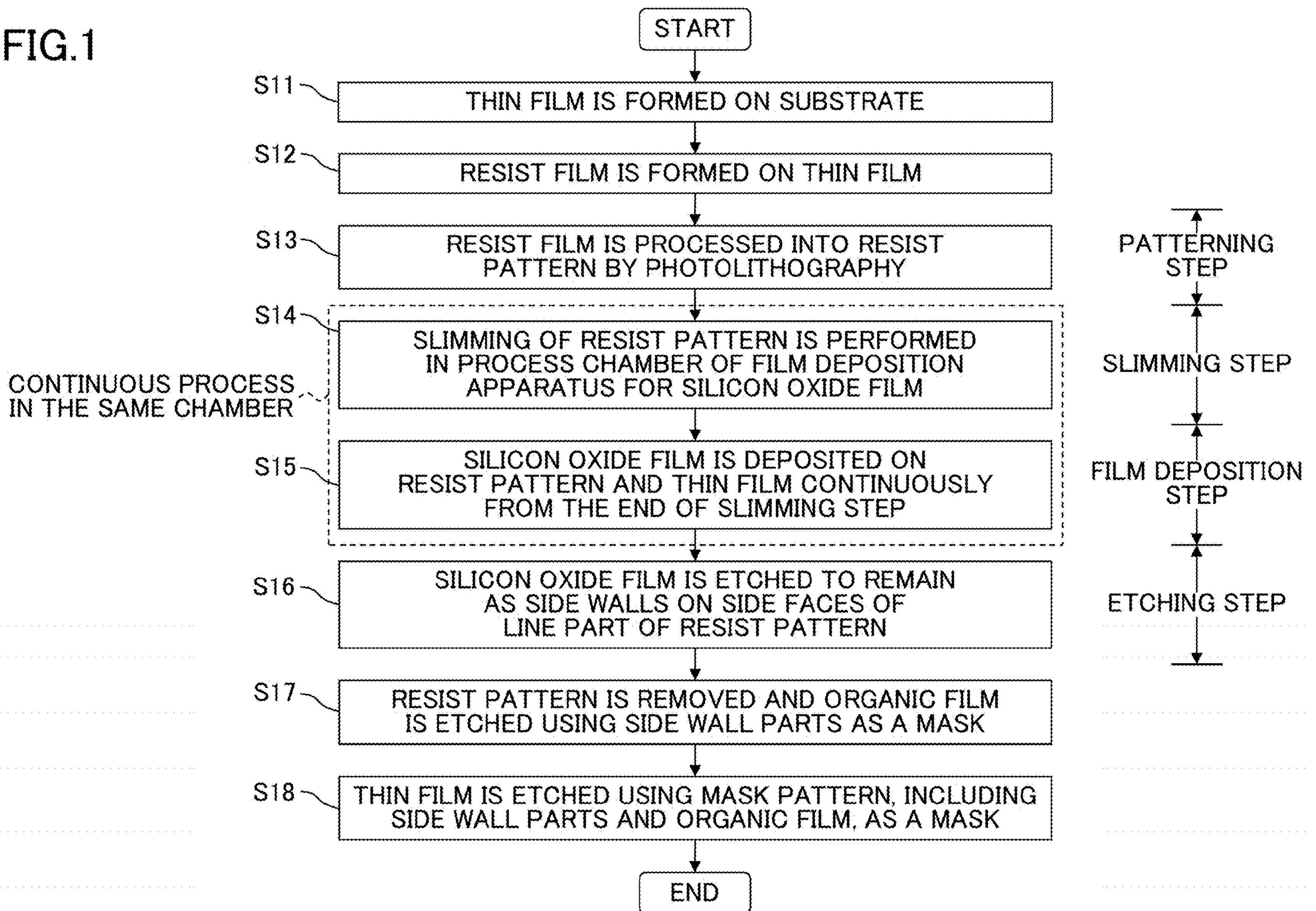
FIG.1
START
S11
THIN FILM IS FORMED ON SUBSTRATE
S12
RESIST FILM IS FORMED ON THIN FILM
S13
RESIST FILM IS PROCESSED INTO RESIST PATTERN BY PHOTOLITHOGRAPHY
PATTERNING STEP
S14
SLIMMING OF RESIST PATTERN IS PERFORMED IN PROCESS CHAMBER OF FILM DEPOSITION APPARATUS FOR SILICON OXIDE FILM
SLIMMING STEP
CONTINUOUS PROCESS IN THE SAME CHAMBER
S15
SILICON OXIDE FILM IS DEPOSITED ON RESIST PATTERN AND THIN FILM CONTINUOUSLY FROM THE END OF SLIMMING STEP
FILM DEPOSITION STEP
S16
SILICON OXIDE FILM IS ETCHED TO REMAIN AS SIDE WALLS ON SIDE FACES OF LINE PART OF RESIST PATTERN
ETCHING STEP
S17
RESIST PATTERN IS REMOVED AND ORGANIC FILM IS ETCHED USING SIDE WALL PARTS AS A MASK
S18
THIN FILM IS ETCHED USING MASK PATTERN, INCLUDING SIDE WALL PARTS AND ORGANIC FILM, AS A MASK
END PURGE GAS
OXYGEN CONTAINING GAS
Si SOURCE GAS
CONTROLLER
MEMORY PART
USER INTERFACE
W
W
80
40
37
38
5
6
7
8
22a
22a
2
39
1
22
30
32
19
19a
34
35
33
36
31
12
12
9
3
4
25
24a
24b
24
23
16
11
13
10
18
18a
18b
21
21a
21b
14
15
17
20
50
51
52
60

Si SOURCE GAS
OXYGEN CONTAINING GAS (O2 GAS)
PURGE GAS (N2 GAS)
PLASMA
T1
T2
T3
T5
T4
T5
T3
T6
STEP S1
STEP S2
STEP S3
STEP S5
STEP S4
STEP S5
STEP S3
SLIMMING STEP
FILM DEPOSITION STEP

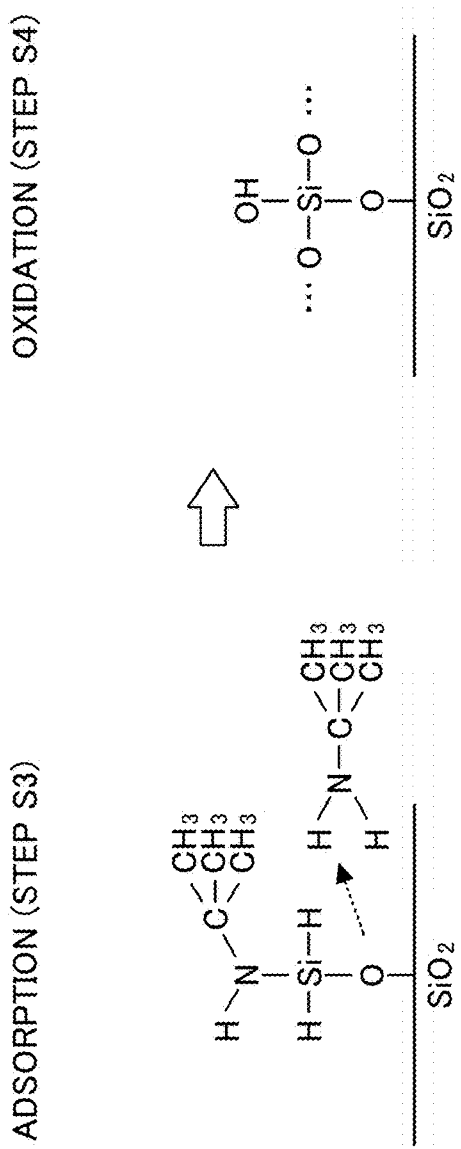
FIG.6C
OXIDATION (STEP S4)
OH
SiO2
FIG.6B
ADSORPTION (STEP S3)
SiO2
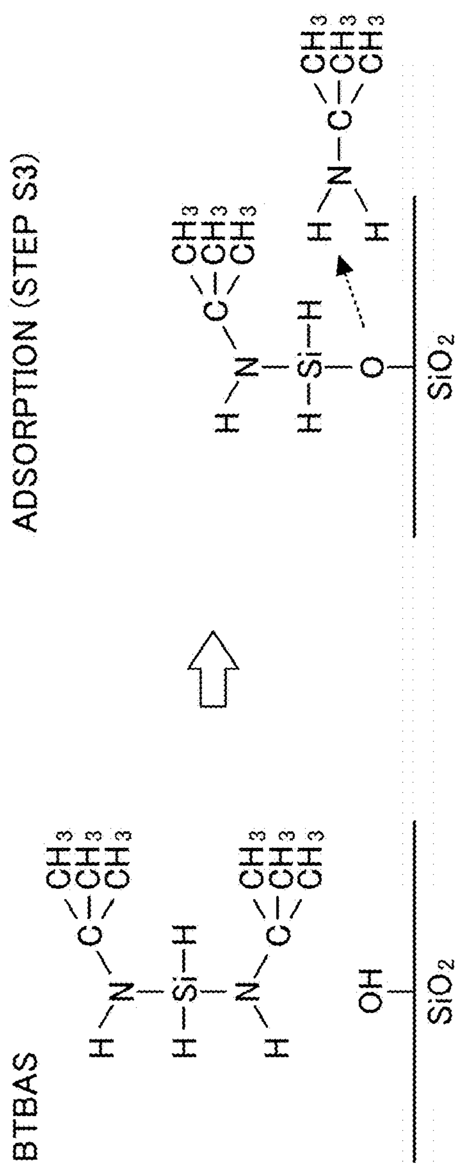
FIG.6A
BTBAS
OH
SiO2

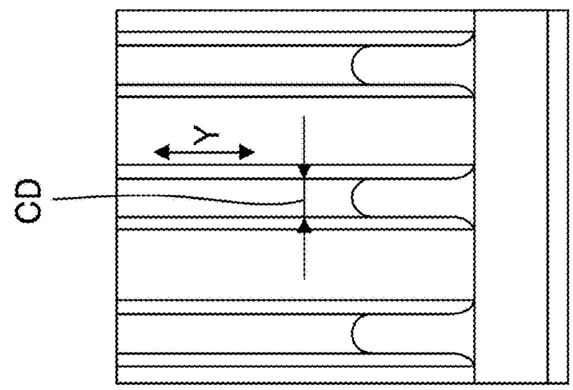
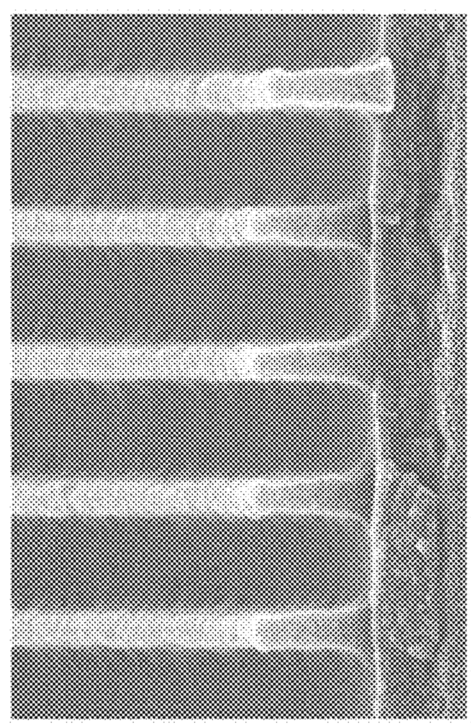
FIG.9A
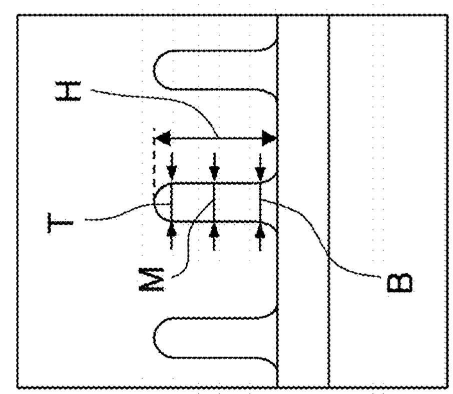
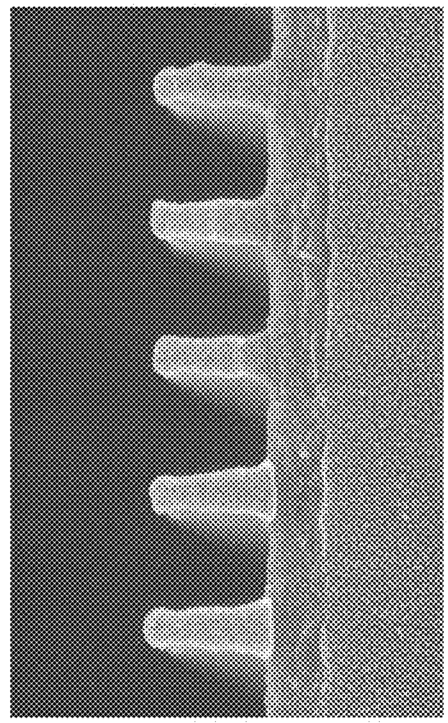
FIG.9B

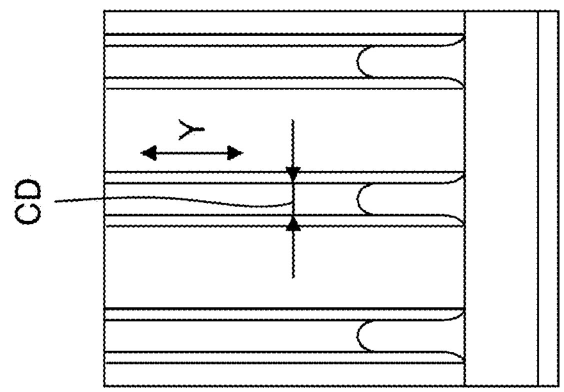
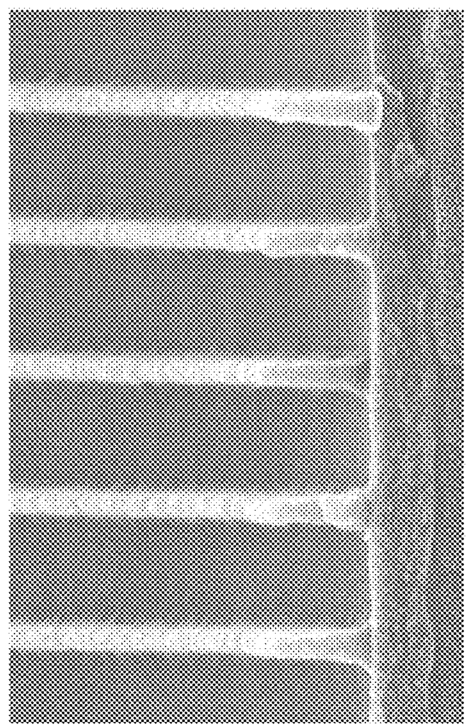
FIG.10A
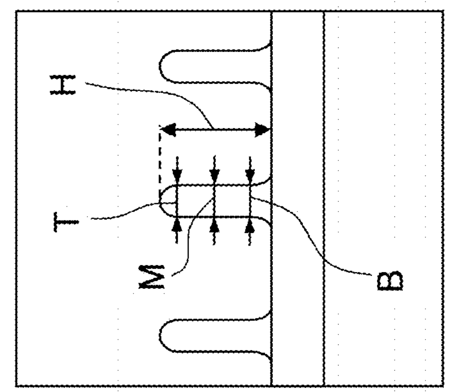
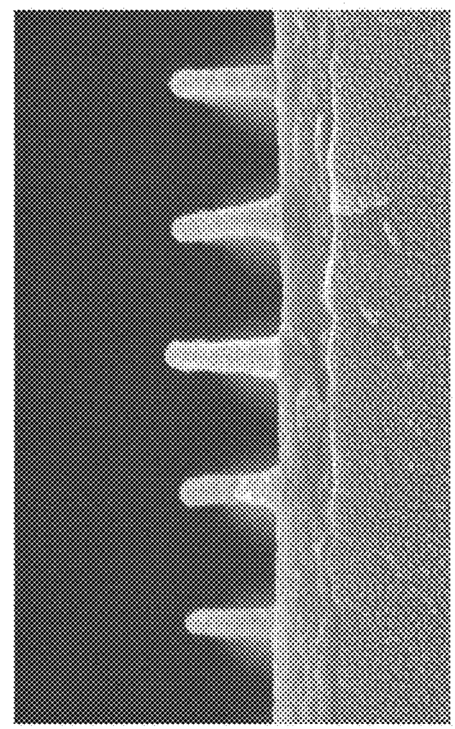
FIG.10B

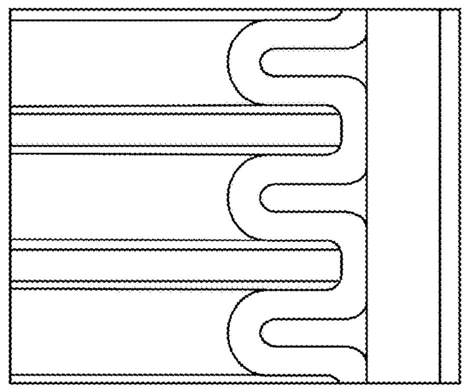
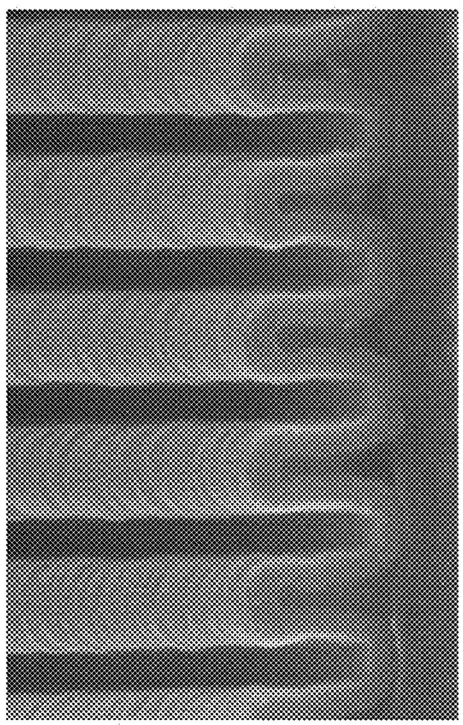
FIG.15A
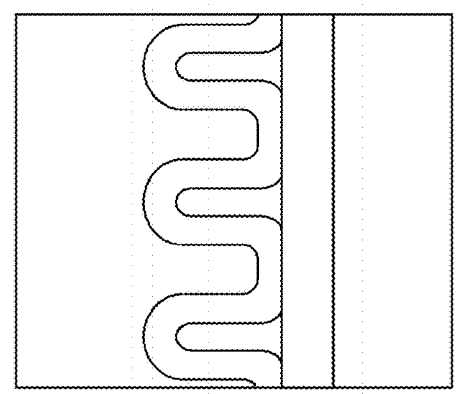
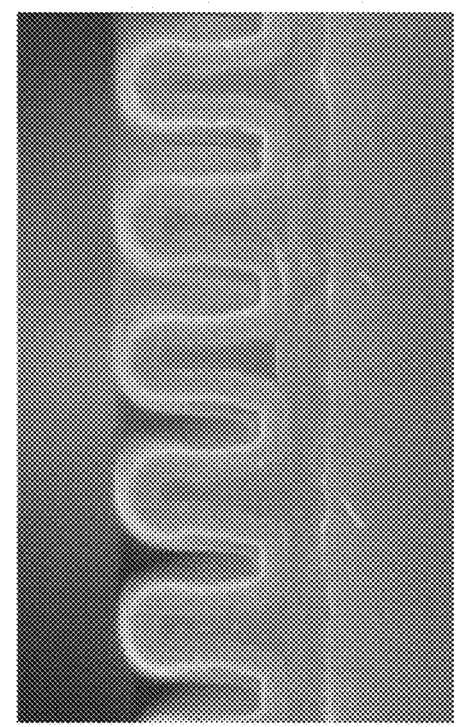
FIG.15B

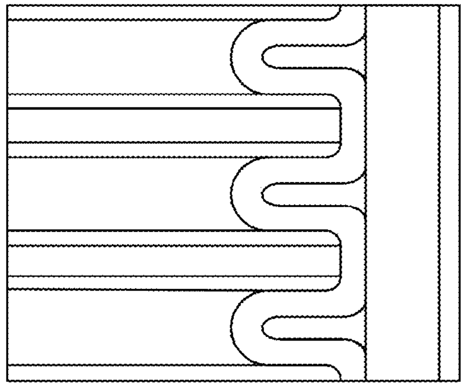
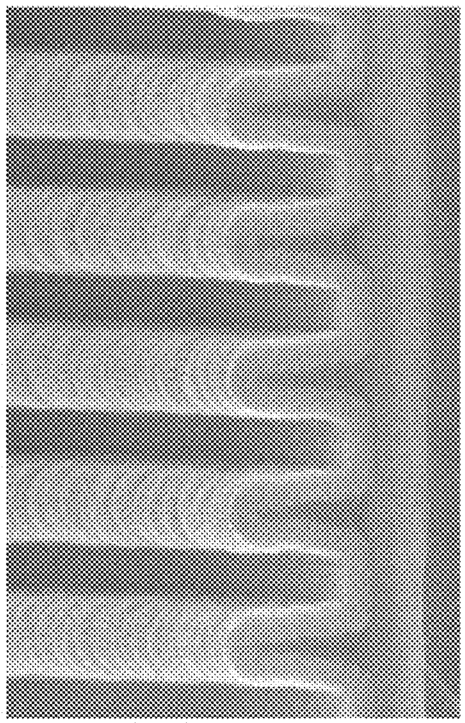
FIG.16A
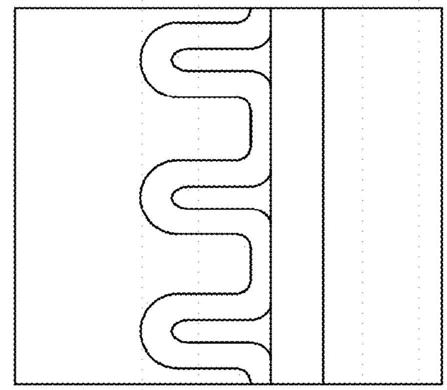
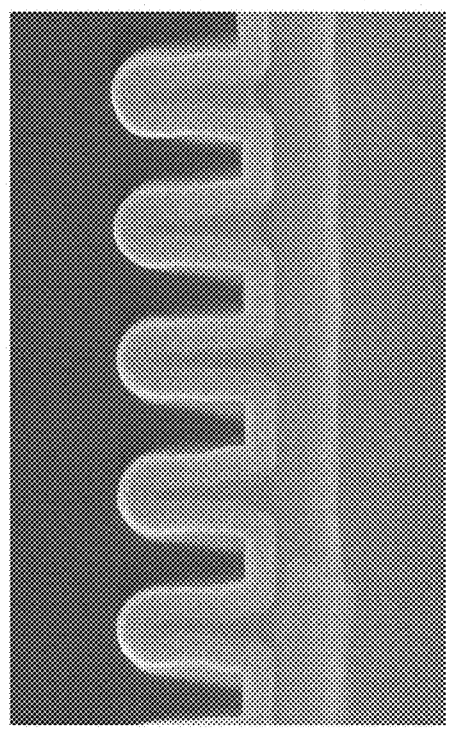
FIG.16B

MEMORY PART
CONTROLLER
USER INTERFACE
OZONE CONTAINING GAS
OXYGEN CONTAINING GAS
Si SOURCE GAS
PURGE GAS

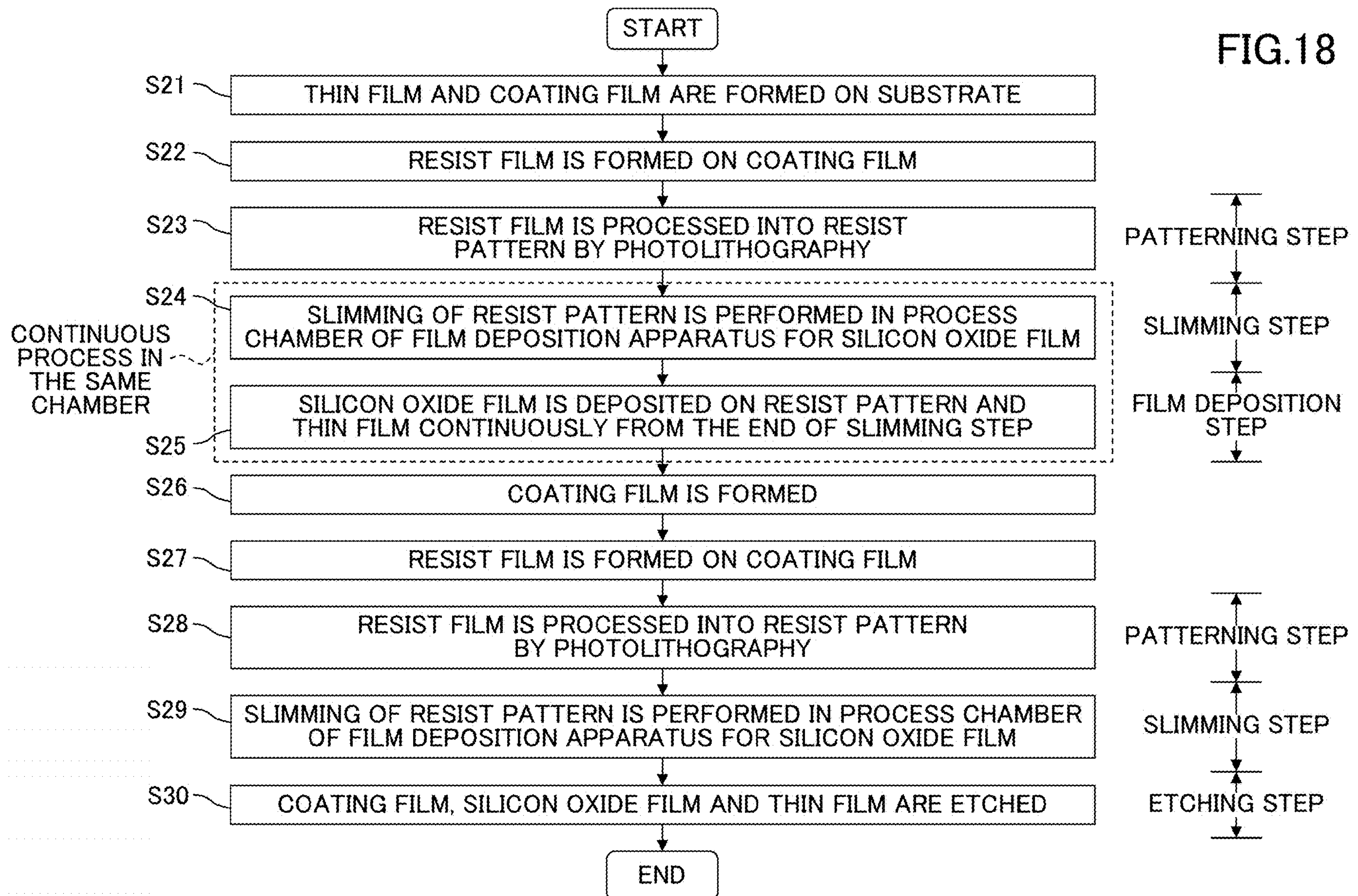
FIG.18
START
S21
THIN FILM AND COATING FILM ARE FORMED ON SUBSTRATE
S22
RESIST FILM IS FORMED ON COATING FILM
S23
RESIST FILM IS PROCESSED INTO RESIST PATTERN BY PHOTOLITHOGRAPHY
PATTERNING STEP
S24
SLIMMING OF RESIST PATTERN IS PERFORMED IN PROCESS CHAMBER OF FILM DEPOSITION APPARATUS FOR SILICON OXIDE FILM
SLIMMING STEP
CONTINUOUS PROCESS IN THE SAME CHAMBER
S25
SILICON OXIDE FILM IS DEPOSITED ON RESIST PATTERN AND THIN FILM CONTINUOUSLY FROM THE END OF SLIMMING STEP
FILM DEPOSITION STEP
S26
COATING FILM IS FORMED
S27
RESIST FILM IS FORMED ON COATING FILM
S28
RESIST FILM IS PROCESSED INTO RESIST PATTERN BY PHOTOLITHOGRAPHY
PATTERNING STEP
S29
SLIMMING OF RESIST PATTERN IS PERFORMED IN PROCESS CHAMBER OF FILM DEPOSITION APPARATUS FOR SILICON OXIDE FILM
SLIMMING STEP
S30
COATING FILM, SILICON OXIDE FILM AND THIN FILM ARE ETCHED
ETCHING STEP
END

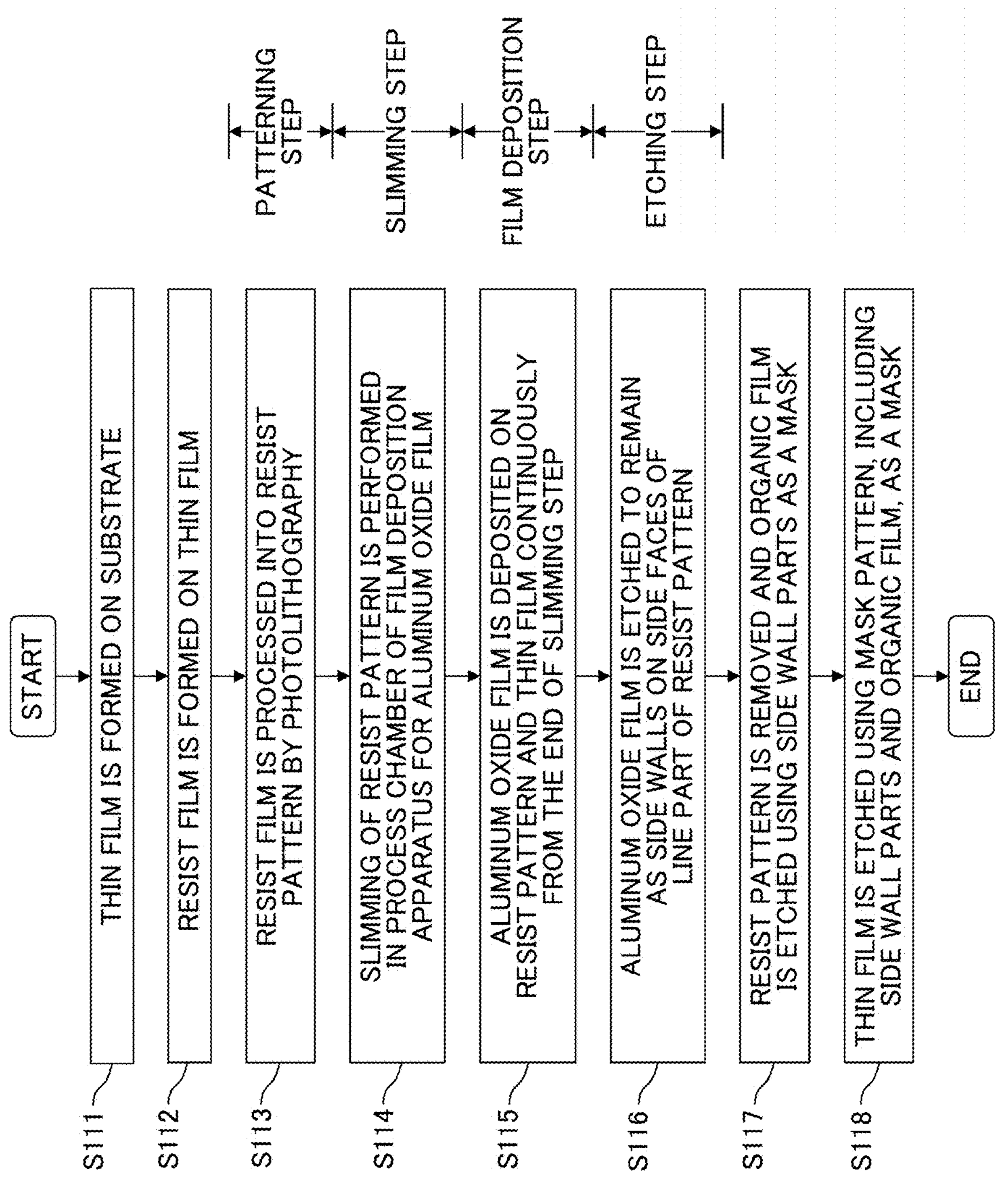
FIG.21
START
S111
THIN FILM IS FORMED ON SUBSTRATE
S112
RESIST FILM IS FORMED ON THIN FILM
S113
RESIST FILM IS PROCESSED INTO RESIST PATTERN BY PHOTOLITHOGRAPHY
S114
SLIMMING OF RESIST PATTERN IS PERFORMED IN PROCESS CHAMBER OF FILM DEPOSITION APPARATUS FOR ALUMINUM OXIDE FILM
S115
ALUMINUM OXIDE FILM IS DEPOSITED ON RESIST PATTERN AND THIN FILM CONTINUOUSLY FROM THE END OF SLIMMING STEP
S116
ALUMINUM OXIDE FILM IS ETCHED TO REMAIN AS SIDE WALLS ON SIDE FACES OF LINE PART OF RESIST PATTERN
S117
RESIST PATTERN IS REMOVED AND ORGANIC FILM IS ETCHED USING SIDE WALL PARTS AS A MASK
S118
THIN FILM IS ETCHED USING MASK PATTERN, INCLUDING SIDE WALL PARTS AND ORGANIC FILM, AS A MASK
END
PATTERNING STEP
SLIMMING STEP
FILM DEPOSITION STEP
ETCHING STEP PURGE GAS
OZONE GAS
Al SOURCE GAS
CONTROLLER
MEMORY PART
USER INTERFACE
80b
40
5
37
38
39
60
2
22c
6
7
8
11
13
10
12
9
3
4
25
24a
24b
24
16
23
W
1b
22b
19b
19c
18e
18f
18g
14b
17b
21c
21d
21e
15b
20b
50
51
52

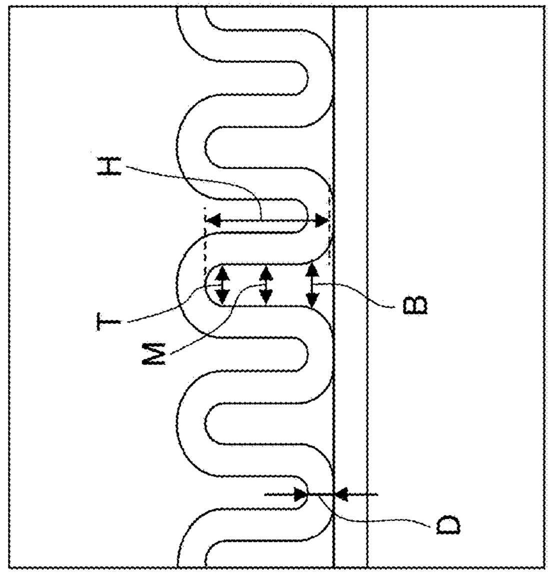
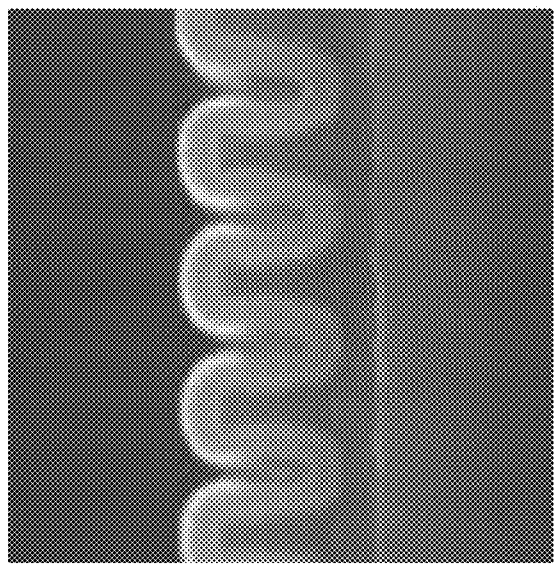
FIG.26A
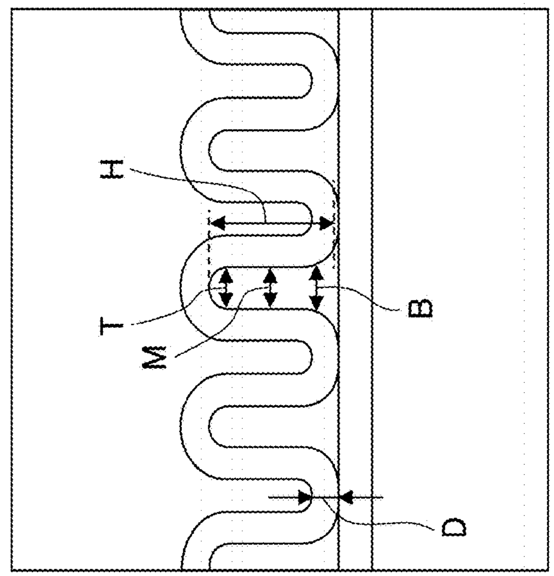
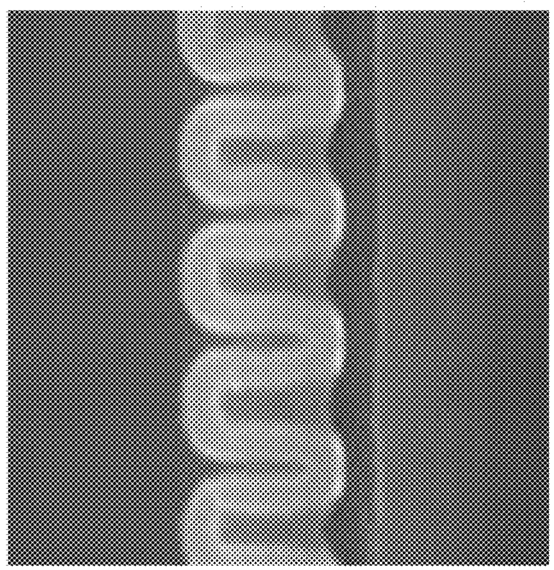
FIG.26B

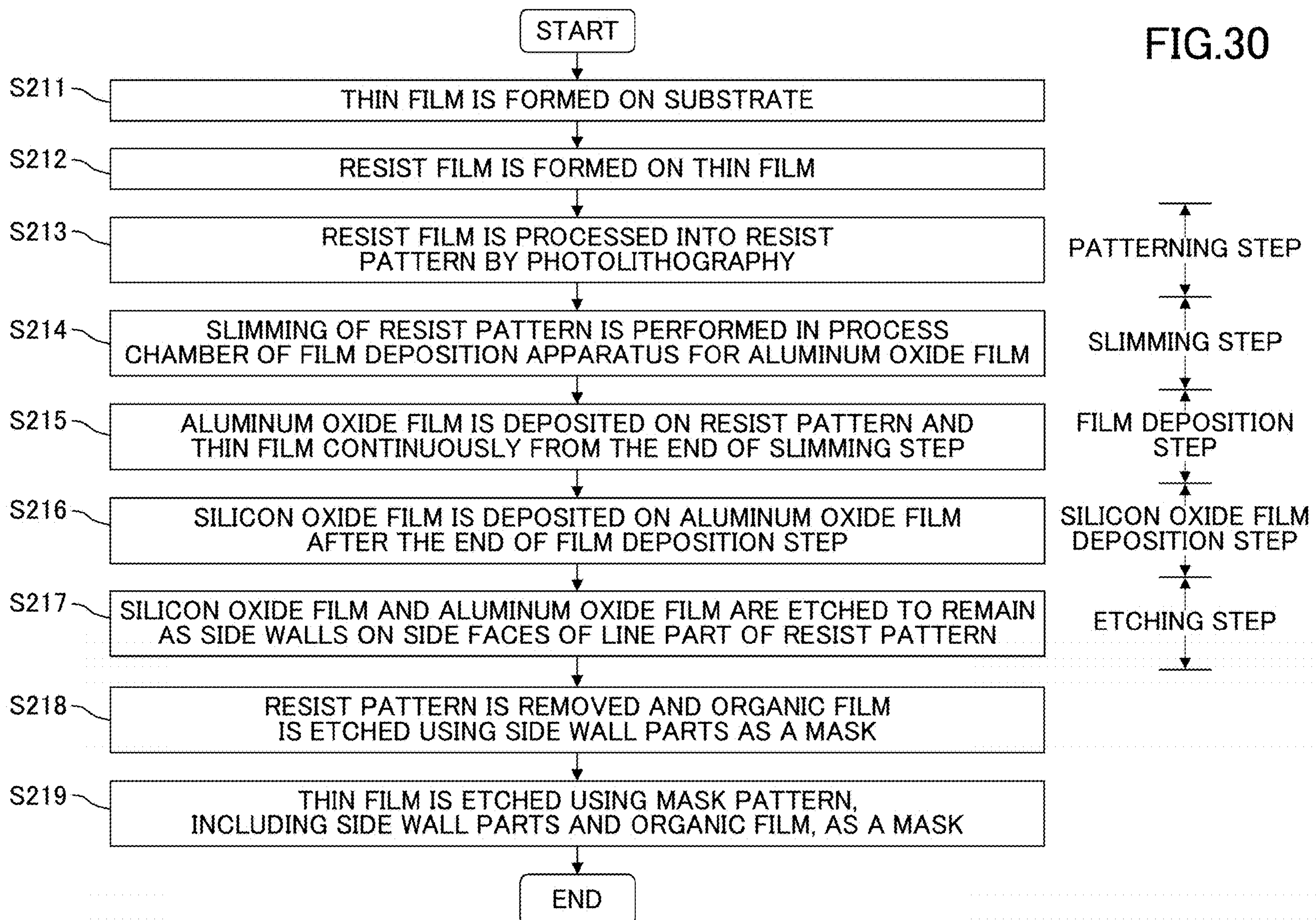
FIG.30
START
S211 THIN FILM IS FORMED ON SUBSTRATE
S212 RESIST FILM IS FORMED ON THIN FILM
S213 RESIST FILM IS PROCESSED INTO RESIST PATTERN BY PHOTOLITHOGRAPHY
S214 SLIMMING OF RESIST PATTERN IS PERFORMED IN PROCESS CHAMBER OF FILM DEPOSITION APPARATUS FOR ALUMINUM OXIDE FILM
S215 ALUMINUM OXIDE FILM IS DEPOSITED ON RESIST PATTERN AND THIN FILM CONTINUOUSLY FROM THE END OF SLIMMING STEP
S216 SILICON OXIDE FILM IS DEPOSITED ON ALUMINUM OXIDE FILM AFTER THE END OF FILM DEPOSITION STEP
S217 SILICON OXIDE FILM AND ALUMINUM OXIDE FILM ARE ETCHED TO REMAIN AS SIDE WALLS ON SIDE FACES OF LINE PART OF RESIST PATTERN
S218 RESIST PATTERN IS REMOVED AND ORGANIC FILM IS ETCHED USING SIDE WALL PARTS AS A MASK
S219 THIN FILM IS ETCHED USING MASK PATTERN, INCLUDING SIDE WALL PARTS AND ORGANIC FILM, AS A MASK
END
PATTERNING STEP
SLIMMING STEP
FILM DEPOSITION STEP
SILICON OXIDE FILM DEPOSITION STEP
ETCHING STEP FIG.32
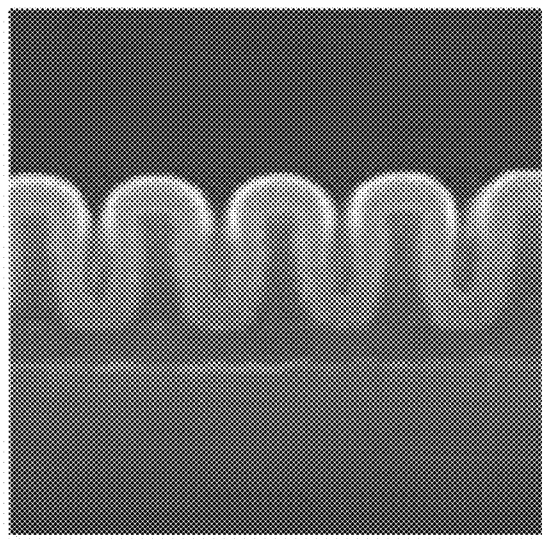
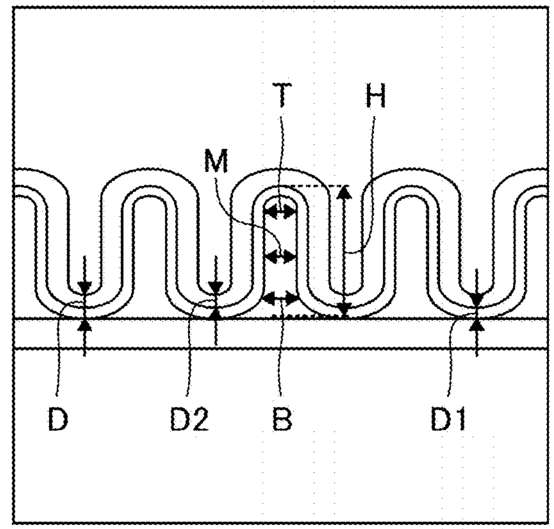
FIG.33
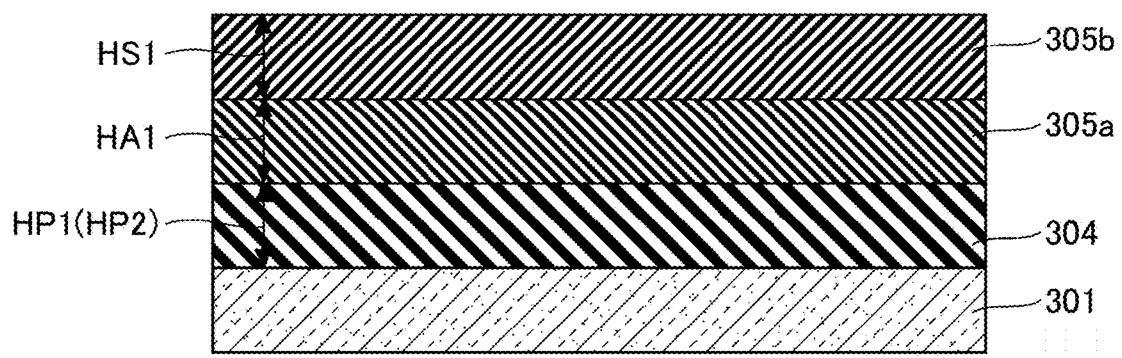

FIG.34

| KIND OF SLIMMING PROCESS | POWER OF SLIMMING PROCESS | H (nm) | T (nm) | M (nm) | B (nm) | T/B | CD (nm) | LWR (nm) |
|---|---|---|---|---|---|---|---|---|
| BEFORE SLIMMING PROCESS | — | 114.2 | 42.0 | 44.7 | 51.3 | 0.82 | 43.4 | 4.6 |
| SLIMMING IN FILM DEPOSITION DEVICE OF EXAMPLE 1 | LOW | 112.2 | 37.3 | 37.2 | 43.8 | 0.85 | 38.5 | 3.9 |
| | SLIGHTLY LOW | 111.9 | 35.8 | 35.6 | 40.1 | 0.89 | 35.4 | 4.2 |
| | SLIGHTLY HIGH | 109.5 | 33.9 | 32.3 | 35.5 | 0.95 | 33.4 | 3.6 |
| | HIGH | 108.8 | 32.6 | 30.7 | 34.5 | 0.94 | 33.0 | 3.9 |
| SLIMMING IN COATER OF COMPARATIVE EXAMPLE 1 | HIGH | 104.1 | 24.0 | 23.4 | 30.5 | 0.79 | 27.8 | 3.7 |

FIG.35

| KIND OF OXIDE FILM | H (nm) | T (nm) | M (nm) | B (nm) | T/B |
| --- | --- | --- | --- | --- | --- |
| EXAMPLE 2<br>$Al_2O_3$ FILM (THICKNESS D=30nm) | 118.1 | 40.4 | 36.8 | 49.4 | 0.82 |
| COMPARATIVE EXAMPLE 2<br>$SiO_2$ FILM (THICKNESS D=30nm) | 117.6 | 32.8 | 33.0 | 45.4 | 0.72 |

FIG.36

| | EXAMPLE 3 | | | | EXAMPLE 4 | COMPARATIVE EXAMPLE 3 |
|---|---|---|---|---|---|---|
| $SiO_2$ FILM THICKNESS HS (nm) | — | — | — | — | — | 5 |
| $Al_2O_3$ FILM FORMING METHOD | $O_3$ | $O_3$ | $O_3$ | $O_3$ | WVG | — |
| $Al_2O_3$ FILM THICKNESS HA (nm) | 5 | 10 | 15 | 20 | 10 | — |
| AMOUNT OF ASHING HP1−HP2 (Å) | 6.1 | 5.8 | 6.0 | 5.9 | 1.8 | 21.5 |

FIG.37

| KIND OF OXIDE FILM | H (nm) | T (nm) | M (nm) | B (nm) | T/B |
|---|---|---|---|---|---|
| EXAMPLE 5<br>UPPER: $SiO_2$ FILM (THICKNESS D2=25nm)<br>LOWER: $Al_2O_3$ FILM (THICKNESS D1=5nm) | 118.0 | 34.8 | 32.6 | 47.4 | 0.73 |
| COMPARATIVE EXAMPLE 2<br>$SiO_2$ FILM (THICKNESS D=30nm) | 117.6 | 32.8 | 33.0 | 45.4 | 0.72 |

FIG.38

| | EXAMPLE 6 | | | | EXAMPLE 7 | COMPARATIVE EXAMPLE 3 |
|---|---|---|---|---|---|---|
| $SiO_2$ FILM THICKNESS HS1 OR HS (nm) | 5 | 5 | 5 | 5 | 5 | 5 |
| $Al_2O_3$ FILM FORMING METHOD | $O_3$ | $O_3$ | $O_3$ | $O_3$ | WVG | — |
| $Al_2O_3$ FILM THICKNESS HA1 (nm) | 5 | 10 | 15 | 20 | 10 | — |
| AMOUNT OF ASHING HP1 − HP2 (Å) | 11.9 | 11.6 | 11.5 | 11.8 | 6.1 | 21.5 |

FILM DEPOSITION APPARATUS FOR FINE PATTERN FORMING

CROSS-REFERENCE TO RELATED APPLICATION

This application is a continuation of U.S. patent application Ser. No. 17/808,375, filed on Jun. 23, 2022, which is a continuation of U.S. patent application Ser. No. 16/202,745, filed on Nov. 28, 2018, which is a continuation of U.S. patent application Ser. No. 13/848,849, filed on Mar. 22, 2013, which is a divisional application of U.S. patent application Ser. No. 12/567,834 filed on Sep. 28, 2009, which is based upon and claims priority to Japanese patent application No. 2008-251679, filed on Sep. 29, 2008, and Japanese patent application No. 2009-206443, filed on Sep. 7, 2009. The contents of these applications are incorporated herein by reference in their entirety.

BACKGROUND OF THE INVENTION

1. Field of the Invention

This invention relates to a mask pattern forming method, a fine pattern forming method and a film deposition apparatus which are used for semiconductor processes. More particularly, the invention relates to a mask pattern forming method, a fine pattern forming method and a film deposition apparatus which are capable of improving the precision to correct the pattern dimensions when forming patterns at pitches smaller than a resolution limit of an exposure device, without increasing the manufacturing cost.

2. Description of the Related Art

With high integration of semiconductor devices, wiring patterns and isolated widths required in manufacturing processes have come to be finer in size. Generally, in order to form a fine pattern, a resist pattern is formed by a photolithographic technique, and, by using the resist pattern as a mask of etching, a thin film formed beneath the resist pattern is etched. Therefore, the photolithographic technique is important for this purpose. However, the microstructures of the latest semiconductor devices have come to require a pitch of fine patterns which is below a resolution limit of the photolithographic technique.

In the following, a pattern which is used as the mask for forming a fine pattern by etching a thin film will be referred to as a mask pattern. This mask pattern may include a sacrifice film, such as an oxide film, and a resist film. Moreover, in the following, the term “fine pattern” may be used to indicate that it is inclusive of a mask pattern.

Patent Document 1 listed below discloses a technique for forming patterns at a pitch smaller than the resolution limit. In the technique of Patent Document 1, a first photoresist pattern (or a first resist pattern) is formed, baking of the first resist pattern is performed, and an oxide film is formed on the first resist pattern. Then, a second photoresist pattern (or a second resist pattern) is formed between the first resist patterns, and by using the first resist patterns and the second resist pattern as an etching mask, a thin film formed beneath the resist patterns is etched so that a fine pattern is formed.

According to the technique of Patent Document 1, fine patterns are formed using the two photo masks, and the resolution that is higher than that in the case of using one photo mask can be obtained. For this reason, the fine patterns with a pitch that is below the resolution limit can be formed according to the technique of Patent Document 1.

Recently, attention is focused on a technique in which a film deposition process to form a silicon oxide film on a pattern organic film is combined with SWT (side wall transfer process) or LLE (lithography-lithography etching process), as a fine pattern forming method to form fine patterns with a pitch below the resolution limit of the photolithographic technique.

Patent Document 2 listed below discloses a technique for use in the above-described fine pattern forming method to form an oxide film on a resist pattern. Although Patent Document 2 does not disclose a method of forming fine patterns with a pitch below the resolution limit, the technique of Patent Document 2 forms the oxide film on the resist pattern, which can prevent the thickness of the resist pattern from being decreased and prevent striation and wiggling from arising in the resulting fine patterns.

However, in the above-described fine pattern forming method in which the film deposition process to form the silicon oxide on the pattern organic film is combined with the fine patterns formed by SWT or LLE, the following problems will arise.

Because of the resolution limit of the photolithographic technique described above, it is necessary to perform an additional dimension correcting process (slimming, trimming, or smoothing) to correct the dimensions of the pattern organic film after the photolithographic process is performed. This will increase the manufacturing cost.

When the slimming, trimming or smoothing process is performed to correct the dimensions of the fine patterns, a resist coater, an ashing device or an etching device must be used. When the film deposition process is performed, a film deposition apparatus must be used. For this reason, the semiconductor substrate (wafer) after the slimming process is finished is taken out from the ashing device, and it is conveyed to the film deposition apparatus.

However, if the wafer is taken out from the ashing device after the slimming process is finished, dust or foreign matter will adhere to the surface of the resist pattern. If dust or foreign matter adheres to the surface of the resist pattern, the density of defects in the silicon oxide film formed on the resist pattern will increase and the uniformity in thickness of the silicon oxide film will easily be loaded.

Moreover, when the slimming process or the film deposition process is performed, it is difficult to maintain the dimensions of resist patterns in order to make the difference between a top width and a bottom width of each resist pattern small. For this reason, it is difficult to form fine patterns with a good configuration.

Patent Document 1: Japanese Patent No. 2757983

Patent Document 2: Japanese Arranged-Open Patent Publication No. 2004-080033

SUMMARY OF THE INVENTION

In an aspect of this disclosure, there are provided a mask pattern forming method, a fine pattern forming method and a film deposition apparatus which are capable of reducing the cost of the process of forming a mask pattern (or fine pattern) from an oxide film formed on a pattern organic film.

In another aspect of this disclosure, there are provided a mask pattern forming method, a fine pattern forming method and a film deposition apparatus which are capable of performing the slimming process or the film deposition process while maintaining the dimensions of resist patterns in order to make the difference between the top width and the bottom width of each resist pattern small, and capable of forming fine patterns with a good configuration.

In another aspect of this disclosure, there is provided a mask pattern forming method including: a resist film step of forming a resist film over a thin film; a patterning step of processing the resist film into resist patterns having a predetermined pitch by photolithography; a slimming step of performing slimming of the resist patterns; and a film deposition step of forming an oxide film on the thin film and the resist patterns after an end of the slimming step in a film deposition apparatus by supplying a source gas and an oxygen radical or an oxygen-containing gas, wherein the slimming step and the film deposition step are continuously performed in the film deposition apparatus.

In another aspect of this disclosure, there is provided a mask pattern forming method including: a step of forming a coating on a thin film; a step of forming a resist film on the coating; a first patterning step of processing the resist film into first resist patterns including line parts arrayed at a first pitch by photolithography; a first slimming step of performing slimming of the first resist patterns; and a film deposition step of forming an aluminum oxide film in ordinary temperature on the thin film and the first resist patterns after an end of the first slimming step by supplying a source gas and an oxygen-containing gas.

In another aspect of this disclosure, there is provided a film deposition apparatus including: a process chamber arranged to hold a vacuum pressure and to process a semiconductor substrate; a source gas supplying unit arranged to supply a source gas to the process chamber; and an oxygen radical supplying unit arranged to supply an oxygen radical or an oxygen-containing gas to the process chamber, wherein the film deposition apparatus is arranged so that the source gas and the oxygen radical or the oxygen-containing gas are alternately supplied to the process chamber by the source gas supplying unit and the oxygen radical supplying unit, to form an oxide film over the semiconductor substrate on which resist patterns are formed, and wherein the film deposition apparatus is arranged to perform, before the oxide film is formed over the semiconductor substrate on which the resist patterns are formed, slimming of the resist patterns by supplying the oxygen radical to the process chamber by the oxygen radical supplying unit.

Other aspects, features and advantages of this disclosure will be apparent from the following detailed description when read in conjunction with the accompanying drawings.

BRIEF DESCRIPTION OF THE DRAWINGS

FIG. 1 is a flowchart for explaining the procedure of respective steps of a fine pattern forming method of a first embodiment of the invention.

FIGS. 6A, 6B and 6C are diagrams for explaining the reaction on a semiconductor substrate in the fine pattern forming method of the first embodiment when BTBAS is used as a Si source gas.

FIGS. 9A and 9B are photographs and schematic diagrams of the resist pattern after the slimming process in the film deposition apparatus in Example 1 is performed.

FIGS. 10A and 10B are photographs and schematic diagrams of the resist pattern after the slimming process in the coater in Comparative Example 1 is performed.

FIGS. 15A and 15B are photographs and schematic diagrams of the resist pattern after the film deposition process in Example 1 is performed.

FIGS. 16A and 16B are photographs and schematic diagrams of the resist pattern after the film deposition process in Comparative Example 1 is performed.

FIG. 18 is a flowchart for explaining the procedure of respective steps of a fine pattern forming method of a third embodiment of the invention.

FIG. 21 is a flowchart for explaining the procedure of respective steps of a fine pattern forming method of a fifth embodiment of the invention.

FIGS. 26A and 26B are photographs and schematic diagrams of the resist patterns after the aluminum oxide films in Example 2 and Comparative Example 2 are formed.

FIG. 30 is a flowchart for explaining the procedure of respective steps of a fine pattern forming method of a seventh embodiment of the invention.

FIG. 32 is a photograph and a schematic diagram of the resist pattern after the aluminum oxide film and the silicon oxide film in Example 5 are formed.

FIG. 33 is a cross-sectional view illustrating the configuration of the films for measuring the amounts of ashing of the resists in Examples 6 and 7 and Comparative Example 3.

FIG. 34 is a diagram illustrating the dimensions of the resist patterns before and after the slimming processes in Example 1 and Comparative Example 1 are performed.

FIG. 35 is a diagram illustrating the dimensions of the resist patterns after the film deposition processes in Example 2 and Comparative Example 2 are performed.

FIG. 36 is a diagram illustrating the amounts of ashing of the resists in Examples 3 and 4 and Comparative Example 3.

FIG. 37 is a diagram illustrating the dimensions of the resist patterns after the film deposition processes in Example 5 and Comparative Example 2 are performed.

FIG. 38 is a diagram illustrating the amounts of ashing of the resists in Examples 6 and 7 and Comparative Example 3.

DETAILED DESCRIPTION OF PREFERRED EMBODIMENTS

A description will now be given of embodiments of the invention with reference to the accompanying drawings.

A fine pattern forming method and a film deposition apparatus of a first embodiment of the invention will be described with reference to FIGS. 1 to 8D. First, with reference to FIGS. 1 to 2H, the fine pattern forming method of the first embodiment will be described.

FIG. 1 is a flowchart for explaining the procedure of respective processes of the fine pattern forming method of this embodiment. FIGS. 2A to 2H are cross-sectional views illustrating the configuration of a fine pattern in each of the respective steps of the fine pattern forming method of this embodiment. The configuration of the fine pattern after each of the steps S11 to S18 of FIG. 1 is performed is equivalent to the configuration illustrated in each of FIGS. 2A to 2H.

As described above, a pattern which is used as the mask for forming a fine pattern by etching a thin film will be referred to as a mask pattern. This mask pattern may include a sacrifice film, such as an oxide film, and a resist film. In the following, the term "fine pattern" may be used to indicate that it is inclusive of a mask pattern. This definition will be applicable also for the following embodiments which will be described later.

As illustrated in FIG. 1, the fine pattern forming method of this embodiment includes a process which forms a thin film, a process which forms a resist film, a patterning process, a slimming process, a film deposition process, an etching process, a process which removes a resist pattern and etches an organic film, and a process which etches the thin film.

The process which forms a thin film includes step S11 and the process which forms a resist film includes step S12. The patterning process includes step S13 and the slimming process includes step S14. The film deposition process includes step S15, the etching process includes step S16, and the process which removes a resist pattern and etches an organic film includes step S17. The process which etches the thin film includes step S18.

Figure 2A:
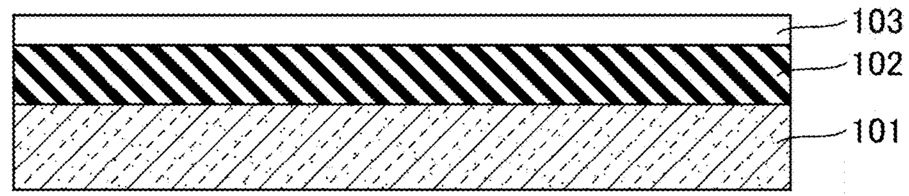
FIGS. 2A to 2H are cross-sectional views illustrating the configuration of the fine pattern in each of respective steps of the fine pattern forming method of the first embodiment.

As illustrated in FIG. 1, the processing of the step S14 and the step S15 is performed consecutively within the same chamber (process chamber). Step S11 is a process which forms a thin film on a semiconductor substrate. FIG. 2A is a cross-sectional view illustrating the configuration of the fine pattern after the step S11 is performed.

In step S11, as illustrated in FIG. 2A, the thin film 102 and the organic film 103 are formed sequentially from the bottom on the semiconductor substrate 101. By forming the pattern, the thin film 102 functions as a mask when performing subsequent processes. By forming the pattern, the organic film 103 functions as a mask for forming the pattern of the thin film 102. The organic film 103 may have a function as a coating (BARC: Bottom Anti-Reflecting Coating) at the time of forming the photoresist film 104 on the organic film 103 by photolithography.

The semiconductor substrate 101 is not limited to a semiconductor, such as a silicon substrate. The semiconductor substrate 101 may include a structure in which an electrically conductive film, corresponding to a semiconductor chip or an integrated circuit pattern, is formed on or within a semiconductor substrate, and a structure in which an interlayer insulation film for insulating the semiconductor chip or the integrated circuit pattern is formed on or within the semiconductor substrate.

The thin film and the organic film of this embodiment are equivalent to the film to be etched and the coating in the claims, respectively. The material of the thin film 102 is not limited, and the film which contains silicon nitride, silicon oxide, oxynitriding silicon, amorphous silicon, or polysilicon can be used for the thin film 102. The thickness of the thin film 102 is not limited, and can be in a range of 20-200 nm.

The material of the organic film 103 is not limited to a particular material. Various organic base materials may be used as the organic film 103, including an amorphous carbon film formed by the chemical vapor deposition (CVD) method, a polyphenol film formed by spinning, and a photoresist, such as an i-ray resist. The thickness of the organic film 103 is not limited, and can be in a range of 150-300 nm.

Figure 2B:
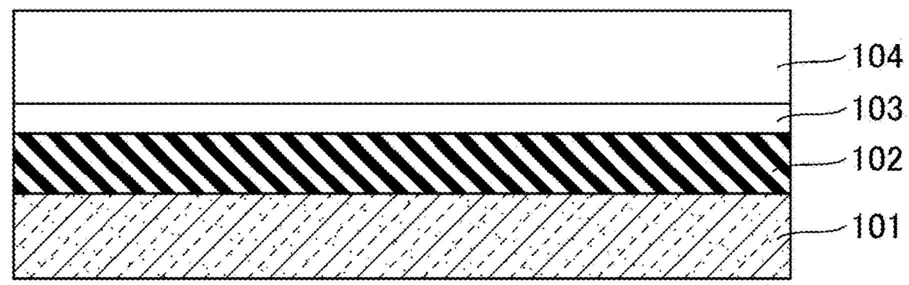

Step S12 is a process which forms photoresist film 104. FIG. 2B is a cross-sectional view illustrating the configuration of the fine pattern after the step S12 is performed. The material of the photoresist film 104 is, for example, an ArF resist. The thickness of the photoresist film 104 is not limited, but it may be in a range of 50-200 nm.

Figure 2C:
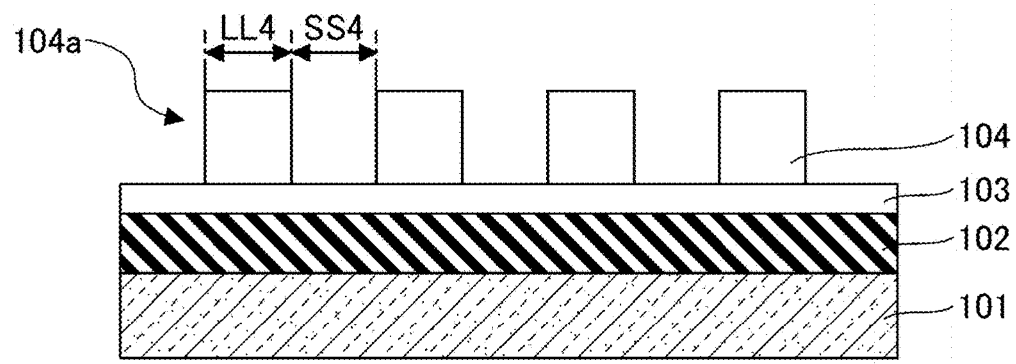

Next, the patterning step S13 is performed. Step S13 is a process which forms resist pattern 104*a* which exposes and develops formed photoresist film 104 and includes the photoresist film 104. FIG. 2C is a cross-sectional view illustrating the configuration of the fine pattern after the step S13 is performed.

As illustrated in FIG. 2C, the resist pattern 104*a* which includes the photoresist film 104 is formed. The resist pattern 104*a* functions as a mask in the process which etches the organic film 103. Line width LL4 and space width SS4 of the resist pattern 104*a* are not limited, and they can be equal to 60 nm. In this embodiment, each line which constitutes the resist pattern and has line width LL4 is defined as a line part. Therefore, the patterning process of this embodiment processes the resist film into the resist patterns which contain the line parts arranged at the predetermined pitch, using the photolithography technique.

Figure 2D:
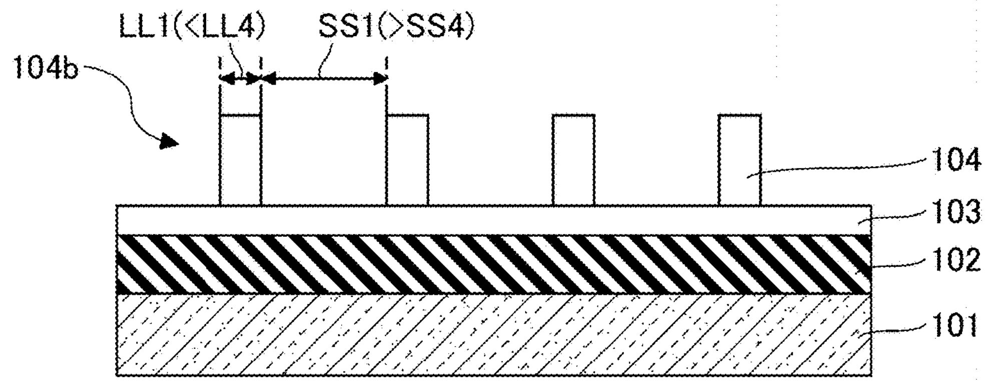

Next, the slimming process containing step S14 is performed. Step S14 is a process which performs the slimming process of the resist pattern 104*a* of the photoresist film 104 and forms the resist pattern 104*b* of the photoresist film 104. FIG. 2D is a cross-sectional view illustrating the configuration of the fine pattern after the step S14 is performed.

The slimming process is equivalent to the process which processes the configuration of the resist patterns in the slimming step in the claims, and is also called a trimming process.

The method of the slimming process is not limited. An example of the slimming process conditions is that the slimming process is performed in the atmosphere containing an oxygen radical or an ozone gas and the temperature is in a range between room temperature and 100 degrees C. As illustrated in FIGS. 2B and 2C, the line width LL1 of the resist pattern 104*b* after the slimming process is smaller than the line width LL4 of the resist pattern 104*a* before the slimming process, and the relationship between the line width LL1 and space width SS1 of the resist pattern 104*b* and the line width LL4 and space width SS4 of the resist pattern 104*a* is as follows: LL1<LL4 and SS1>SS4. The values of the LL1 and the SS1 are not limited, and the LL1 can be set to 30 nm and the SS1 can be set to 90 nm.

In this embodiment, step S14 is performed within the process chamber of the film deposition apparatus for performing the film deposition process of step S15 and step S15 is performed continuously after the end of step S14.

When performing step S14, it is necessary to select the conditions under which the organic film (coating) 102 is not etched. For example, the conditions of Example 1 (which will be described below) are selected and step S14 is performed under the selected conditions, which can avoid etching of the organic film (coating) 102. If step S14 is performed under the conditions that allows the organic film (coating) 102 to be etched, the organic film (coating) 102 is not etched completely and a certain part of the organic film (coating) 102 may remain after the end of step S14. In such a case, the subsequent process to form a mask pattern cannot be performed with sufficient precision.

Next, the film deposition process which includes step S15 is performed within the process chamber of the film deposition apparatus continuously from the end of step S14.

Figure 2E:
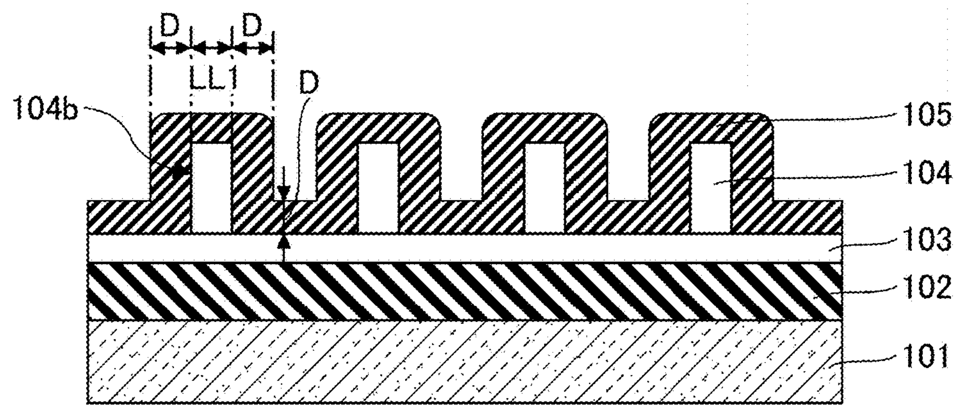

Step S15 is a film deposition process which forms the SiO2 film 105 on the organic film 103 and the resist pattern 104*b* after the end of the slimming process. FIG. 2E is a cross-sectional view illustrating the configuration of the fine pattern after the step S15 is performed. The SiO2 film (silicon oxide film) is equivalent to the silicon oxide film in the claims. Instead of the SiO2 film, a film of another material, such as a SiOx film or a film containing silicon and oxygen as principal components, may be used as the film 105. An oxynitriding silicon film (SiON film) may also be used as the film 105. The film deposition process of the SiO2 film 105 is performed in the state where the resist pattern 104*b* of the photoresist film 104 remains. Because the organic film 103 generally is weak to an elevated temperature, it is preferred to form the SiO2 film 105 at a low temperature (for example, 300 degrees C. or less).

In the film deposition method of this embodiment, the film can be formed at a low temperature by using Molecular Layer Deposition (MLD) at a low temperature, i.e., low-temperature MLD. As a result, as illustrated in FIG. 2E, the SiO2 film 105 is formed over the entire substrate, including the location in which the resist pattern 104*b* is formed and the location in which the resist pattern 104*b* is not formed, and the SiO2 film 105 is formed to cover the side faces of the resist pattern 104*b*. If the thickness of the SiO2 film 105 at this time is set to D, the width of the SiO2 film 105 which covers each of the side faces of the resist pattern 104*b* is also set to D. The thickness D of the SiO2 film 105 is not limited, and may be set to 30 nm.

Here, the film deposition process by the low-temperature MLD will be described. In the low-temperature MLD, the process which supplies a source gas containing silicon to the process chamber and makes a silicon raw material absorb on the substrate, and the process which supplies a gas containing oxygen to the process chamber and oxidizes the silicon raw material are repeated alternately.

Figure 5:
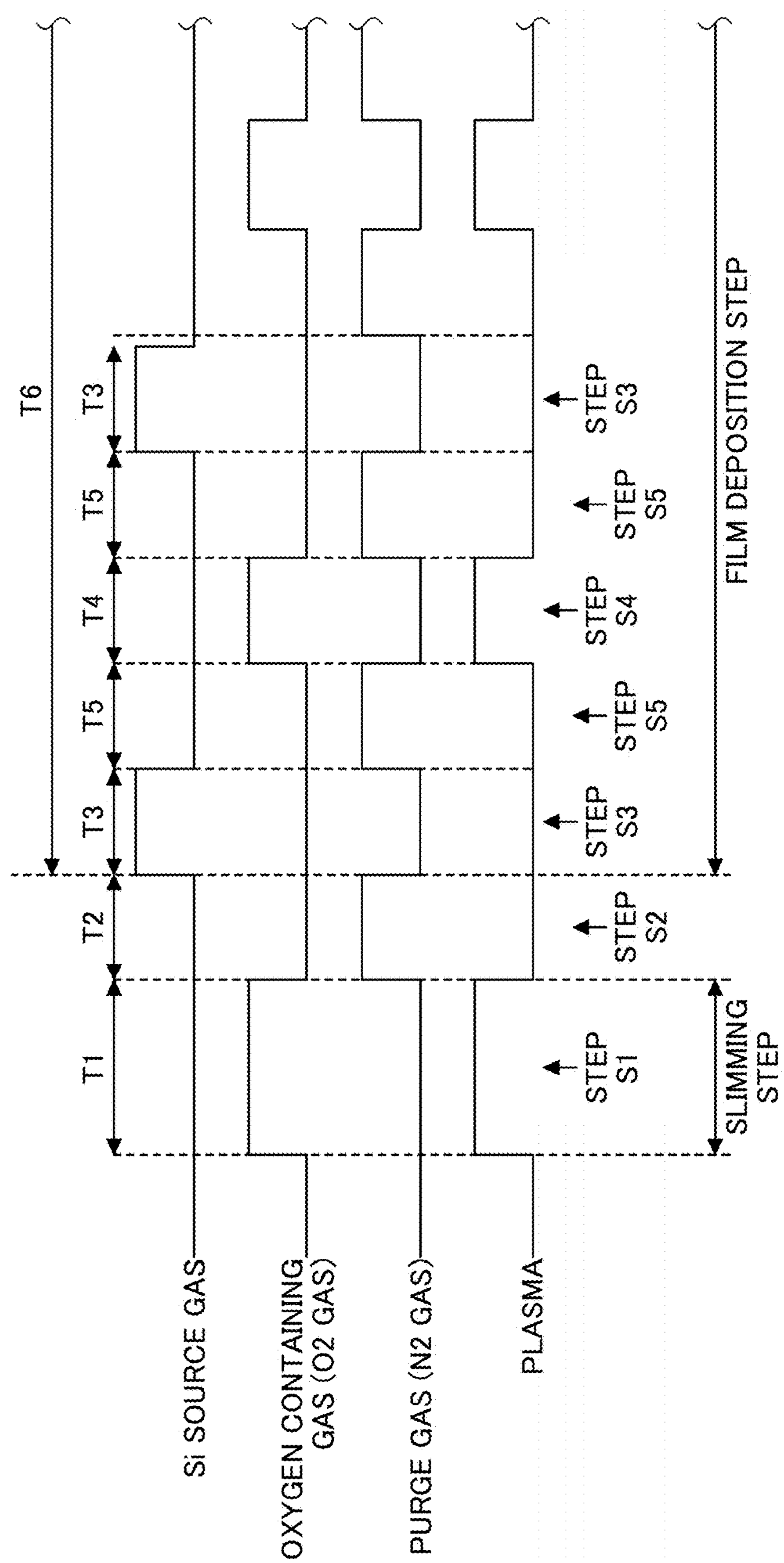
FIG. 5 is a timing chart for explaining the timing of supplying of the gases in the slimming step and the film deposition step in the fine pattern forming method of the first embodiment.

Specifically, in the process which makes the source gas containing silicon absorb on the substrate, an amino silane gas which has two amino groups in one molecule, for example, bis-tertiary-butylamino silane (BTBAS), is supplied as the source gas containing silicon to the process chamber via the supplying nozzle of silicon raw material gas for a predetermined time (which is indicated by T3 in FIG. 5). Thereby, the BTBAS is made to adsorb on the substrate.

Next, in the process which supplies the gas containing oxygen to the process chamber and oxidizes the silicon material, an O2 gas in plasma state, produced by the plasma generating device including the RF generator, is supplied as the gas containing oxygen to the process chamber via the gas supply nozzle for a predetermined time (indicated by T4 in FIG. 5). Thereby, the BTBAS absorbed on the substrate is oxidized and the SiO2 film 105 is formed.

When the process which makes the source gas containing the silicon adsorb on the substrate and the process which supplies the gas containing oxygen to the process chamber and oxidizes the silicon material is switched, the process which performs the evacuation of the inside of the process chamber and supplies a purge gas which includes inert gas, such as N2 gas, to the process chamber in order to remove the remaining gas therein in the previous process can be performed for a predetermined time (which is indicated by T5 in FIG. 5). The purpose of this process is to remove the remaining gas in the process chamber. Alternatively, this process may be performed by continuing the vacuum evacuation of the process chamber and suspending the supplying of all the gases to the process chamber, instead of supplying the purge gas to the process chamber.

In this embodiment, the source gas containing organic silicon is used as the Si source gas for forming the SiO2 film 105. One example of the Si source gas containing organic silicon is amino silane base precursor. An example of the amino silane base precursor is a monovalent or divalent amino silane base precursor. Examples of the monovalent or divalent amino silane base precursor may include BTBAS (bis-tertiary-butylamino silane), BDMAS (bis-dimethyl-amino silane), BDEAS (bis-diethylamino silane), DPAS (dipropyl amino silane), BAS (butylamino silane), and DIPAS (diisopropyl amino silane). Trivalent amino silane base precursor may also be used as the amino silane base precursor. An example of the trivalent amino silane base precursor is TDMAS (tri-dimethyl amino silane).

Alternatively, as the Si source gas containing organic silicon, ethoxy silane base precursor may also be used instead of the amino silane base precursor. An example of the ethoxy silane base precursor is TEOS (tetra-ethoxy silane).

On the other hand, as the gas containing oxygen, any of NO gas, O2 gas, N2O gas, H2O gas, and O3 gas) may be used, and these gases may be set in plasma state by a high frequency electric field and may be used as an oxidizing agent.

By being able to form SiO2 film below 300 degrees C., and adjusting the gas mass flow of the gas which also contains oxygen, the electric power of an RF generator, and the pressure in a process chamber by using the plasma of the gas containing such oxygen films can be formed at 100 degrees C. or less or at room temperature in the film deposition of SiO2 film.

Figure 2F:
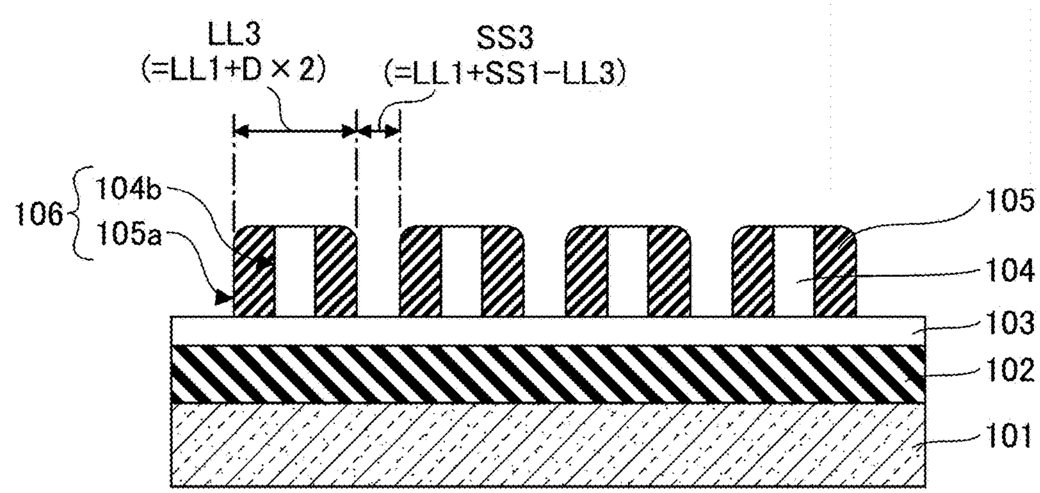

Next, an etching step including the step S16 is performed. Step S16 is an etching step which etches the SiO2 film 105 so that the SiO2 film 105 remains only as side wall parts 105*a* on the side walls of the resist pattern 104*b*. FIG. 2F is a cross-sectional view illustrating the configuration of the fine pattern after the step S16 is performed.

As illustrated in FIG. 2F, the SiO2 film 105 is etched and SiO2 film 105 changes into the condition of having remained only as wall part 105*a* which covers the side face of resist pattern 104*b*. The etching of the SiO2 film 105 is not limited. The etching may be performed using a CF base gas, such as CF4, C4F8, CHF3, CH3F, CH2F2, etc., a mixed gas, such as Ar gas, or a mixed gas to which oxygen is added, if needed.

In order to etch so that only wall part 105*a* of resist pattern 104*b* which includes the SiO2 film 105 may remain, the third pattern 106 that includes the resist pattern 104*b* and wall part 105*a* is formed. The line width of the third pattern 106 is set to LL3 and the space width is set to SS3. When the line width LL1 of the resist pattern 104*b* is equal to nm and the thickness D of the wall part 105*a* is equal to 30 nm, LL3=LL1+D×2 can be set to 90 nm and SS3=LL1+SS1−LL3 can be set to 30 nm.

Because the surface of the SiO2 film 105 is receded in the thickness direction by etching, the etching performed in step S16 is also called etching back. By performing the etching step, the oxide film is etched and remains as side walls on the side faces of the line part of the resist pattern after the slimming process is performed. The etching step is a process which etches the oxide film to partially remain on the side faces of the line part of the resist pattern after the slimming process is performed.

Figure 2G:
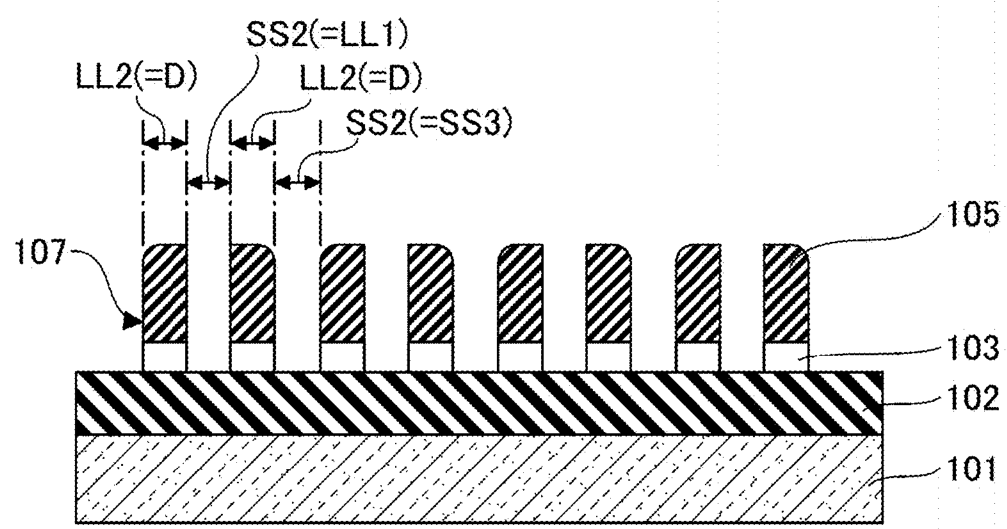

Step S17 includes a process which removes the resist pattern 104*b* and forms the side wall part 105*a*, and a process which etches the organic film 103 by using as a mask the side wall part 105*a* formed. FIG. 2G is a cross-sectional view illustrating the configuration of the fine pattern after the process which removes the resist pattern 104*b* and the process which etches the organic film 103 are performed. By performing the etching using a plasma of any of oxygen, nitrogen, hydrogen, and ammonia, the resist pattern 104*b* which includes the photoresist film 104 is removed and only the side wall part 105*a* remains. By etching the organic film 103 using the wall part 105*a* as a mask, as illustrated in FIG. 2G, the second pattern 107, including the side wall part 105*a* and the organic film 103, is formed in which the line width is equal to D and the space width LL1 and the space width SS3 appear alternately.

As a result, as illustrated in FIG. 2G, the resist pattern 104*b* is formed which includes the photoresist film 104 is removed, only the wall parts 105*a* remain, and the second pattern 107, in which the line width is equal to D and the space width LL1 and the space width SS3 appear alternately.

In this embodiment, the space width is set to SS2, which is equal to LL1 or SS3 by making equal line width LL1 of the resist pattern 104*b* and the space width SS3 of the third pattern 106. The line width equal to D is set anew to LL2.

As mentioned above, line width LL2 can form the second pattern 107 30 nm and for which the space width SS2 is 30 nm by LL1 being 30 nm, the thickness (width D of wall part 105*a*) being 30 nm and the SiO2 film 105 being SS3 30 nm. The second pattern 107 includes the wall part 105*a* and organic film (coating) 103, and is equivalent to the mask pattern in the claims. Then, the second pattern 107 is used as a mask and the thin film 102 is etched. That is, step S18 is performed.

Figure 2H:
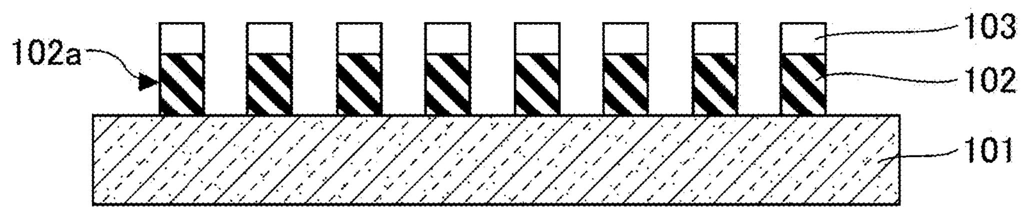

In step S18, the thin film (film to be etched) 102 is processed using the second pattern (mask pattern) 107, and as illustrated in FIG. 2H, the pattern 102*a*, which includes the thin film (film to be etched) 102, is formed. The organic film (coating) 103 may remain in the upper part of the pattern 102*a*.

For example, etching of the thin film 102 which includes amorphous silicon or polysilicon can be performed using plasma, such as a gas of C12, C12+HBr, C12+O2, CF4+O2, SF6, C12+N2, C12+HCl or HBr+C12+SF6. The etching may be performed using a gas containing a CF base gas, a CHF base gas, a CH base gas, or an oxygen gas.

The film forming method, which includes the processes from the process (step S11) which forms the organic film (coating) 103 to the process (step S17) which forms the mask pattern including the wall part 105*a* and the organic film (coating) 103, is defined as the mask pattern forming method in the claims.

The film forming method, which includes the mask pattern forming method and includes the processes from the process (step S11) which forms the thin film (film to be etched) 102 to the process (step S18) which forms the pattern 102*a* including the thin film (film to be etched) 102, is defined as the fine pattern forming method in the claims.

Next, with reference to FIGS. 3 and 4, the film deposition apparatus used for the fine pattern forming method of this embodiment will be described.

Figure 3:
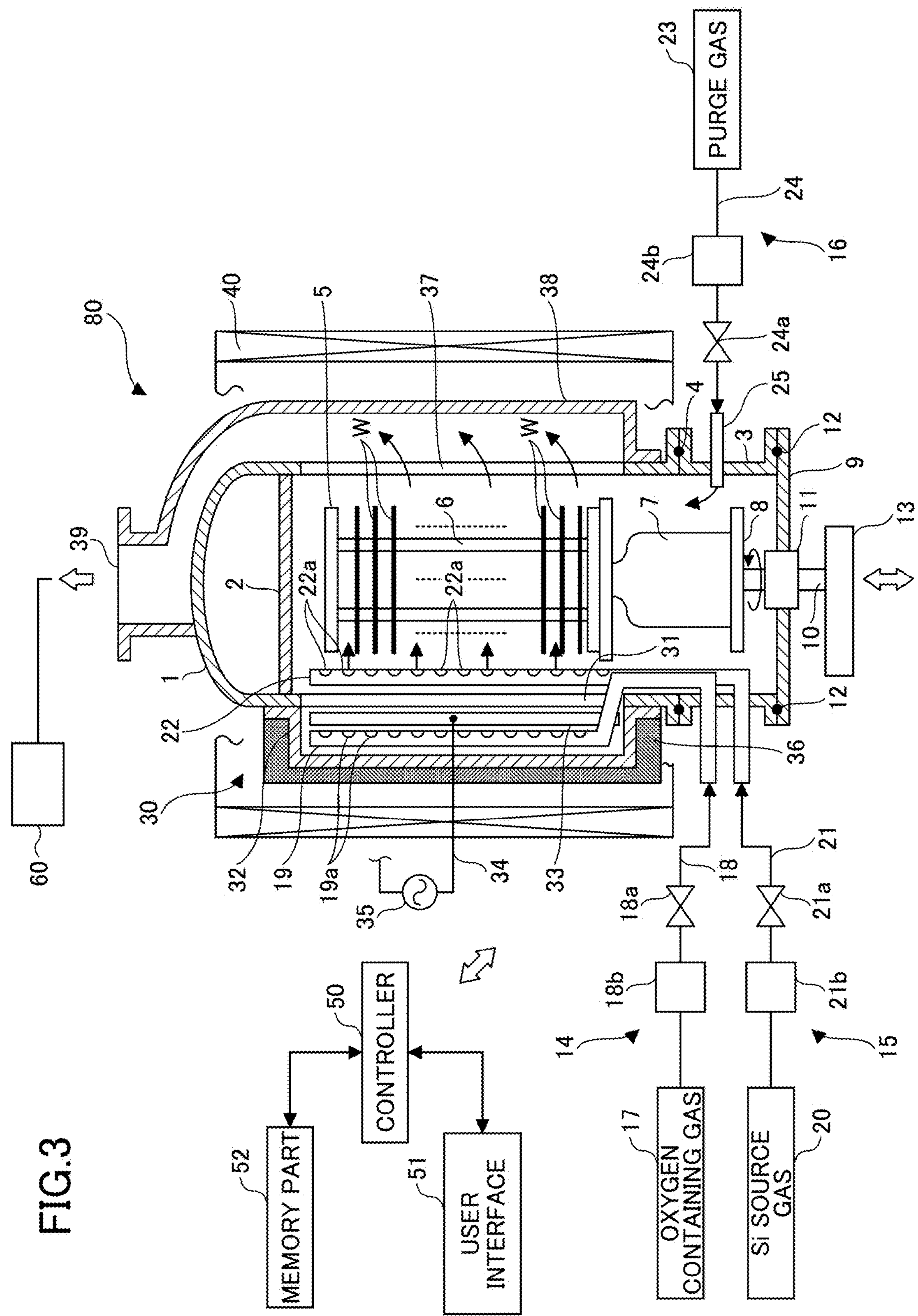
FIG. 3 is a vertical cross-sectional view illustrating the structure of a film deposition apparatus used for the fine pattern forming method of the first embodiment.

FIG. 3 is a vertical cross-section view illustrating the structure of the film deposition apparatus used for the fine pattern forming method of this embodiment. FIG. 4 is a horizontal cross-sectional view illustrating the structure of the film deposition apparatus used for the fine pattern forming method of this embodiment. The heating apparatus is omitted in FIG. 4.

As illustrated in FIG. 3, the film deposition apparatus 80 of this embodiment is arranged to perform consecutive processing of the slimming process and the film deposition process in the same film deposition apparatus.

Conventionally, the slimming process is performed using an etching device or an ashing device, and the film deposition process is performed using the film deposition apparatus. For this reason, after the end of the slimming process, the semiconductor substrate (wafer) is pulled out from the ashing device, and is conveyed to the film deposition apparatus. Thus, after the end of the shrinking process, the wafer must be pulled out from the ashing device, and dust or foreign matter may adhere to the surface of the resist pattern 104*b*. If dust or foreign matter adheres to the surface of the resist pattern 104*b*, the defect density of the SiO2 film 105 formed on the resist pattern 104*b* will be increased and the uniformity of the thickness will be lowered.

On the other hand, the film deposition apparatus 80 of this embodiment is arranged to perform the slimming process using the film deposition apparatus, and to perform consecutive processing of the slimming process and the film deposition process in the same film deposition apparatus. Thus, it is possible to form the SiO2 film 105 with the defect density reduced while keeping the surface of resist pattern 104*b* pure, and it is possible to increase the uniformity of the thickness. Moreover, the cost of the conveyance and the queuing time can be reduced to increase the productivity.

Figure 4:
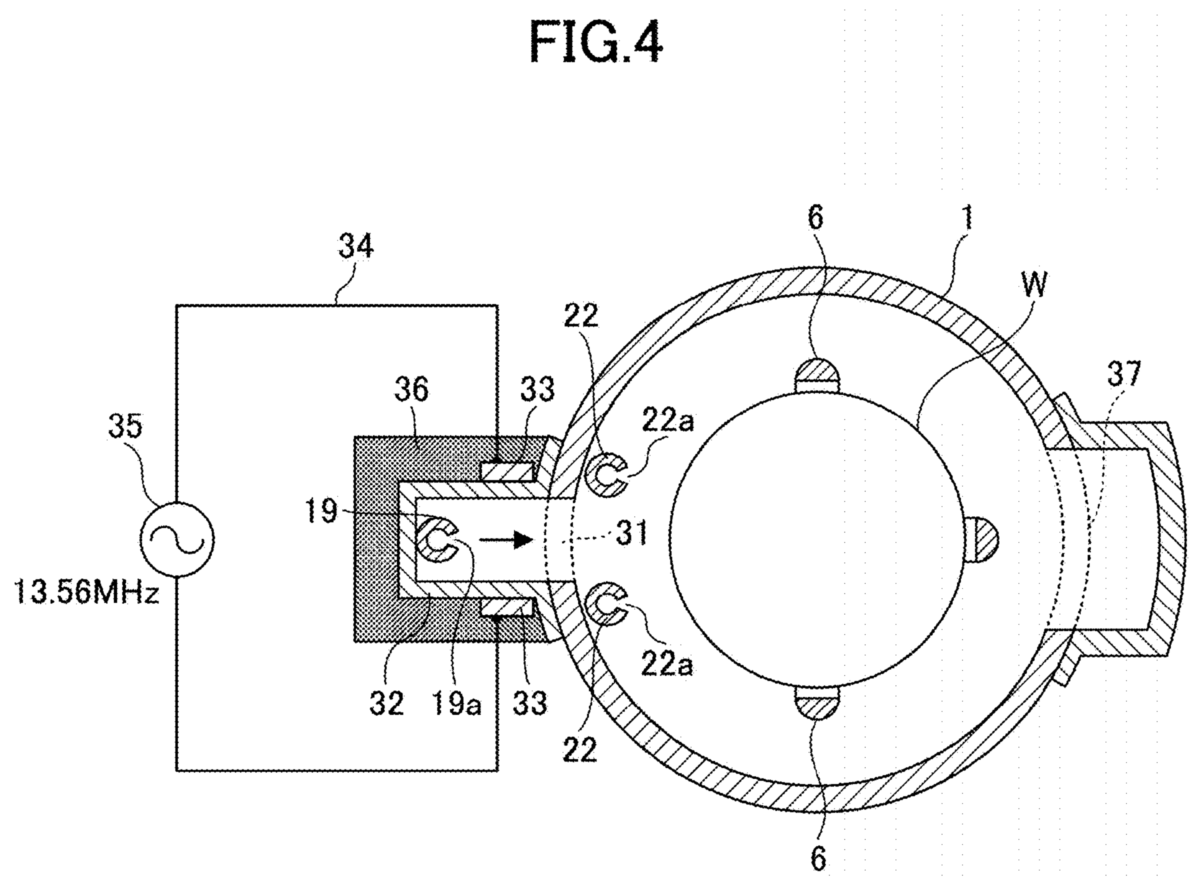
FIG. 4 is a horizontal cross-sectional view illustrating the structure of the film deposition apparatus used for the fine pattern forming method of the first embodiment.

As illustrated in FIGS. 3 and 4, the film deposition apparatus 80 includes a cylindrical process chamber 1 which includes a ceiling plate 2 at its top portion and an opening at its bottom portion. The entire process chamber 1 is made of, for example, quartz, and the ceiling plate 2 made of quartz is disposed at the top portion to seal the top of the process chamber 1.

A manifold 3 arranged in the shape of a cylindrical body made of stainless steel is connected with the lower-end opening of the process chamber 1 via the sealing member 4 (such as an O ring). The manifold 3 supports the lower-end of the process chamber 1, and a wafer boat 5 made of quartz in which several sheets of semiconductor wafers W (for example, 50-100 sheets) to be processed can be arranged in multiple stages may be inserted into the process chamber 1 from the lower part of the manifold 3. The wafer boat 5 has three pillars 6 (refer to FIG. 4), and the several wafers W are supported in the slots formed in the pillars 6.

The wafer boat 5 is arranged on the table 8 via the heat insulating mold 7 made of quartz, and the table 8 is supported on the rotation shaft 10 which penetrates the lid part 9 which is made of stainless steel and the rotation shaft 10 opens and closes the lower-end opening of the manifold 3. A magnetic fluid seal 11 is arranged for the part of the rotation shaft and the rotation shaft 10 is rotatably supported with the seal 11, maintaining the sealing of the rotation shaft 10 airtightly. Between the periphery of the lid part 9 and the bottom end of the manifold 3, the sealing member 12 (an O ring) is interposed, maintaining the sealing nature in the process chamber 1.

The rotation shaft 10 is attached at the head of the arm 13 supported in the lifting and lowering device (not illustrated), such as a boat elevator. The rotation shaft 10 lifts or lowers the wafer boat 5 and the lid part 9 in order to be inserted into or detached from the process chamber 1. The table 8 may be fixed to the side of the lid part 9 and the table 8 may be arranged to process the wafer W without rotating the wafer boat 5.

The film deposition apparatus 80 is provided with the following: an oxygen-containing gas supplying device 14 which supplies oxygen-containing gas, for example, O2 gas, into the process chamber 1; a Si source gas supplying device 15 which supplies Si source gas into the process chamber 1; and a purge gas supplying device 16 which supplies inert gas, for example, N2 gas, as purge gas into the process chamber 1. The oxygen-containing gas supplying device 14 is equivalent to the oxygen radical supplying unit in the claims, and the Si source gas supplying device 15 is equivalent to the source gas supplying unit in the claims.

The oxygen-containing gas supplying device 14 is provided with the following: an oxygen-containing gas supply source 17; an oxygen-containing gas piping 18 which draws oxygen-containing gas from the oxygen-containing gas supply source 17; an oxygen-containing gas dispersion nozzle 19 which includes a quartz tube which is connected to the oxygen-containing gas piping 18, penetrates the side attachment wall of the manifold 3 to the inside, is bent upward, and extends vertically; and two or more gas discharge holes 19*a* which can be separated at a predetermined spacing in the vertical portion of the oxygen-containing gas dispersion nozzle 19 and can discharge the oxygen-containing gas (the O2 gas) from each gas discharge hole 19*a* horizontally towards the process chamber 1.

The Si source gas supplying device 15 includes a Si source gas supply source 20, a Si source gas piping 21 which draws Si source gas from the Si source gas supply source 20, and a Si source gas dispersion nozzle 22 which includes the quartz tube which is connected to the Si source gas piping 21, penetrates the side attachment wall of the manifold 3 to the inside, is bent upward, and is prolonged vertically. In this example, two Si source gas dispersion nozzles 22 are formed (refer to FIG. 4) and each Si source gas dispersion nozzle 22 is provided with two or more gas discharge holes 22*a* which are formed along the device direction at a predetermined spacing, in order to discharge the Si source gas which contains organic silicon in uniformity in the process chamber 1 horizontally from each gas discharge hole 22*a*. The number of Si source gas dispersion nozzles 22 may be one. The purge gas supplying device 16 includes a purge gas supply source 23, a purge gas piping 24 which draws purge gas from the purge gas supply source 23, and a purge gas nozzle 25 which is connected to the purge gas piping 24 and provided by penetrating the side attachment wall of the manifold 3. As the purge gas, inert gas, for example, N2 gas, can be used conveniently.

The oxygen-containing gas piping 18, the Si source gas piping 21, and the purge gas piping 24 are provided with the valves 18*a*, 21*a* and 24*a* and the flow control devices 18*b*, 21*b* and 24*b*, respectively, in order to supply the oxygen-containing gas, the Si source gas, and the purge gas, respectively.

The plasma generating device 30 which forms the plasma of oxygen-containing gas is formed in some side attachment walls of the process chamber 1. The plasma generating device 30 includes a vertically extending opening 31 by removing the side attachment wall of the process chamber 1 by a predetermined width along the sliding direction, and a plasma partitioning wall 32 which is airtightly welded to the outer wall of process chamber 1. The plasma partitioning wall 32 is formed to extend vertically and made of quartz.

The plasma generating device 30 is provided with the following: a pair of plasma electrodes 33 arranged facing mutually the outside surfaces of the side walls of the plasma partitioning wall 32 along the sliding direction; and an RF generator 35 which is connected to the plasma electrode 33 via the supplying line 34 and supplies high-frequency power so that the plasma of oxygen-containing gas may occur by applying the high-frequency voltage of 13.56 MHz to the plasma electrodes 33 from the RF generator 35. The frequency of the high-frequency voltage is not limited to 13.56 MHz, and other frequencies, for example, 400 kHz, may be used for it.

By forming the plasma partitioning walls 32, some side attachment walls of the process chamber 1 will be depressed outward and will be in the condition that the interior space of the plasma partitioning wall 32 is open to communicate with the interior space of the process chamber 1. The opening 31 is formed in the sliding direction so that all the wafers W currently held in the wafer boat 5 can be covered in the height direction.

The oxygen-containing gas dispersion nozzle 19 extends upward in the inside of the process chamber 1 and bent to the outside of the radial direction of the process chamber 1, and it is directed towards the upper part along with the back portion (which is most distant from the center of the process chamber 1) within the plasma partitioning wall 32.

For this reason, when the RF generator 35 is turned on and a high frequency electric field is formed between both electrodes 33, the oxygen gas is discharged from the gas discharge hole 19*a* of the oxygen-containing gas dispersion nozzle 19, turned into a plasma state and spreads towards the center of the process chamber 1.

An insulation protection covering 36 made of quartz is attached to the outside of the plasma partitioning wall 32 to cover the plasma partitioning wall 32. The plasma electrode 33 can be cooled by supplying the nitrogen gas which is cooled through the refrigerant passage (not illustrated) which is arranged in the inner part of the insulation protection covering 36.

The two Si source gas dispersion nozzles 22 are provided in the location to interpose the inside wall opening 31 of the process chamber 1. The amino silane gas as the Si source gas can be supplied to the central direction of the process chamber 1 from the gas discharge holes 22*a* formed in the Si source gas dispersion nozzle 22.

On the other hand, the exhaust port 37 for carrying out the evacuation of the inside of the process chamber 1 is arranged in the portion of the opposite side of the opening 31 of the process chamber 1. The exhaust port 37 is formed by removing the side attachment wall of the process chamber 1 to the sliding direction. The exhaust-port cover member 38 which is provided for covering the exhaust port 37 is attached to the portion corresponding to the exhaust port 37 of the process chamber 1 by welding. The exhaust-port cover member 38 extends upward in accordance with the side attachment wall of the process chamber 1, and includes the gas outlet 39 located above the process chamber 1. Decreasing of the internal pressure of the process chamber to a vacuum pressure is performed by using the evacuation device 60 containing the vacuum pump (not illustrated) from the gas outlet 39. A heating apparatus 40 is arranged in the form of a housing which surrounds the periphery of the process chamber 1 and heats the process chamber 1 and the wafer W in the core.

The control of each component part of the film deposition apparatus 80, for example, supplying and stopping of each gas by opening and closing of the valves 18*a*, 21*a*, and 24*a*, the control of the gas mass flow by the mass-flow controllers 18*b*, 21*b*, and 24*b*, the on-off control of the RF generator 35, the control of the heating apparatus 40, etc. are performed by the controller 50 which includes a microprocessor (computer).

A user interface 51 which includes a keyboard which performs input operation of a command etc. in order to allow a process managing person to manage the film deposition apparatus 80, a display which displays the operating condition of the film deposition apparatus 80, etc. is connected to the controller 50.

A memory part 52 which stores the control program for performing various processes with the film deposition apparatus 80 by control of the controller 50 and the program (recipe) for causing each part of the film deposition apparatus 80 to perform the process according to the processing conditions is connected to the controller 50. The recipe may be stored in a storage medium in the memory part 52. Examples of the storage medium may include a hard disk, a semiconductor memory, a CD-ROM, a DVD, and a flash memory. Alternatively, the recipe may be downloaded suitably through a leased circuit line from an external device.

The desired process is performed with the film deposition apparatus 80 under control of the controller 50 by calling an arbitrary recipe from the memory part 52 in accordance with the command from the user interface 51 and performing the same by the controller 50 if needed.

Next, with reference to FIGS. 5-6C, the slimming process and film deposition process of the fine pattern forming method of this embodiment will be described.

FIG. 5 is a timing chart for explaining the timing of supplying of the gases in the slimming process and the film deposition process in the fine pattern forming method of this embodiment. FIGS. 6A-6C are diagrams for explaining the reaction on the semiconductor substrate in the fine pattern forming method of this embodiment when BTBAS is used as the Si source gas.

For example, the semiconductor wafer W is loaded by raising the wafer boat 5 from the lower part of the process chamber 1 which is held beforehand at a predetermined temperature, and the inside of the process chamber 1 is turned into the sealing space by closing the lower-end opening of the manifold 3 by the lid part 9. The semiconductor wafer W with the diameter of 300 mm is illustrated. While maintaining the inside of the process chamber 1 to the predetermined vacuum pressure for the wafer processing, the supply power of the heating apparatus 40 is controlled, the wafer temperature is raised, the process temperature is held, and the wafer boat 5 is rotated.

However, in this embodiment, before starting the film deposition process, the slimming process for processing the configuration of the resist pattern is performed.

As illustrated in FIG. 5, in the slimming process, step S1 (slimming process), which supplies the oxygen radical derived from the oxygen-containing gas to the process chamber 1, and processes the configuration of the resist pattern, is performed. In the process which supplies the oxygen radical of step S1, the O2 gas, as the oxygen-containing gas from the oxygen-containing gas supply source 17 of the oxygen-containing gas supplying device 14, is discharged from the gas discharge hole 19*a* via the oxygen-containing gas piping 18 and the oxygen-containing gas dispersion nozzle 19. At this time, the RF generator 35 of the plasma generating device 30 is turned ON, a high frequency electric field is formed, and the oxygen-containing gas (the O2 gas) is turned into a plasma state by the high frequency electric field. Furthermore, the oxygen-containing gas in the plasma state is supplied into the process chamber 1. Thereby, the photoresist which forms the resist pattern is processed by the asking, and the width and the height of the resist pattern are decreased, namely, the slimming process is performed. The time T1 of this process in a range of 1 to 600 sec is illustrated.

Although the flow rate of the oxygen-containing gas varies depending on the number of sheets of semiconductor wafers W loaded, the flow rate in a range of 100-20000 mL/min (sccm) is illustrated. The frequency of the RF generator 35 which is equal to 13.56 MHz is illustrated, and the power of the RF generator 35 in a range of 5-1000 W may be used. The internal pressure of the process chamber 1 in a range of 13.3-665 Pa is illustrated.

In this case, examples of the oxygen-containing gas may include O2 gas, NO gas, N2O gas, H2O gas, and O3 gas), and the plasma-state gas by the high frequency electric field is used. The oxygen radical is not restricted to the plasma of the oxygen-containing gas, but it is preferred that the O2 plasma is used as the plasma of the oxygen-containing gas. By using the oxygen radical or the plasma of the oxygen-containing gas as the oxidizing agent, the substrate temperature at the time of performing the slimming process may be 300 degrees C. or less, or may be 100 degrees C. or less, and a room temperature may be used for the slimming process.

Next, the film deposition process is performed within the process chamber 1 continuously from the end of the slimming process. First, after the end of the slimming process, step S2 is performed before starting the film deposition process. Step S2 is a process which removes the gas remaining in the process chamber 1 and produces a desired reaction in the following process after step S1. It is performed by supplying inert gas, for example, N2 gas, as the purge gas via the purge gas piping 24 and the purge gas nozzle 25 from the purge gas supply source 23 of the purge gas supplying device 16, in order to perform the evacuation of the inside of the process chamber 1. The time T2 of this step S2 in a range of 1 to 60 sec is illustrated. The purge gas flow rate in a range of 0.1-5000 mL/min (sccm) is illustrated.

As long as this step S2 can remove the gas which remains in the process chamber 1, the supplying of all the gas may be suspended without supplying the purge gas. However, the remaining gas in the process chamber 1 is removable by supplying the purge gas for a short time. The pressure in the process chamber 1 in a range of 0.133-665 Pa is illustrated. The substrate temperature, which is in a range of room temperature (25 degrees C.) to 700 degrees C., or desirably in a range of room temperature (25 degrees C.) to 500 degrees C., or more desirably in a range of room temperature (25 degrees C.) to 300 degrees C., is illustrated.

While maintaining the inside of the process chamber 1 to the predetermined vacuum pressure continuously, the supply power to the heating apparatus is controlled, the wafer temperature is raised, the process temperature is held, the wafer boat 5 is rotated, and the film deposition process is started.

As thus illustrated in FIG. 5, in this embodiment, the step S3, which supplies the Si source gas containing organic silicon to the process chamber 1 and the Si source is adsorbed, and the step S4 which supplies the oxygen radical to the process chamber 1 and the Si source gas is oxidized, are repeated alternately. In this embodiment, step S5 which removes the gas remaining in the process chamber 1 from the inside of the process chamber 1 is performed between step S3 and step S4.

In step S3 in this embodiment, the amino silane gas (BTBAS) as the Si source gas from the Si source gas supply source 20 of the Si source gas supplying device 15 is supplied from the gas discharge hole 22*a* via the Si source gas piping 21 and the Si source gas dispersion nozzle 22 to the inside of the process chamber 1 for the supplying time T3. Thereby, the Si source gas is adsorbed by the semiconductor wafer. The time T3 in a range of 1 to 600 sec is illustrated. The flow rate of the Si source gas in a range of 10-500 mL/min (sccm) is illustrated. The pressure in the process chamber 1 in a range of 13.3-665 Pa is illustrated.

Similar to the step S1, in the process which supplies the oxygen radical of step S4, the O2 gas is discharged from the gas discharge hole 19*a* via the oxygen-containing gas piping 18 and the oxygen-containing gas dispersion nozzle 19 as the oxygen-containing gas from the oxygen-containing gas supply source 17 of the oxygen-containing gas supplying device 14. At this time, the RF generator 35 of the plasma generating device 30 is turned ON, a high frequency electric field is formed, and the oxygen-containing gas (the O2 gas) is turned into a plasma state by the high frequency electric field. The oxygen-containing gas in the plasma state is supplied to the process chamber 1. Thereby, the Si source adsorbed by the semiconductor wafer W is oxidized to form SiO2. The time T4 of this process in a range of 1 to 600 sec is illustrated. Although the flow rate of the oxygen-containing gas varies depending on the number of the sheets of semiconductor wafers W loaded, the flow rate in a range of 100-20000 mL/min (sccm) is illustrated. The frequency of the RF generator 35 which is equal to 13.56 MHz is illustrated and the power of the RF generator 35 in a range of 5-1000 W is used. The pressure in the process chamber 1 in a range of 13.3-665 Pa is illustrated.

Also in this case, examples of the oxygen-containing gas may include O2 gas, NO gas, N2O gas, H2O gas, and O3 gas), and the gas in plasma state generated by the high frequency electric field is used as the oxidizing agent. The oxygen radical as the oxidizing agent is not restricted to the plasma of the oxygen-containing gas, but it is preferred to use the plasma of the oxygen-containing gas, particularly the O2 plasma. Moreover, the temperature at which the SiO2 film is formed in the film deposition step may be 300 degrees C. or less. It is preferred that, by supplying the oxygen radical (especially the plasma of the oxygen-containing gas) as the oxidizing agent, the temperature is below a heat-resisting temperature of the resist film (or 100 degrees C. or less), or the temperature may be set to room temperature.

Step S5 performed between step S3 and step S4 is a process which removes the gas which remains in the process chamber 1, and produces a desired reaction in the following process after step S3 or step S4. Step S5 is performed by supplying an inert gas, for example, N2 gas, as a purge gas via the purge gas piping 24 and the purge gas nozzle 25 from the purge gas supply source 23 of the purge gas supplying device 16, carrying out the evacuation of the inside of the process chamber 1. The time T5 of the step S5 in a range of 1 to 60 sec is illustrated. The purge gas flow rate in a range of 0.1-5000 mL/min (sccm) is illustrated.

As long as the step S5 can remove the gas which remains in the process chamber 1, the supplying of all the gas may be suspended without supplying the purge gas. However, the remaining gas in the process chamber 1 is removable by supplying the purge gas for a short time. The pressure in the process chamber 1 in a range of 0.133-665 Pa is illustrated. Thus, by repeating and supplying the Si source gas and the oxygen-inclusion plasma as the oxygen radical alternately, the step S5 which removes the gas from the inside of the process chamber 1 is performed between step S3 and step S4. The thin films of SiO2 can be laminated to reach the predetermined thickness.

The example of the reaction at this time is illustrated in FIGS. 6A to 6C. In this example, BTBAS is used as the Si source gas.

As illustrated in FIG. 6A, an OH group exists in the surface of SiO2 already deposited film, and BTBAS is supplied to the surface of the already deposited film as a Si source. Moreover, the Si of BTBAS reacts with the O of the surface OH group, and makes the O secede from the trimethyl amino acid in the process (step S3) adsorbed in the Si source, as illustrated in FIG. 6B.

Since BTBAS, which is the amino silane which has two amino acids, has a high reactivity with OH, the adsorption reaction of Si advances promptly. The trimethyl amino group disconnected at this time is removed from the process chamber 1 in step S3.

In the following oxidation process (step S4), as illustrated in FIG. 6C, the Si compound, after the trimethyl amino group breaks away, is oxidized by the oxygen radical like the O2 gas plasma, and SiO2 is formed (however, H bonds to the surface and the OH group is formed). Thus, a high temperature of the oxidation reaction using the oxygen radical like the O2 gas plasma is not needed, unlike a pure chemical reaction, and the reaction at a low temperature is possible.

BTBAS is the amino silane gas which has two amino groups in one molecule used as the Si source gas. Examples of the amino silane gas may include BTBAS, BDBAS (bis-diethyl amino silane) and BDMAS (bis-dimethylamino silane). It is also possible to use for the Si source gas an amino silane gas which has three or more amino groups in one molecule, and it is also possible to use an amino silane gas which has one amino group in one molecule.

By performing the film deposition process in this embodiment in which the source gas which contains the organic silicon is used as the Si source, the film can be formed at a low temperature which is 100 degrees C. or less. If the temperature is increased above 100 degrees C., the thickness dispersion may become large and the thermal influence on the resist pattern 104*b* may be taken into consideration, and it is preferred that the temperature is 100 degrees C. or less.

Figure 7A:
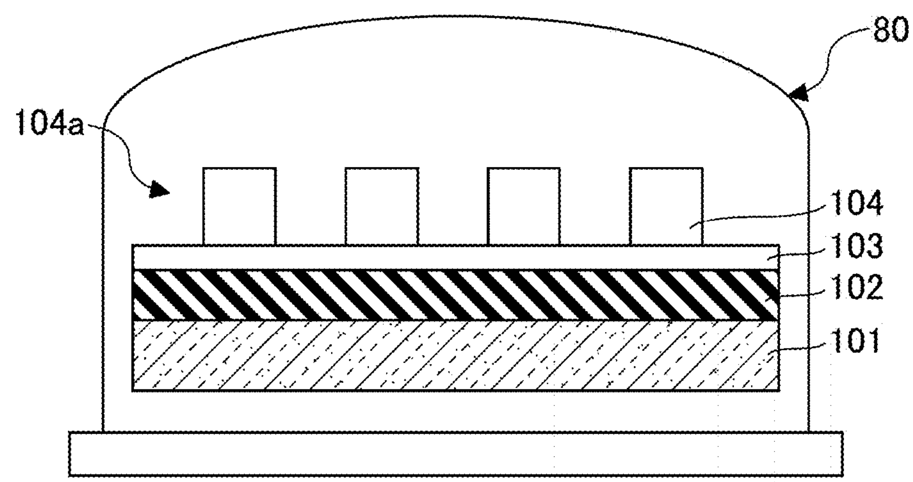
FIGS. 7A, 7B and 7C are cross-sectional views illustrating the configuration of the fine pattern in the slimming step and the film deposition step in the fine pattern forming method of the first embodiment.
Figure 7B:
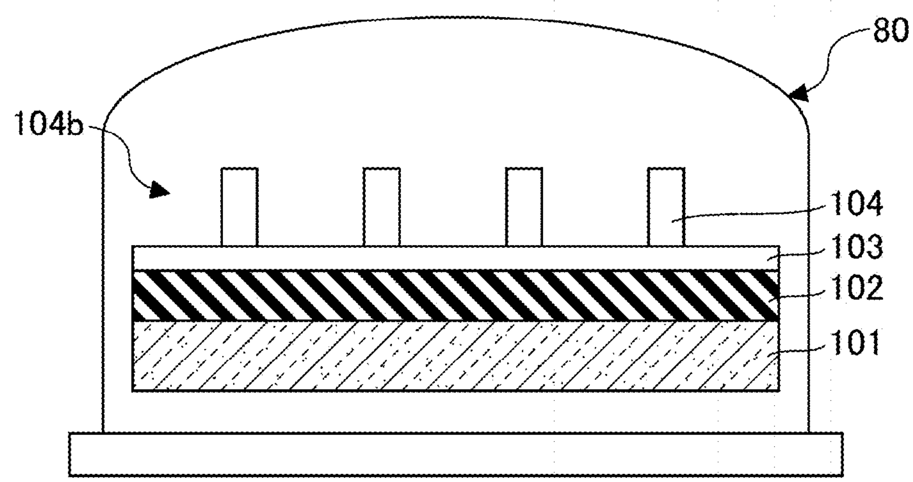
Figure 7C:
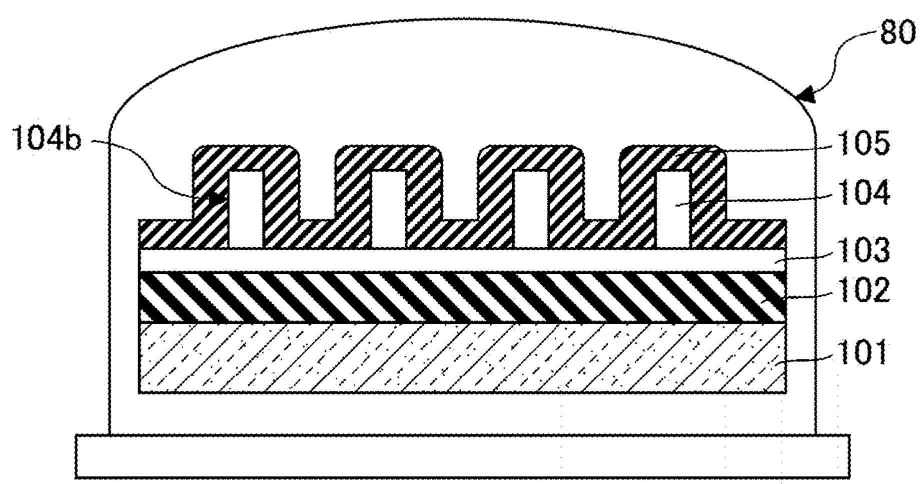

Next, the slimming process in the fine pattern forming method of this embodiment will be described with reference to FIGS. 7A-8D. FIGS. 7A-7C are cross-sectional views illustrating the configuration of the fine pattern in the slimming process and the film deposition process in the fine pattern forming method of this embodiment. FIGS. 8A-8D are cross-sectional views illustrating the configuration of the fine pattern in the slimming process and the film deposition process according to the related art. FIG. 7A, FIG. 7B and FIG. 7C correspond to FIG. 2C, FIG. 2D and FIG. 2E, respectively, and FIG. 8A, FIG. 8B and FIG. 8D correspond to FIG. 2C, FIG. 2D and FIG. 2E, respectively.

In the fine pattern forming method of this embodiment, after the patterning process illustrated in FIG. 2C is performed, the semiconductor wafer W by which resist 104 is processed into resist pattern 104*a* is introduced in film deposition apparatus 80, as illustrated in FIG. 7A.

Next, as illustrated in FIG. 7B, the slimming process (slimming process in the film deposition apparatus) of processing the configuration of the resist pattern 104*a* into the resist pattern 104*b* using the oxygen-containing gas plasma or the ozone gas within the film deposition apparatus 80 is performed.

Next, as illustrated in FIG. 7C, the film deposition process which forms the SiO2 film 105 on the organic film 103 and the resist pattern 104*b* after the end of the slimming process, by using the amino silane base precursor and the oxygen-containing gas plasma or the ozone gas, is performed within the film deposition apparatus 80. Then, the semiconductor wafer W is introduced into the etching device, and the etching step illustrated in FIG. 2F is performed.

Figure 8A:
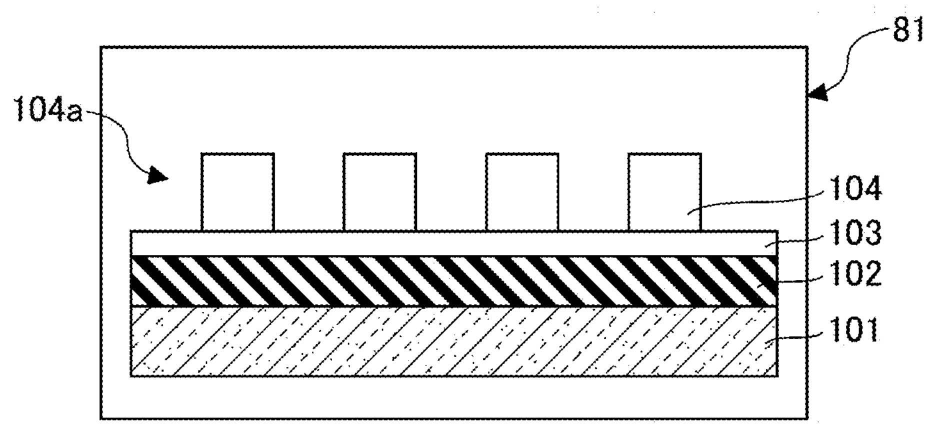
FIGS. 8A to 8D are cross-sectional views illustrating the configuration of the fine pattern when a slimming process according to the related art and a film deposition process according to the related art are performed.

According to the related art, as illustrated in FIGS. 8A-8D, after the patterning process illustrated in FIG. 2C is performed, the semiconductor wafer W by which resist 104 is processed into resist pattern 104*a* is introduced into resist coater (or ashing device) 81 as illustrated in FIG. 8A.

Figure 8B:
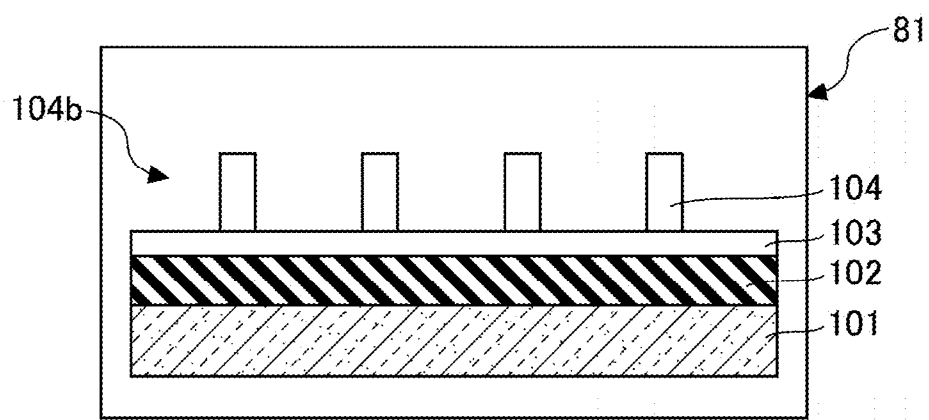
Figure 8C:
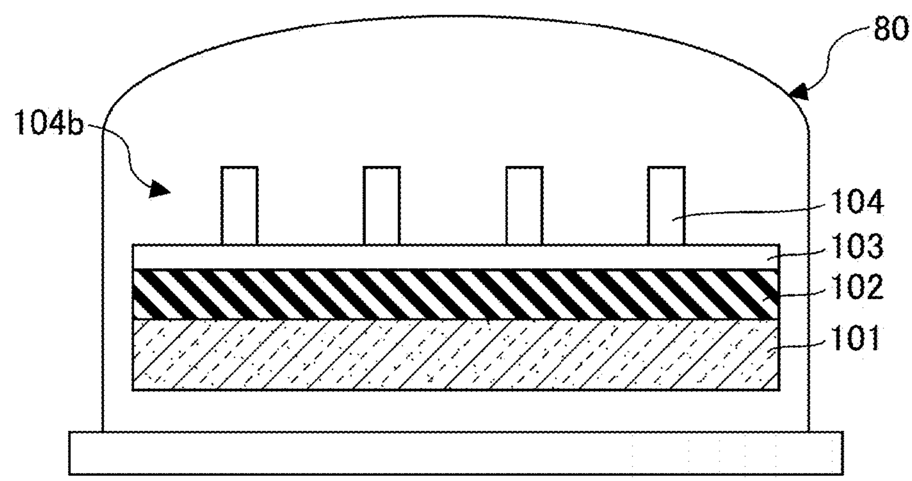

Next, as illustrated in FIG. 8B, the slimming process of processing the configuration of resist pattern 104*a* into resist pattern 104*b* by using the photolithographic technique (or oxygen-containing gas plasma) within the resist coater (or the ashing device) 81 is performed. The semiconductor wafer W in which the resist 104 is processed into the resist pattern 104*b* is introduced into the film deposition apparatus 80, as illustrated in FIG. 8C.

Figure 8D:
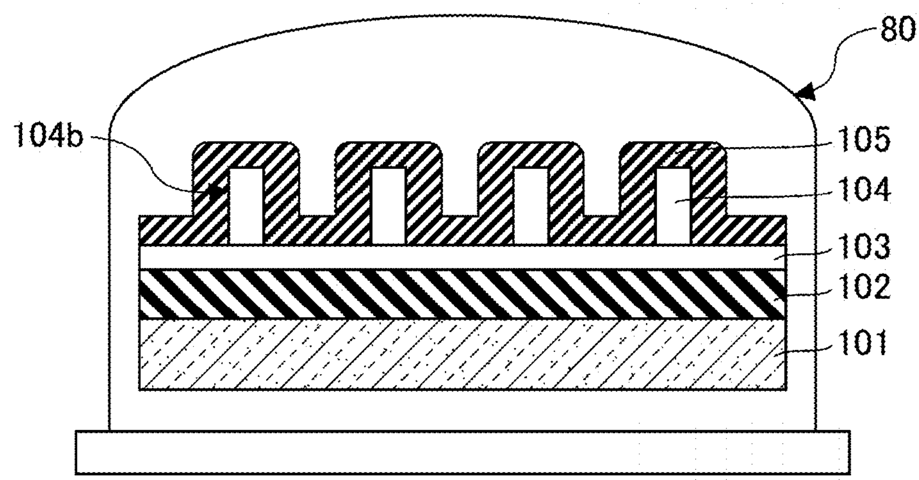

Next, as illustrated in FIG. 8D, the film deposition process is performed, which uses an amino silane base precursor, the oxygen-containing gas plasma, or the ozone gas, and forms SiO2 film 105 within the film deposition apparatus 80 on resist pattern 104*b*, into which the configuration is processed according to the slimming process, and organic film 103. Then, semiconductor wafer W is introduced into an etching device, and the etching step illustrated in FIG. 2F is performed.

When performing the slimming process (slimming process in the coater) within a resist coater, the solution is applied which develops negatives at an elevated temperature within a developing device (high-temperature-development process), and contains an acid in a resist pattern within the coater (oxidation process). The slimming of the resist pattern may be performed by heat-treating, diffusing an acid, forming a new soluble layer on the surface of a resist pattern into a resist pattern (acid diffusion process), or developing the soluble layer within the developing device (development).

When the steps of FIGS. 7A to 7C and the steps of FIGS. 8A to 8D are compared, there are more processes than the fine pattern forming method of this embodiment illustrated in FIGS. 7A-7C in the method of forming the fine pattern according to the related art illustrated in FIGS. 8A-8D. Conventionally, the slimming process is performed with the resist coater (or ashing device). In contrast, in the fine pattern forming method of this embodiment, the slimming process and the film deposition process can be continuously performed within the same process chamber of the film deposition apparatus. Thus, the cost of the process for performing the slimming process can be reduced.

Although the example which performs the slimming process with the resist coater (or ashing device) is explained as the conventional fine pattern forming method in the Comparative Example, there is also an example which performs the slimming process (trimming process) with an etching device instead of the resist coater (or asking device). Since the fine pattern forming method of this embodiment can process the slimming process and the film deposition process continuously, the cost of the process can be reduced.

In the mask pattern forming method of this embodiment, the substrate 101 in which the resist pattern 104*a* of the resist film 104 was formed in step S13 is introduced into the film deposition apparatus which is used to form the silicon oxide film 105 in step S15 (film deposition process).

Next, the slimming process is performed which carries out trimming of the configuration of the resist pattern 104*a* using the oxygen-containing gas plasma or the ozone gas within the film deposition apparatus, to form the resist pattern 104*b*.

Next, the surface of the resist pattern 104*b* after the slimming process is performed is then covered isotropically by the silicon oxide film 105 within the film deposition apparatus.

As described above with reference to FIGS. 2B-2D, in step S14, the width dimension LL4 of the resist pattern 104*a* of the resist film 104 is decreased to the width dimension LL1 of the resist pattern 104*b*. In step S15, the width dimension LL1 of resist pattern 104*b* increases to LL1+D×2, when silicon oxide film 105 which has a thickness D covers both sides of each train of resist pattern 104*b*. It is possible to finely adjust the slimming time (indicated by T1 in FIG. 5) in step S14 and the film deposition time (T6=T3+T5+

T4+T5+T3+ . . . as illustrated in FIG. 5) in step S15, respectively. What is necessary is just to adjust the film deposition time (number of times which repeats and supplies the silicon source gas and the oxygen-containing gas in the case of MLD) of the silicon oxide film in step S15, according to the amount of slimming in step S14.

Therefore, since the ratio of the slimming time T1 and the film deposition time T6 can be finely tuned independently, in the second pattern (mask pattern) 107 in step S17, the space widths LL3 and SS3 can be made equal. As a result, the second pattern (mask pattern) 107 can be used as the pattern of dense equidistant placement which has a pitch of the abbreviated half of the resist pattern 104*b*.

Concretely, by setting the slimming time T1 to 10 min, the LL1 can be set to 10 nm. If the T3, T4 and T5 in FIG. 5 are set to 15 sec, 30 sec and 15 sec, respectively, and the number of times of repetition is set to 50 times, the film deposition time T6 can be set to 50 min, and the D can be set to 10 nm. Thereby, the second pattern (mask pattern) 107 can be used as the pattern of dense equidistant placement.

Next, the slimming process can be performed holding in this embodiment, with reference to FIGS. 9A to 16B, in order to reduce the difference between the top width and the bottom width of the resist pattern, and an effect will be described which can precisely control the configuration of the resist pattern by which slimming process is performed will be described. By measuring the width dimension of the resist pattern after the end of the slimming process, the evaluation result.

As Example 1, the slimming process (slimming process in the film deposition apparatus) is performed on the resist pattern after performing a patterning process using the oxygen-containing gas plasma in the film deposition apparatus, and the film deposition process of silicon oxide is performed after that. The conditions of the slimming process (slimming process in the film deposition apparatus) and the film deposition process in Example 1 are illustrated below.

Example 1

(A) Slimming Process in Film Deposition Apparatus
- Oxygen-containing gas: O2 gas
- Substrate temperature: no heating
- Internal pressure of film deposition apparatus: 66.7-227 Pa
- Gas mass flow: 5-30 slm
- RF generator frequency: 13.56 MHz
- RF generator power: 50-500 W (B) Film Deposition Process (1) Source Gas Supplying Conditions
- Source gas: DIPAS (LTO520)
- Substrate temperature: no heating
- Internal pressure of film deposition apparatus: 26.7-667 Pa
- Gas mass flow: 50-1000 sccm
- Supplying time: 1-10 sec (2) Oxidizing Gas Supplying Conditions
- Oxidizing gas: oxygen gas
- Substrate temperature: no heating
- Internal pressure of film deposition apparatus: 66.7-227 Pa
- Gas mass flow: 5-30 slm
- Supplying time: 5-30 sec
- RF generator frequency: 13.56 MHz
- RF generator power: 50-500 W (3) Repetition Conditions
- Total cycle: 140-150 cycles FIGS. 9A and 9B illustrate SEM photographs (left-hand side) of the cross section of the resist pattern from the slanting upper part and the front part, respectively, and the corresponding schematic diagrams (right-hand side) of the resist pattern.

As illustrated in FIGS. 9A and 9B, CD denotes a width dimension of the resist pattern (which is equal to D indicated in FIG. 2E), and H denotes a height dimension of the resist pattern. T denotes a top width dimension at the top of the resist pattern, M denotes a width dimension of the resist pattern at half of the height from the bottom to the top thereof, and B denotes a bottom width dimension at the bottom of the resist pattern.

As Comparative Example 1, a high-temperature-development process is performed on the resist pattern after the patterning process is performed, the resist pattern is oxidized, and the acid diffusion process is performed, the development process is performed, the slimming process (the slimming process in the coater) is performed, and the film deposition process is performed so that the silicon oxide is formed.

The conditions of the slimming process (slimming process in the coater) and the film deposition process in Comparative Example 1 are illustrated below.

Comparative Example 1

(A) Slimming Process in Coater (1) High-Temperature-Development Processing Condition
- Developer: NMD3
- Process temperature: 23-50 degrees C.
- Processing time: 60 sec (2) Oxidation Process Conditions
- Applied fluid: TK thinner
- Rotating speed: 1000-1500 rpm
- Processing time: 60 sec (3) Acid Diffusion Process Conditions
- Process temperature: 50-90 degrees C.

(4) Development Conditions
- Developer: NMD3
- Process temperature: 23-50 degrees C.
- Processing time: 60 sec (B) Film Deposition Process
- Same as those of film deposition process of Example 1

FIGS. 10A and 10B illustrate the photographs (left-hand side) of the cross section of the resist pattern from the slanting upper part and the front part, respectively, and the corresponding schematic diagrams (right-hand side) of the resist pattern.

The definitions of CD, H, T, M, and B which indicate the respective dimensions of the resist pattern as illustrated in FIGS. 10A and 10B are the same as those of the definitions in Example 1 as illustrated in FIGS. 9A and 9B. The magnification in FIGS. 10A and 10B is the same as the magnification in FIGS. 9A and 9B.

As illustrated, the size of the resist pattern in FIGS. 9A and 9B is larger than that in FIGS. 10A and 10B, and the difference between the top width and the bottom width of the resist pattern in FIGS. 9A and 9B is smaller than that in FIGS. 10A and 10B.

Next, FIG. 34 illustrates the dimensions CD, H, T, M, B, and the ratio T/B of the top width and the bottom width of each of the resist patterns obtained in Example 1 and Comparative Example 1. FIG. 34 illustrates each width dimension of the resist pattern before the slimming process.

As compared with each dimension before performing the slimming process in the film deposition apparatus for each dimension of the resist pattern after performing slimming process in a film deposition apparatus based on each width dimension illustrated in FIG. 34, or each dimension after performing the slimming process in the coater, it is illustrated in the graphs of FIG. 11 to FIG. 14.

Figure 11:
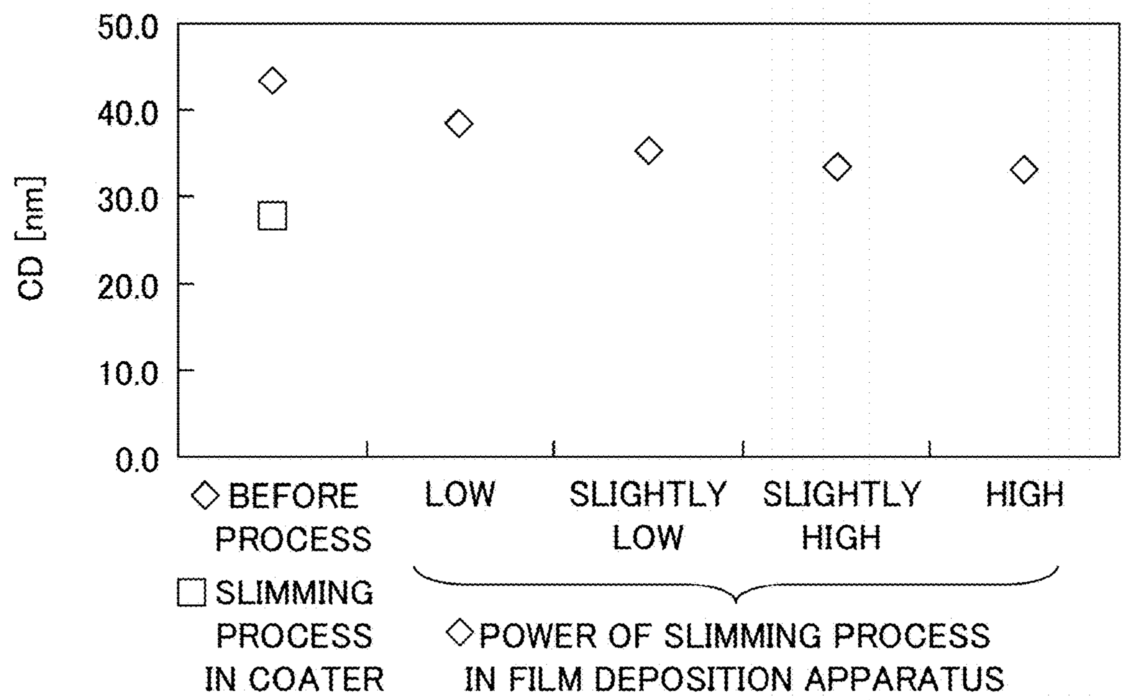
FIG. 11 is a diagram illustrating the width dimension of the resist pattern before and after the slimming process in the film deposition apparatus is performed.
Figure 12:
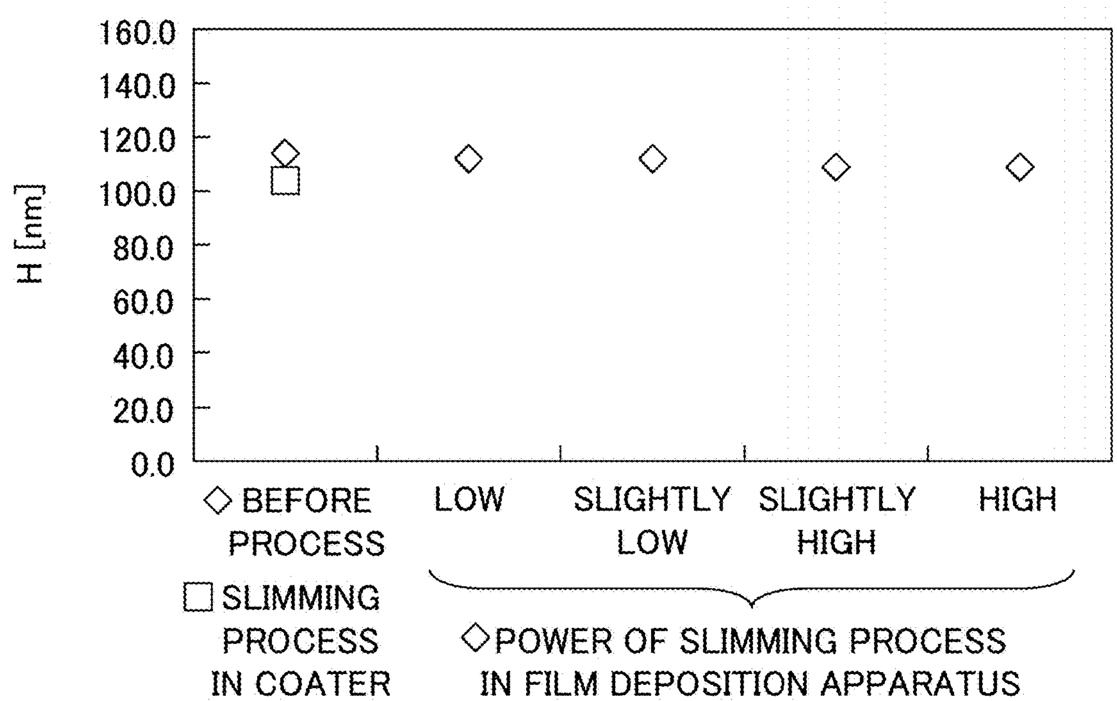
FIG. 12 is a diagram illustrating the height dimension of the resist pattern before and after the slimming process in the film deposition apparatus is performed.
Figure 13:
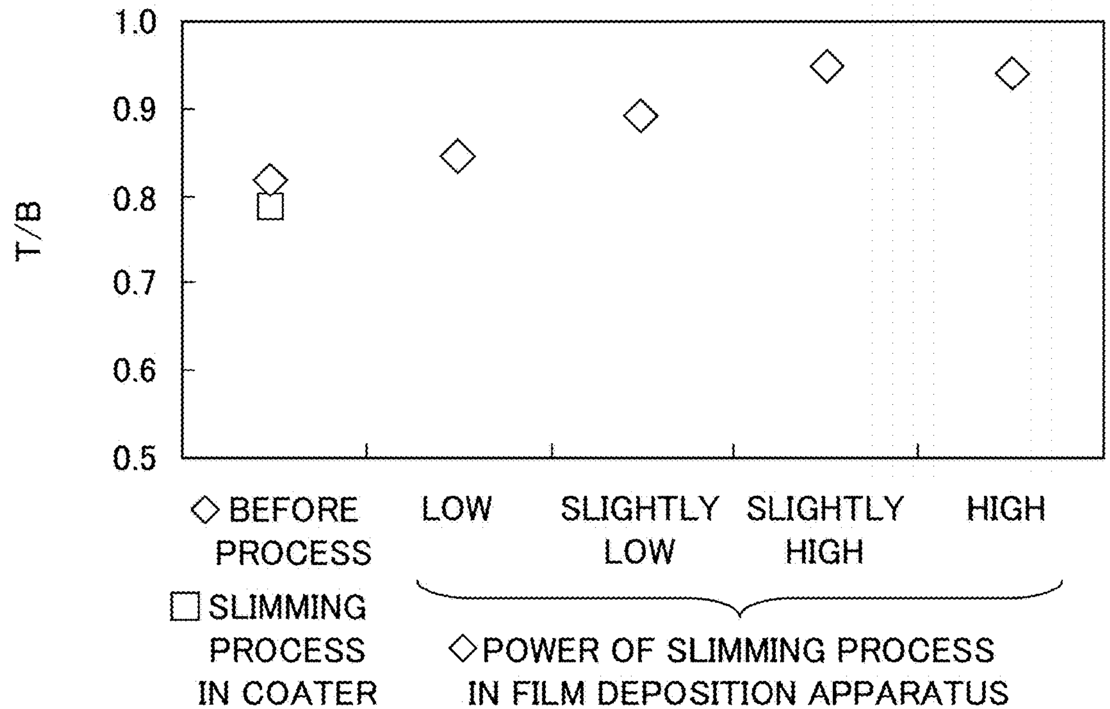
FIG. 13 is a diagram illustrating the ratio between a top width and a bottom width of the resist pattern before and after the slimming process in the film deposition apparatus is performed.
Figure 14:
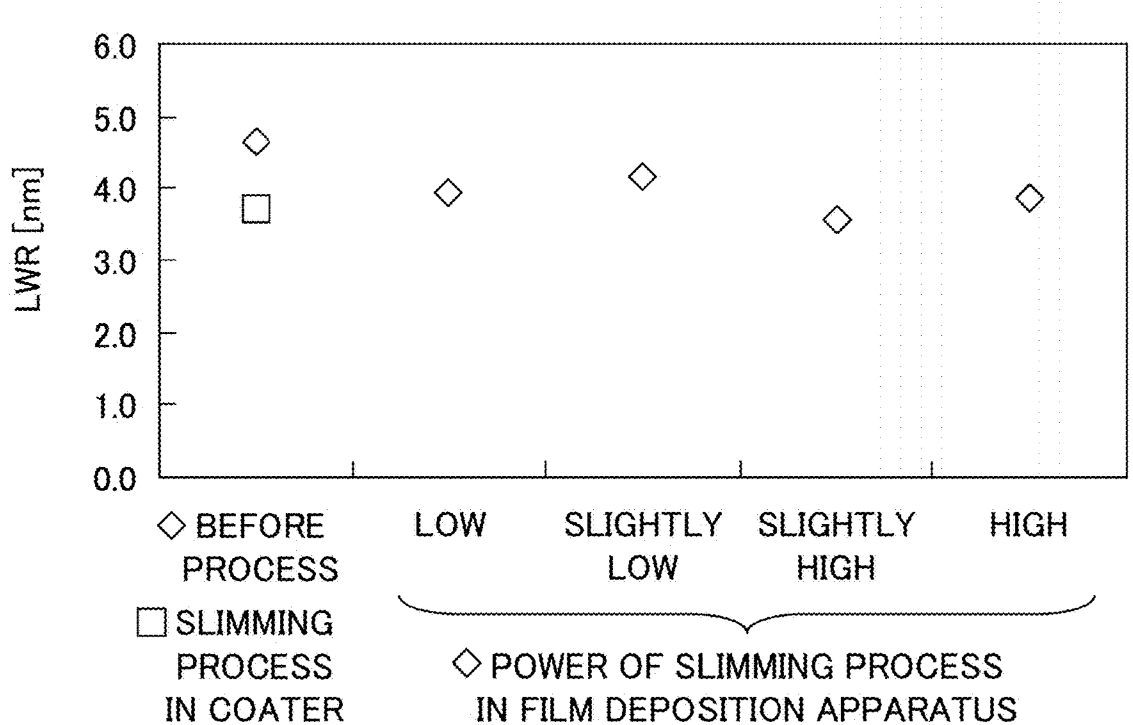
FIG. 14 is a diagram illustrating the line width roughness LWR of the resist pattern before and after the slimming process in the film deposition apparatus is performed.

FIG. 11 illustrates the width dimension CD of the resist pattern, FIG. 12 illustrates the height dimension H of the resist pattern, FIG. 13 illustrates the ratio T/B of the top width and the bottom width of the resist pattern, and FIG. 14 illustrates the line width roughness (LWR) of the resist pattern. Here, the line width roughness (LWR) is a parameter which expresses a dispersion of the CD values at two or more portions in the pattern extending direction (the direction of Y) in FIGS. 9A to 10B, which is equivalent to $3x\sigma$ when setting the standard deviation to G.

As illustrated in FIG. 11, the width dimension CD of the resist pattern by the slimming process in the film deposition apparatus decreases from the level before the process is performed, regardless of the value to which the power of the RF generator is adjusted. In contrast, the width dimension CD of the resist pattern by the slimming process in the coater does not decrease.

As illustrated in FIG. 12, the height dimension H of the resist pattern by the slimming process in the film deposition apparatus decreases from the level before the process is performed, regardless of the value to which the power of the RF generator is adjusted. In contrast, the height dimension H of the resist pattern by the slimming process in the coater does not decrease.

As illustrated in FIG. 13, the ratio T/B of the top width and the bottom width of the resist pattern by the slimming process in the film deposition apparatus increases from the level before the process is performed or the level of the slimming process in the coater and approaches the value 1, regardless of the value to which the power of an RF generator is adjusted. Namely, the difference between the top width and the bottom width of the resist pattern can be reduced by the slimming process in the film deposition apparatus from the level of the slimming process in the coater.

As illustrated in FIG. 14, the LWR of the resist pattern by the slimming process in the film deposition apparatus is smaller than the level before the process is performed, regardless of the value to which the power of the RF generator is adjusted. Although it is a value comparable as the value by the slimming process in the coater, the amount of decline of the CD value by the slimming process in the coater is larger than the amount of decline of the CD value by the slimming process in the film deposition apparatus. The ratio of the LWR to the amount of decline of the CD value by the slimming process in the film deposition apparatus is smaller. Thus, the value of the LWR which expresses the dispersion of the CD values in the pattern extending direction (the direction of Y) by the slimming process in the film deposition apparatus is improved when compared to the slimming process in the coater.

FIGS. 15A and 15B illustrate the SEM photographs of the resist pattern after (B) the film deposition process is performed in Example 1. FIGS. 15A and 15B are the photographs (left-hand side) of the cross section of the resist pattern from the slanting upper part and the front part, respectively, and the corresponding schematic diagrams (right-hand side) of the resist pattern. FIGS. 16A and 16B illustrate the SEM photographs of the resist pattern after (B) the film deposition process in Comparative Example 1 is performed. FIGS. 16A and 16B are the photographs (left-hand side) of the cross section of the resist pattern from the slanting upper part and the front part, respectively, and the corresponding schematic diagrams (right-hand side) of the resist pattern. The magnification of the photographs of FIGS. 16A and 16B is the same as the magnification of the photographs of FIGS. 15A and 15B.

As is apparent from FIGS. 15A to 16B, the resist pattern in FIGS. 15A and 15B is larger in size, and the difference between the top width and the bottom of the resist pattern in FIGS. 15A and 15B is smaller. That is, the size relation of the width dimension of the resist pattern between FIG. 15 and FIG. 16 remains unchanged. Therefore, in order to improve the slimming of the resist pattern, the slimming process in the film deposition apparatus is superior to the slimming process in the coater.

In the fine pattern forming method and the film deposition apparatus of this embodiment, after the slimming process of the resist pattern is performed using the oxygen-containing gas in the process chamber, the silicon oxide can be formed supplying alternately the source gas and the oxygen radical-containing organic silicon to the same process chamber. Therefore, the silicon oxide can be formed keeping the surface of the resist pattern pure, and uniformity in the surface of the semiconductor substrate of the configuration with the fine patterns having a pitch below the resolution limit can be made better. Since the processes which use the processing unit which carries out slimming process of the resist pattern are reducible, the cost of the process which forms fine patterns can be reduced.

In this embodiment, although the case where the amino silane gas (BTBAS) is used is explained, in a case where another amino silane gas is used as the Si source gas containing organic silicon, or ethoxy silane gas is used, the process can be performed in a similar manner.

Next, with reference to FIG. 17, the film deposition apparatus used for the fine pattern forming method and the fine pattern forming method of the second embodiment will be described.

Figure 17:
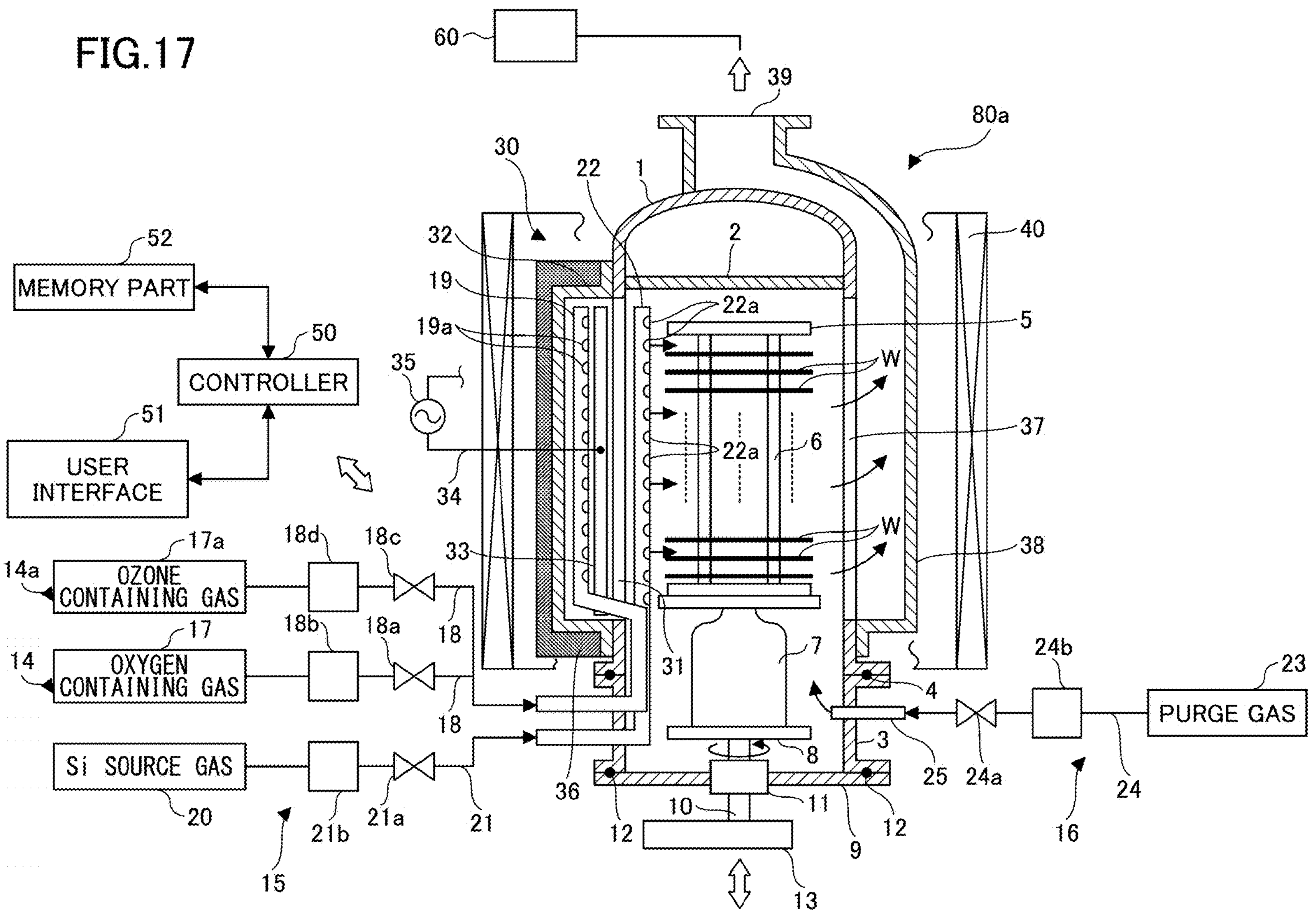
FIG. 17 is a vertical cross-sectional view illustrating the structure of a film deposition apparatus used for a fine pattern forming method of a second embodiment of the invention.

FIG. 17 is a vertical cross-sectional view illustrating the structure of a film deposition apparatus used for the fine pattern forming method of this embodiment. The film deposition apparatus used for the fine pattern forming method of this embodiment is different from the film deposition apparatus in the first embodiment in that it is provided with an ozone-containing gas supplying device.

As illustrated in FIG. 17, the basic structure of the film deposition apparatus **80*a* used for the fine pattern forming method of this embodiment is the same as that of the film deposition apparatus illustrated in FIG. 3, and the film deposition apparatus 80*a* includes the oxygen-containing gas supplying device 14, the Si source gas supplying device and the plasma generating device 30, and the film deposition apparatus 80*a* is arranged to perform the film deposition that is the same as the film deposition of the silicon oxide 104** in the first embodiment.

On the other hand, the film deposition apparatus **80*a* is provided with an ozone-containing gas supplying device 14*a*. The ozone-containing gas supplying device 14*a* is provided with an ozone-containing gas supply source 17*a*, and the ozone-containing gas supply source 17*a* is connected to an oxygen-containing gas piping 18 via a flow control device 18*d* and an opening and closing valve 18*c*. Thereby, the ozone-containing gas can be supplied to the process chamber 1**.

In the case of the slimming process, the ozone-containing gas, for example, ozone gas, is used. When performing the slimming process using the ozone gas, it is not necessary to generate the plasma. For this reason, the ozone-containing gas is in the condition when no high-frequency voltage is applied to the plasma electrode 33 in the plasma generating device 30, and what is necessary is just to supply the ozone-containing gas to the process chamber 1 via the distributed nozzle 19.

In the film deposition apparatus 80*a* used for the fine pattern forming method of this embodiment, the ozone-containing gas supplying device 14*a* is provided in addition to the oxygen-containing gas supplying device 14, the Si source gas supplying device 15, and the plasma generating device 30. After the slimming process of the resist pattern is performed using the ozone-containing gas in the process chamber 1, silicon oxide can be formed by supplying alternately the source gas and the oxygen radical-containing organic silicon in the same process chamber 1. Therefore, silicon oxide can be formed while keeping the surface of the resist pattern pure, and uniformity in the surface of the semiconductor substrate of the configuration of fine patterns having a pitch below the resolution limit can be made better.

Since the processes which use the processing unit which performs the slimming process of the resist pattern are reducible, the cost of the process which forms the fine patterns can be reduced.

Figure 19A:
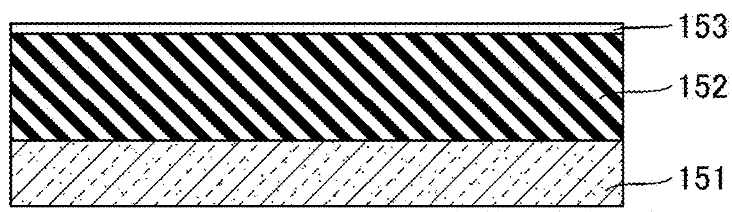
FIGS. 19A to 19J are cross-sectional views illustrating the configuration of the fine pattern in each of the respective steps of the fine pattern forming method of the third embodiment.
Figure 19B:
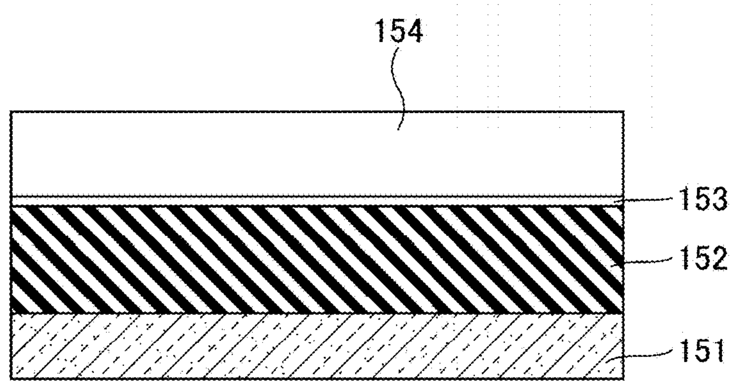
Figure 19C:
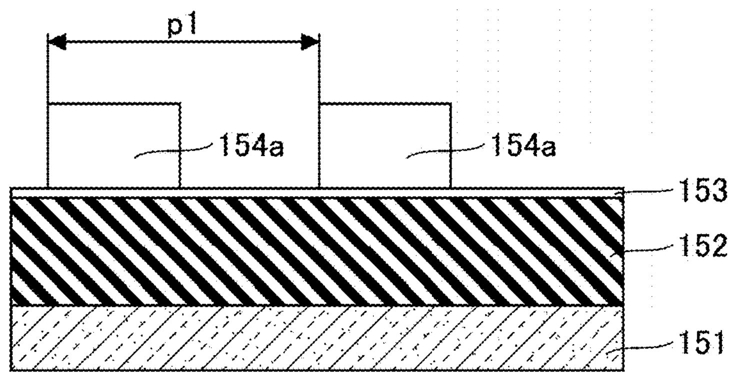
Figure 19D:
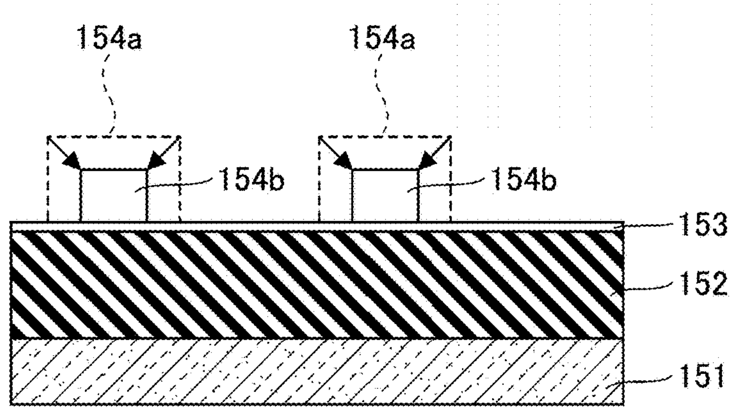
Figure 19E:
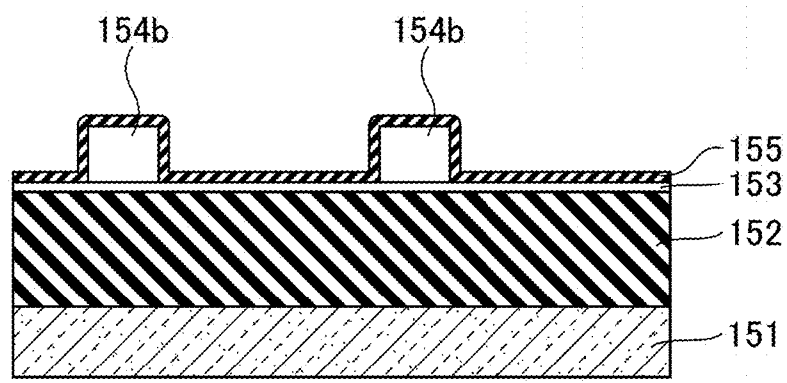
Figure 19F:
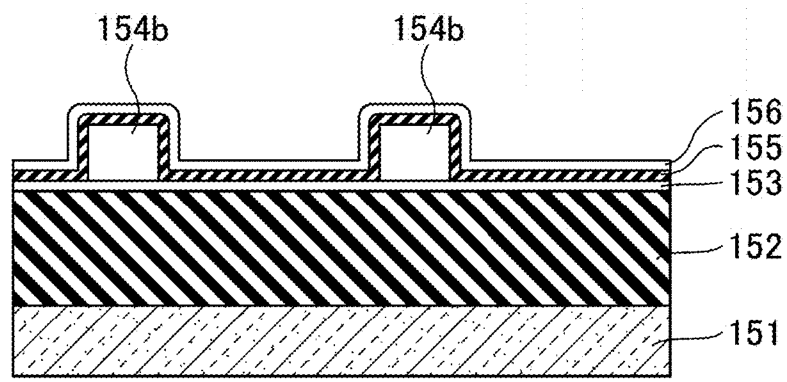
Figure 19G:
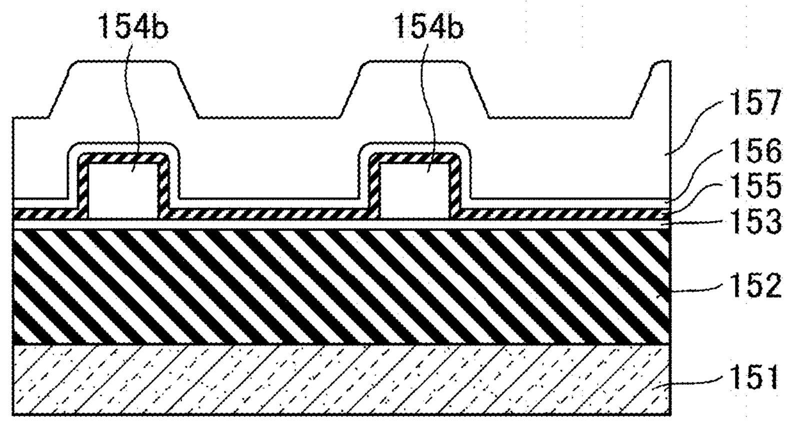
Figure 19H:
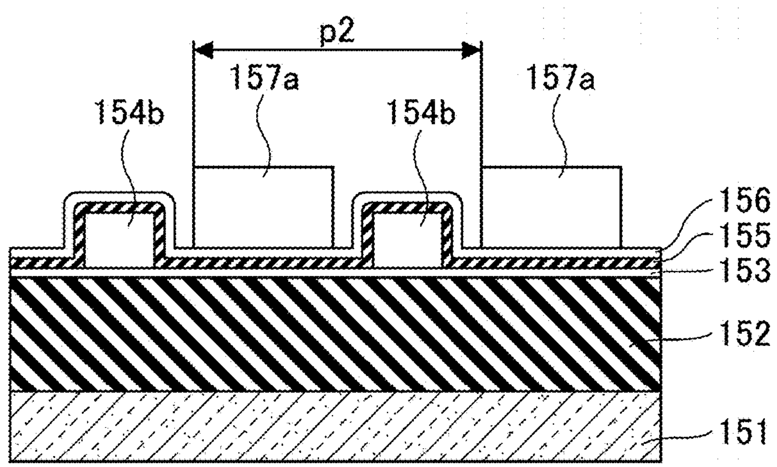
Figure 19I:
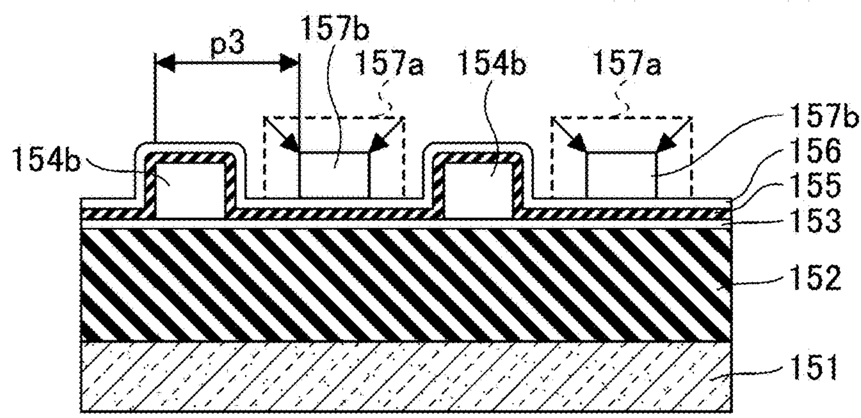
Figure 19J:
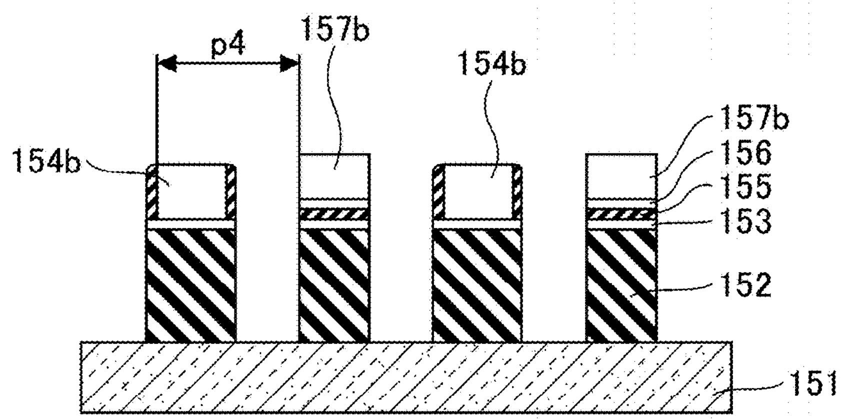

Next, with reference to FIGS. 18 to 19J, a fine pattern forming method of a third embodiment of the invention will be described.

FIG. 18 is a flowchart for explaining the procedure of respective steps of the fine pattern forming method of this embodiment. FIGS. 19A to 19J are cross-sectional views illustrating the configuration of the fine pattern in each of the respective steps of the fine pattern forming method of this embodiment.

The configuration of the fine pattern after the steps S21 to S30 of FIG. 18 are performed is equivalent to the configuration illustrated in FIGS. 19A to 19J. The fine pattern forming method of this embodiment is different from the first embodiment, which applies the film deposition process of the silicon oxide to the SWT process, in that it applies the film deposition process of the silicon oxide to the pattern organic film to the LLE process.

As illustrated in FIG. 18, the fine pattern forming method of this embodiment includes a process which forms a thin film and a coating, a process which forms a resist film, a patterning process, a slimming process, and a film deposition process, and further includes a process which forms a coating, a process which forms a resist film, a patterning process, a slimming process, and an etching step.

Namely, the process which forms a thin film includes step S21 and the process which forms a resist film includes a first step S22 and a second step S27. The patterning process includes a first step S23 and a second step S28. The slimming process includes a first step S24 and a second step S29, the film deposition process includes step S25, and the etching step includes step S30.

Step S21 is a process which forms a thin film and a coating on a semiconductor substrate. FIG. 19A is a cross-sectional view illustrating the configuration of the fine pattern after the step S21 is performed.

In step S21, as illustrated in FIG. 19A, the thin film 152 is formed on the semiconductor substrate 151. The thin film 152 may be a film which will be processed later into fine patterns, and the thin film 152 may be an insulating layer of SiN or SiO2, and may be an electric conduction film such as conductive polysilicon. That is, the material of the thin film 152 is not limited, and the film which contains silicon nitride, silicon oxide, oxynitriding silicon, amorphous silicon, or polysilicon can be used for it. In this example, the thin film 152 of SiN is used.

Subsequently, on the thin film 152, acid resisting material is applied and the coating (BARC) 153 is formed. Similar to the first embodiment, the semiconductor substrate 151 is not limited a silicon substrate, and may contain the structure in which the electric conduction film corresponding to the semiconductor chip or integrated circuit pattern is formed in the semiconductor substrate or on the semiconductor substrate. The thin film of this embodiment is equivalent to the film to be etched in the claims.

Step S22 is a process which forms photoresist film 154. FIG. 19B is a cross-sectional view illustrating the configuration of the fine pattern after the step S12 is performed. As illustrated in FIG. 19B, the photoresist is applied and the photoresist film 154 is formed on the coating 153. The photoresist film 154 of this embodiment is equivalent to the first resist film in the claims.

Next, the patterning process containing step S23 is performed. Step S23 is a process which forms resist pattern 154*a* which exposes and develops formed photoresist film 154 and includes the photoresist film 154. FIG. 19C is a cross-sectional view illustrating the configuration of the fine pattern after the step S23 is performed. As illustrated in FIG. 19C, the photoresist film is processed into resist patterns 154*a* having a predetermined pitch p1 by using the photolithographic technique.

In this embodiment, the predetermined pitch p1 is made into the resolution limit of the exposure device as an example of the resist pattern 154*a*. The resist pattern 154*a* and the patterning process (step S23) of this embodiment are equivalent to the first resist pattern and the first patterning process in the claims, respectively. The pitch p1 of this embodiment is equivalent to the first pitch in the claims. Therefore, the patterning process (first patterning process) of step S23 is a process processed into the first resist pattern that arranges a resist film in the first pitch by using the photolithographic technique.

Next, the slimming process containing step S24 is performed. Step S24 is a process which forms resist pattern 154*b* which carries out the slimming process of the resist pattern 154*a* which includes the photoresist film 154, and includes the photoresist film 154 (the first slimming process). FIG. 19D is a cross-sectional view illustrating the configuration of the fine pattern after the step S24 is performed. The temperature is in a range of room temperature to 100 degree C. The method of the slimming process is not limited, and an example of the conditions of the slimming process may include the oxygen radical or the ozone gas. The slimming process (step S24) of this embodiment is equivalent to the first slimming process in the claims.

In this embodiment, step S24 is performed within the process chamber of the film deposition apparatus for performing the film deposition process of step S25 performed continuously after that.

Next, the film deposition process including the step S25 is performed. Step S25 is a process which forms the thin film 152, the coating 153, and the SiO2 film 155 that is different in the resist pattern 154*b* on the coating 153 and the resist pattern 154*b*, after the end of the slimming process. FIG. 19E is a cross-sectional view illustrating the configuration of the fine pattern after the step S25 is performed.

In the step S25, the SiO2 film 155 is formed in order to protect the resist pattern 154*b* in the second photolithography process which will be performed later. The SiO2 film 155 is formed on the coating 153 and the resist pattern 154*b* after the end of the slimming process, by supplying alternately the source gas and the oxygen radical containing organic silicon. The film deposition process in the film deposition process in this embodiment is also called a hardening process. The SiO2 film is equivalent to the silicon oxide in the claims. It may be a film of another material containing silicon and oxygen, such as a SiOx film, instead of SiO2 film. An oxynitriding silicon film (SiON film) can also be used.

Next, the second photolithography of step S26 to step S28 is performed. Step S26 is a process which forms a coating. FIG. 19F is a cross-sectional view illustrating the configuration of the fine pattern after the step S21 is performed.

In step S26, as illustrated in FIG. 19F, acid resisting material is applied and the coating (BARC) 156 is formed on the SiO2 film 155. Step S26 can be skipped. When step S26 is skipped, the coating 153 formed in step S21 functions as a coating in the case of the exposure in step S28 which is a patterning process which is the second time.

Step S27 is a process which forms a photoresist film 157. FIG. 19G is a cross-sectional view illustrating the configuration of the fine pattern after the step S27 is performed.

As illustrated in FIG. 19G, on SiO2 film 155, photoresist is applied and the photoresist film 157 is formed. The photoresist film 157 of this embodiment is equivalent to the second resist film in the claims.

Next, the patterning process containing step S28 is performed. Step S28 is a process which forms resist pattern 157*a* which includes the photoresist film 157 which exposes and develops formed photoresist film 157 and has predetermined pitch p2. FIG. 19H is a cross-sectional view illustrating the configuration of the fine pattern after the step S28 is performed. At this time, the pitch of resist pattern 157*a* is set to the predetermined pitch p2. In this embodiment, the resist pattern 157*a* is the same line and space pattern as resist pattern 154*a* by which the slimming process is performed by the first photolithography. The resist pattern 157*a* is processed so that it may be arranged between the resist patterns 154*b* by which the slimming process is performed and the resist pattern 154*b* and the resist pattern 157*a* may be arranged alternately. The resist pattern 157*a* and the patterning process (step S28) of this embodiment are equivalent to the second resist pattern and the second patterning process in the claims, respectively. The pitch p2 of this embodiment is equivalent to the second pitch in the claims and it is equal to the pitch p1 (the first pitch).

Next, the slimming process containing step S29 is performed. Step S29 is a process which forms the resist pattern 157*b* which carries out the slimming process of the photoresist film 157 which forms the resist pattern 157*a*, and includes the photoresist film 157 (the second slimming process). FIG. 19I is a sectional view of the configuration of the fine pattern after the step S29 is performed.

The temperature is in a range of room temperature to 100 degree C. The method of the slimming process is not limited, and an example of the conditions of the slimming process contains the oxygen radical or the ozone gas. In the second slimming process, the resist pattern which includes the resist patterns 154*b* and 157*b* is formed. The resist pattern is the pattern in which the patterns 154*b* and 157*b* are arranged alternately, and the pitch p3 thereof is smaller than the pitch p1 or p2, and, in this embodiment, the pitch 3 is equal to about one half of the pitch p1 or p2. Thus, the resist pattern which has pitch below a resolution limit can be formed by arranging alternately resist patterns 154*b* and 157*b* formed independently. The slimming process (step S29) of this embodiment is equivalent to the second slimming process in the claims. Step S29 may be performed within equipment different from the film deposition apparatus which may carry out the slimming process within the film deposition apparatus which forms silicon oxide.

Next, step S30 is performed. As illustrated in FIG. 19J, the resist patterns 154*b* and 157*b* are used for the mask of etching, the coatings 156 and 153, the SiO2 film 155, and the thin film 152 are etched, and processed into the fine pattern which is considered the desired thin film 152. The coating 156, the SiO2 film 155, and the coating 153 are etched by using as a mask the resist pattern (the first resist pattern) 154*b* into which the configuration is processed, and the resist pattern (the second resist pattern) 157*b* into which the configuration is processed.

What is necessary is just to etch the SiO2 film 155 and the coating 153, when the coating 156 is omitted. Thereby, it arranges in pitch of the abbreviated half of predetermined pitch p1 (the first pitch), and the mask pattern is formed which includes the photoresist film (the first resist film) 154 and photoresist film (the second resist film) 157.

Next, the thin film (film to be etched) 152 is etched using the mask pattern, and the thin film pattern (etching film pattern which includes the film to be etched) which includes the thin film 152 is formed. Since the pitch p4 of the thin film 152 processed by performing step S30 is almost equal to the pitch p3 of resist patterns 154*b* and 157*b*, the pitch p4 of the fine pattern which includes the thin film 152 is made to be below the resolution limit. Thus, in this embodiment, the fine patterns having a pitch below the resolution limit can be formed.

The film forming method, which includes the processes from the process (step S21), which forms the coating 153, to the process (step S30), which etches the SiO2 film 155 and the coating 153 and forms the mask pattern, is defined as the mask pattern forming method in the claims.

The film forming method, which includes the mask pattern forming method and includes the processes from the process (step S21) which forms the thin film (film to be etched) 152, to the process (step S30) which etches the thin film (film to be etched) 152, is defined as the fine pattern forming method in the claims. As mentioned above, in the case of the hardening process (the film deposition process) in this embodiment, an oxygen radical is supplied to the film deposition apparatus which performs the hardening process, and the slimming process of the resist pattern is performed. By supplying alternately the source gas and the oxygen radical-containing organic silicon, and forming silicon oxide on the resist pattern by which slimming process is performed, and a coating of silicon oxide can be formed keeping the surface of a resist pattern pure, and uniformity in the field of the semiconductor substrate of the configuration of a fine pattern of having pitch below a resolution limit can be made better.

Since the processes which use the processing unit which carries out slimming process of the resist pattern are reducible, the cost of the process which forms a fine pattern can be reduced.

Next, with reference to FIGS. 3, 5, and 20A to 20F, a fine pattern forming method of a fourth embodiment of the invention will be described.

FIGS. 20A to 20F are diagrams for explaining the reaction on the semiconductor substrate in the fine pattern forming method of this embodiment when DIPAS is used as the Si source gas. The fine pattern forming method of this embodiment is different from the first embodiment that uses BTBAS for Si source gas in the point of using DIPAS for Si source gas.

In this embodiment, it is the same as that of the first embodiment to load a wafer in a process chamber, to rotate a wafer boat, and to perform a slimming process (step S1 of FIG. 5). It is the same as that of the first embodiment after a slimming process to perform the process (step S2 of FIG. 5) which purges the inside of a process chamber, before starting a film deposition process.

Next, a film deposition process is performed.

The film deposition process includes the process (step S3 of FIG. 5) which supplies DIPAS which is the Si source gas like the first embodiment, and the process (step S4 of FIG. 5) which supplies the oxygen radical. Through the Si source gas piping 21 and the Si source gas dispersion nozzle 22 as in FIG. 3 in step S3 in this embodiment, DIPAS is supplied to the inside of the process chamber 1 from the gas discharge hole 22*a* for the supplying time T3. Thereby, the Si source gas is made to stick to the semiconductor wafer. The time T3 in a range of 1 to 600 sec is illustrated. The flow rate of DIPAS in a range of 10-10000 mL/min (sccm) is illustrated. The pressure in the process chamber 1 in a range of 0.133-13300 Pa is illustrated. The substrate temperature, which is in a range of room temperature (25 degrees C.) to 700 degrees C., or desirably in a range of room temperature (25 degrees C.) to 500 degrees C., or more desirably in a range of room temperature (25 degrees C.) to 300 degrees C., is illustrated.

In the process which supplies the oxygen radical of step S4, as the oxygen-containing gas from the oxygen-containing gas supply source 17 of the oxygen-containing gas supplying device 14, the O2 gas is discharged from the gas discharge hole 19*a* via the oxygen-containing gas piping 18 and the oxygen-containing gas dispersion nozzle 19. At this time, the RF generator 35 of the plasma generating device 30 is turned ON, a high frequency electric field is formed, and the oxygen-containing gas (the O2 gas) is turned into a plasma state by the high frequency electric field. The oxygen-containing gas in plasma state is supplied to the process chamber 1. The SiO2 film in which the Si source adsorbed by the semiconductor wafer W is oxidized is formed. The time T4 in a range of 1 to 600 sec is illustrated. Although the flow rate of the oxygen-containing gas varies depending on the number of sheets of semiconductor wafers W loaded, the flow rate in a range of 0.1-20000 mL/min (sccm) is illustrated. The frequency of the RF generator 35 which is 13.56 MHz is illustrated and the power of the RF generator 35 in a range of 10-1500 W is used. The pressure in the process chamber 1 in a range of 0.133-13300 Pa is illustrated.

Step S5 is performed between step S3 and step S4 as illustrated in FIG. 5. Step S5 is the same as that of the first embodiment, and by repeating and supplying the Si source gas and the oxygen inclusion plasma as the oxygen radical alternately in step S5 between step S3 and step S4, SiO2 thin films can be can be laminated to reach the predetermined thickness.

Figures 20A, 20B, 20C, 20D:
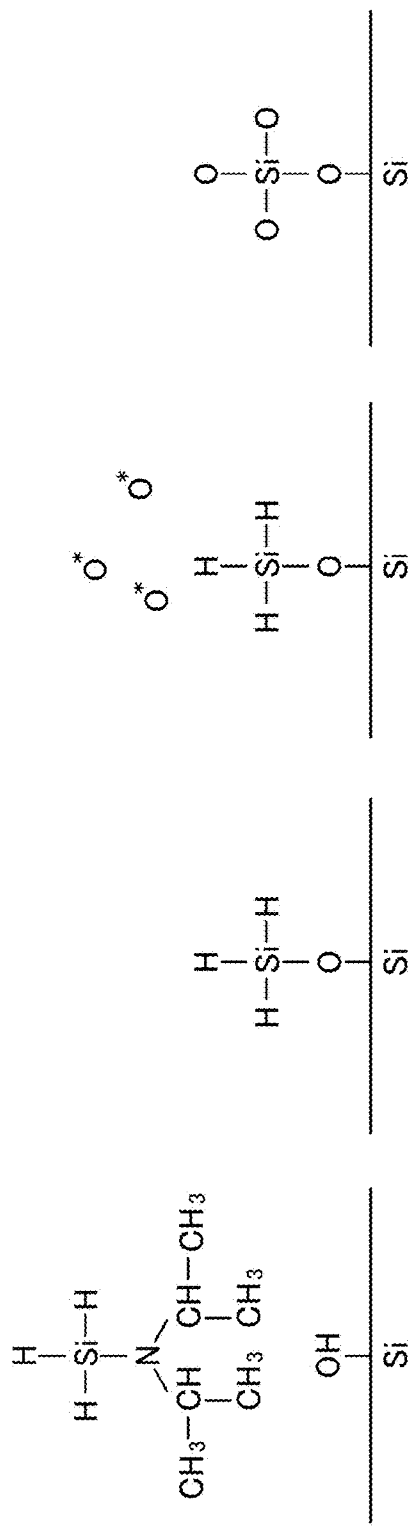
FIGS. 20A to 20F are diagrams for explaining the reaction on the semiconductor substrate in a fine pattern forming method of a fourth embodiment of the invention when DIPAS is used as a Si source gas.

The example of the reaction at this time is illustrated in FIG. 20. As illustrated in FIG. 20, while the Si source gas is supplied between processes S3 (i.e., a process chamber), as illustrated in FIG. 20B from the condition illustrated in FIG. 20A, the supplied DIPAS reacts with the surface of the semiconductor wafer W, and Si sticks to the surface of the semiconductor wafer W. Because DIPAS used as the source gas is the monovalent amino silane, the inclusion of nitrogen (N) in the precursor in which DIPAS is adsorbed in step S3 is difficult, and the inclusion of nitrogen in the resulting silicon oxide is difficult. For this reason, a good silicon film can be formed.

Because DIPAS used as the source gas is the monovalent amino silane, a structural impediment will not arise in the case of Si adsorption. For this reason, the rate of adsorption will not decrease and the productivity will not fall.

Because DIPAS is used for the source gas, the thermal stability is good and the flow control can be easily performed. The existing device of the conventional source supplying method may be used in a flexible manner.

Figures 20E, 20F:
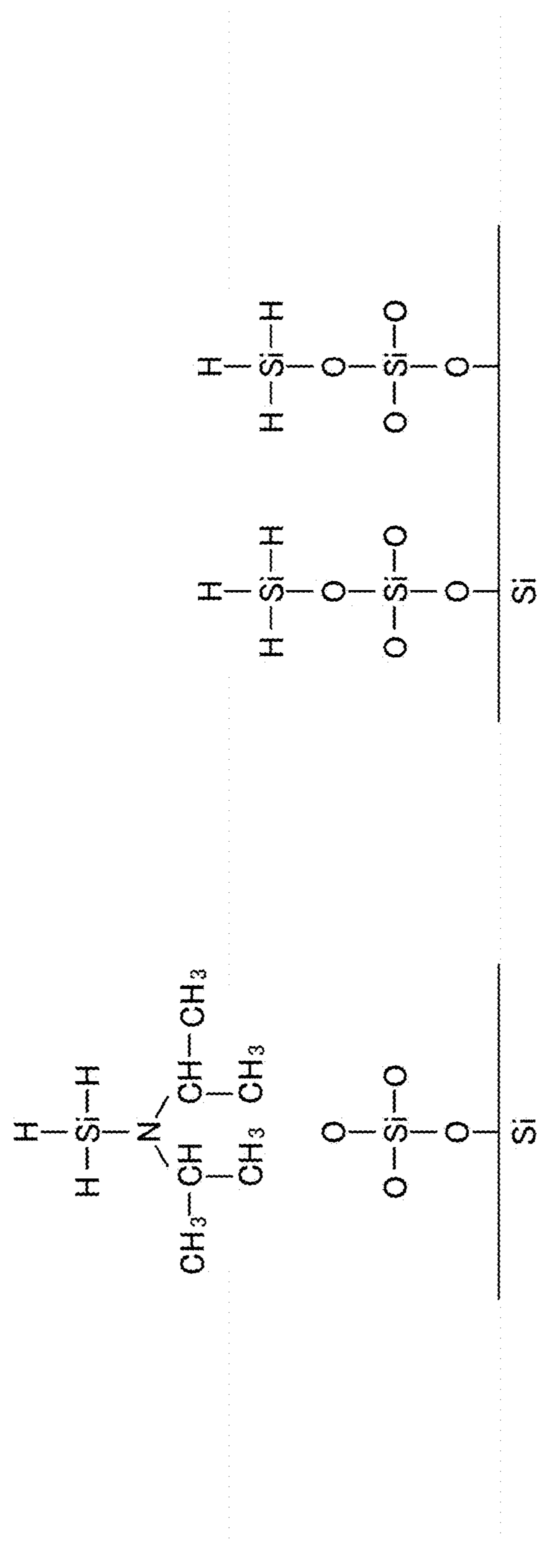

Next, while an oxygen radical is supplied between processes S4 (i.e., a process chamber), as Si which adsorbed on semiconductor wafer W oxidizes and it is illustrated in FIG. 20D from the condition illustrated in FIG. 20C, silicon oxide is formed on semiconductor wafer W. As illustrated in FIG. 20A and FIG. 5, when repeating step S3 and step S4 in step S5, the silicon oxide is further formed by oxidizing Si which the surface of semiconductor wafer W is adsorbed in DIPAS, and Si is made to stick to as illustrated in FIG. 20F, and is adsorbed. As a result, the silicon oxide of a requested thickness is formed on the semiconductor wafer W.

Also in the fine pattern forming method using DIPAS which can form a good silicon film in this embodiment as Si source gas, the slimming process which is performed with the resist coater, the slimming process and the film deposition process can be continuously processed by using the process chamber of the film deposition apparatus for performing the slimming process. Therefore, since the processes which use the processing unit to carry out slimming process of the resist pattern are reducible, the cost of the process which forms a fine pattern can be reduced.

Next, a fine pattern forming method of a fifth embodiment of the invention will be described with reference to FIGS. 21 to 27B.

Figure 22A:
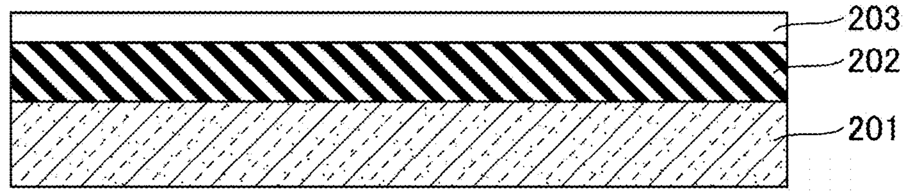
FIGS. 22A to 22H are cross-sectional views illustrating the configuration of the fine pattern in each of the respective steps of the fine pattern forming method of the fifth embodiment.
Figure 22B:
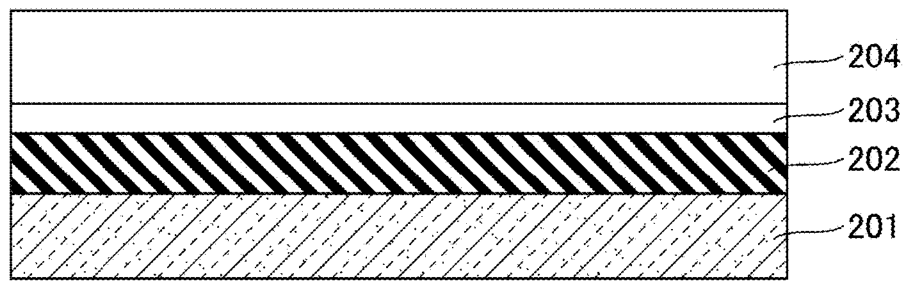

FIG. 21 is a flowchart for explaining the procedure of respective steps of the fine pattern forming method of this embodiment. FIGS. 22A and 22B are cross-sectional views illustrating the configuration of the fine pattern in each process of the fine pattern forming method of this embodiment. The configuration of the fine pattern, after the steps S111 to S118 of FIG. 21 are performed, is equivalent to the configuration illustrated in FIGS. 22A to 22H.

The fine pattern forming method of this embodiment is replaced with silicon oxide as an oxide film, and is different from the first embodiment in that it forms an aluminum oxide film. The fine pattern forming method of this embodiment includes: the process which forms a thin film on a semiconductor substrate as illustrated in FIG. 21; the formation process which forms a resist film on a thin film; the patterning process processed into the resist pattern (the first resist pattern (line part)) which arranges a resist film in the first pitch by using the photolithographic technique (first patterning process); the slimming process of processing the configuration of the first resist pattern (first slimming process); the film deposition process which forms an aluminum oxide film at room temperature on the resist pattern (the first resist pattern) into which source gas and the oxygen radical are supplied and the configuration is processed according to the slimming process (first slimming process), and a thin film; the etching step; and the process which removes a resist pattern and etches an organic film.

The process in which the process which forms a thin film forms a resist film including the step S111 includes the step S112. As for a patterning process, a slimming process includes the step S114 including the step S113. As for a film deposition process, an etching step removes a resist pattern including the step S116 including the step S115, and the process which etches an organic film includes the step S117.

The etching step in FIG. 21 is equivalent to the oxide film etching step in the claims. In this embodiment, as it is different from the first embodiment and is illustrated in FIG. 21, although consecutive processing may be performed within the same chamber (process chamber), the same chamber (process chamber) inner consecutive processing of the step S114 and step S115 does not have to be performed. Since consecutive processing does not have to be performed within the same chamber (process chamber), it is not necessary to generate the plasma in the chamber when forming the aluminum oxide film. The asking of the resist film is performed by the plasma and the configuration does not change.

Step S111 is a process which forms a thin film on a semiconductor substrate, and is the same as step S11 of the first embodiment. FIG. 22A is a cross-sectional view illustrating the configuration of the fine pattern after the step S111 is performed.

In step S111, as illustrated in FIG. 22A, a thin film 202 and an organic film 203 are formed sequentially from the bottom on the semiconductor substrate 201. The semiconductor substrate 201, the thin film 202, and the organic film 203 are the same as in the first embodiment.

The thin film and the organic film of this embodiment are equivalent to the film to be etched and the coating in the claims, respectively. The material of the thin film 202 is not limited, and the film which contains silicon nitride, silicon oxide, oxynitriding silicon, amorphous silicon, or polysilicon can be used for it.

Step S112 is a process which forms photoresist film 204, and is the same as step S12 in the first embodiment. FIG. 22B is a cross-sectional view illustrating the fine pattern configuration after step S112 is performed. The photoresist film 204 is the same as the photoresist film 104 in the first embodiment.

Figure 22C:
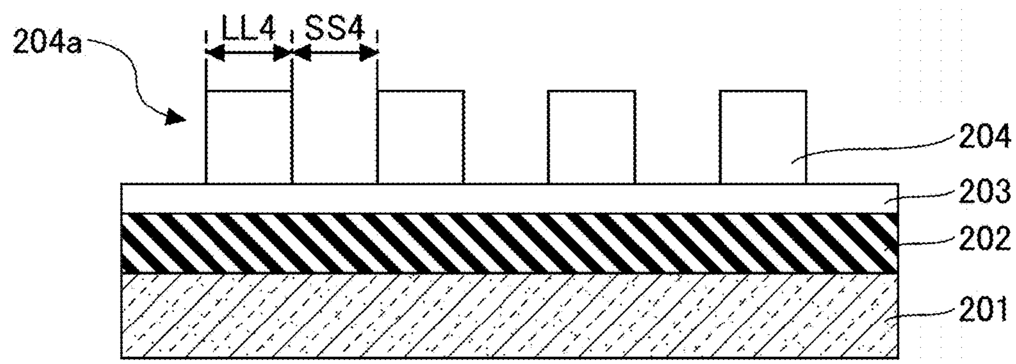

Next, the patterning process containing step S113 is performed. Step S113 is a process which forms a resist pattern 204*a* (line part) which exposes and develops the formed photoresist film 204 and includes the photoresist film 204, and is the same as step S13 in the first embodiment. FIG. 22C is a cross-sectional view illustrating the fine pattern configuration after the step S113 is performed.

As illustrated in FIG. 22C, it has line width LL4 of a line part, and the space width SS4, and the resist pattern 204*a* which includes the photoresist film 204 is formed. In this embodiment, it has line width LL4 and each line which constitutes a resist pattern is defined as a line part. Therefore, the patterning process of this embodiment is a process processed into the resist pattern which contains the line part which arranges a resist film in the predetermined pitch by using the photolithographic technique.

Figure 22D:
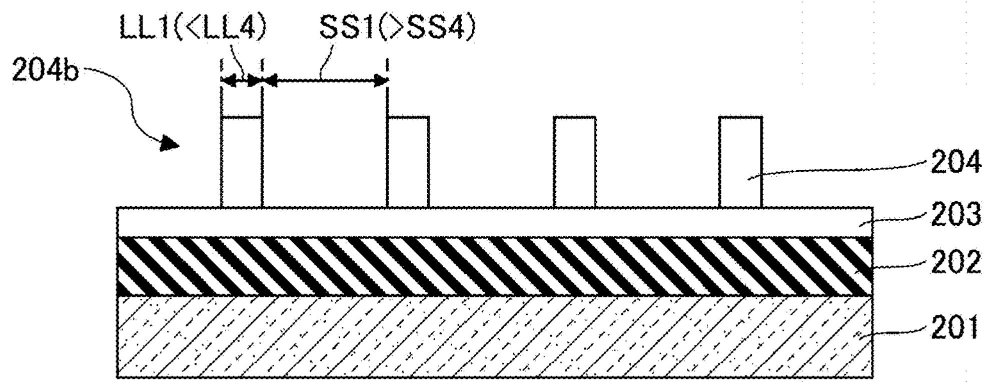

Next, the slimming process containing step S114 is performed. Step S114 is a process which forms resist pattern 204*b* (line part) which carries out the slimming process of the resist pattern 204*a* which includes the photoresist film 204, and includes the photoresist film 204, and is the same as step S14 in the first embodiment. FIG. 22D is a cross-sectional view illustrating the configuration of the fine pattern after the step S114 is performed.

In this embodiment, the slimming process may take place within the process chamber of the film deposition apparatus for performing the film deposition process of step S115 continuously performed after that in step S114 like the first embodiment. The slimming process may take place within the process chamber of the film deposition apparatus for performing the film deposition process of step S115, and a different process chamber.

The method of slimming process can be performed like the first embodiment, and the line width LL1 of resist pattern 204*b* and the space width SS1 which are made by carrying out the slimming process are set to LL1<LL4, SS1>SS4.

Figure 22E:
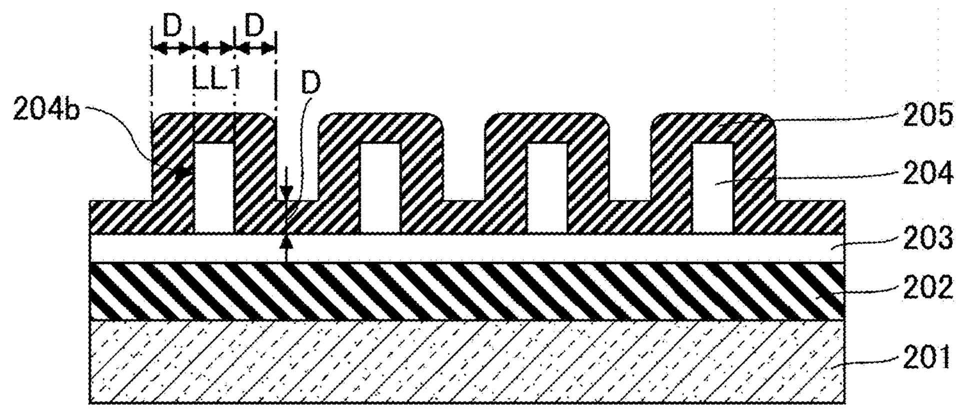

Next, the film deposition process containing step S115 is performed. Step S115 is a film deposition process which forms the Al2O3 film 205 on the organic film 203 and the resist pattern 204*b* after the end of the slimming process is performed. FIG. 22E is a cross-sectional view illustrating the configuration of the fine pattern after the step S115 is performed. The Al2O3 film (aluminum oxide film) is equivalent to the aluminum oxide film in the claims. The film may be a film of other presentations which make the AlOx film and contain aluminum and oxygen as a principal component instead of the Al2O3 film. Alternatively, films can be formed at room temperature, and as long as the film is an oxide film which does not damage the resist pattern at the time of film deposition, the oxide film of metals other than aluminum may be used.

Since the film deposition process of the Al2O3 film 205 performs after weak photoresist film 204 has remained in the elevated temperatures as resist pattern 204*b*, it is preferred to form films at low temperature. As a method for film deposition, if films can be formed at low temperatures, low-temperature MLD cannot perform the thing limited especially but this embodiment.

As a result, as illustrated in FIG. 22E, the location in which resist pattern 204*b* is formed, and the location which is not formed are included. The Al2O3 film 205 is formed in an entire substrate, and the Al2O3 film 205 is formed so that the side face of resist pattern 204*b* may be covered also on the side face of resist pattern 204*b*. If the thickness of the Al2O3 film 205 at this time is set to D, the width of the Al2O3 film 205 which covers the side face of the resist pattern 204*b* is also set to D, and one can set D to 30 nm.

Next, the film deposition process of the Al2O3 film by the low-temperature MLD will be described. In the low-temperature MLD, the source gas containing aluminum is supplied to the process chamber, and the process which makes an aluminum material adsorb on the substrate, and the process which supplies the gas containing the ozone gas to the process chamber and oxidizes the aluminum material are repeated alternately.

Figure 25:
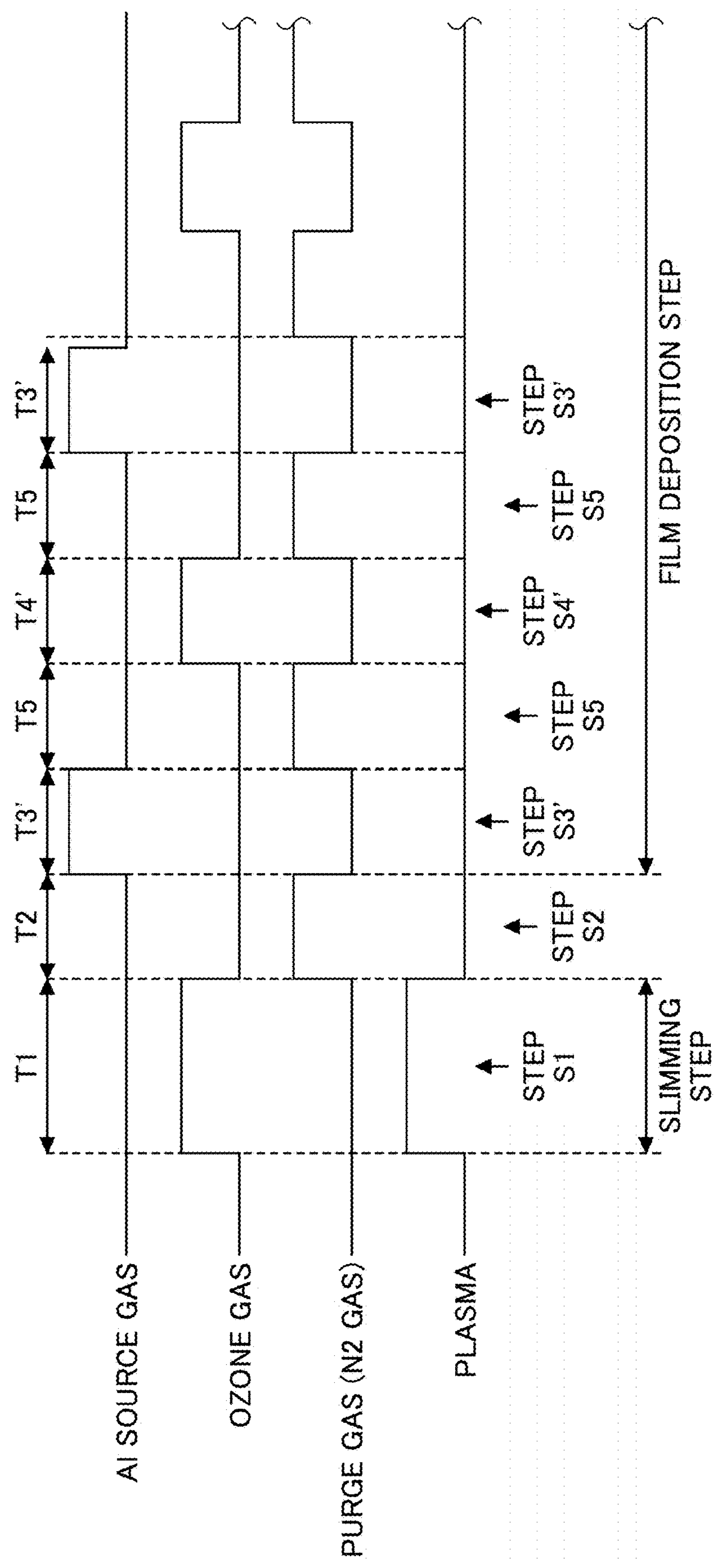
FIG. 25 is a timing chart for explaining the timing of supplying of the gases in the slimming step and the film deposition step in the fine pattern forming method of the fifth embodiment.

In the process which makes the source gas containing aluminum adsorb on the substrate, via the supplying nozzle of aluminum material gas, trimethylaluminum (TMA) as the source gas containing aluminum is supplied to the process chamber for a predetermined time (indicated by T3' in FIG. 25). Thereby, TMA is made to adsorb on the substrate.

Next, via the gas supply nozzle for the ozone gas in the process which supplies the gas containing the ozone gas is supplied to the process chamber and oxidizes the aluminum material for a predetermined time (indicated by T4' in FIG. 25). The TMA adsorbed on the substrate is oxidized and the Al2O3 film 205 is formed.

When changing the process which makes the source gas which contains the aluminum mentioned above like the first embodiment adsorb on a substrate, and the process which supplies the highly oxidizing gas to the process chamber and oxidizes the aluminum material is performed between the processes. In order to remove the remaining gas in the last process, the process which supplies the purge gas which includes inert gas, such as N2 gas, in the process chamber can be performed for a predetermined time (indicated by T5 in FIG. 25), in order to perform the evacuation of the inside of the process chamber.

In this embodiment, the source gas which contains an organoaluminum compound as the Al source gas for forming the $Al_2O_3$ film 205 is used. The example of the Al source gas containing the organoaluminum compound is trialkylaluminum.

Examples of trialkylaluminum may include TMA (trimethyl aluminum), TEAL (triethyl aluminum), TIBA (triisobutyl aluminum), DEAC (diethyl aluminum chloride), EASC (ethylaluminum sesquichloride), EADC (ethylaluminum di-chloride), and TNOA (tri-n-octyl aluminum).

Examples of the highly oxidizing gas may include $O_3$ gas) (ozone gas) and water vapor generation (WVG) gas. Examples of WVG gas may include a gas containing $H_2O$ gas (steam), a gas containing steam generated from $H_2$ gas (hydrogen gas) and $O_2$ gas (oxygen gas) which are mixed beforehand at an elevated temperature, and a gas saturated with steam which is generated by underwater bubbling of $H_2$ gas (hydrogen gas) or $O_2$ gas (oxygen gas).

Figure 22F:
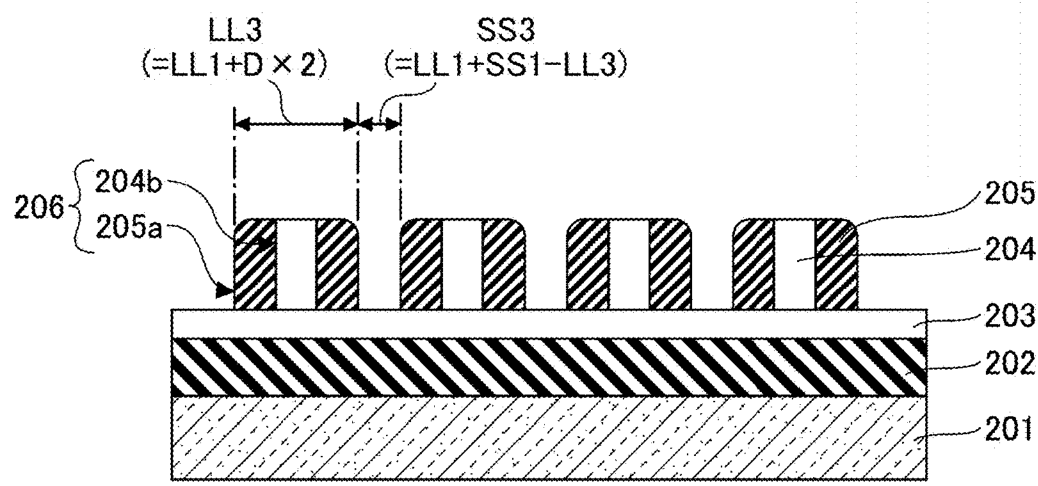

Next, an etching step including the step S116 is performed. Step S116 is an etching step etched so that the $Al_2O_3$ film 205 may remain only as the wall part 205*a* of resist pattern 204*b* (etch back), and S116 is the same as step S16 in the first embodiment. FIG. 22F is a cross-sectional view illustrating the configuration of the fine pattern after the step S116 is performed.

The third pattern 206 that includes the resist pattern 204*b* and the wall part 205*a* is formed. When line width of the third pattern 206 is set to LL3 and the space width is set to SS3, it is LL3=LL1+D×2 and SS3=LL1+SS1−LL3. By performing the etching step, the oxide film is etched to remain as side walls on the side faces of the line part of the resist pattern after the slimming process is performed.

The etching step is a process which etches the oxide film to remain as side walls on the side faces of the line part of the resist pattern after the slimming process is performed. Step S117 includes a process which removes the resist pattern 204*b* and forms the wall parts 205*a*, and a process which etches the organic film 203 by using as a mask the formed wall parts 205*a*.

Figure 22G:
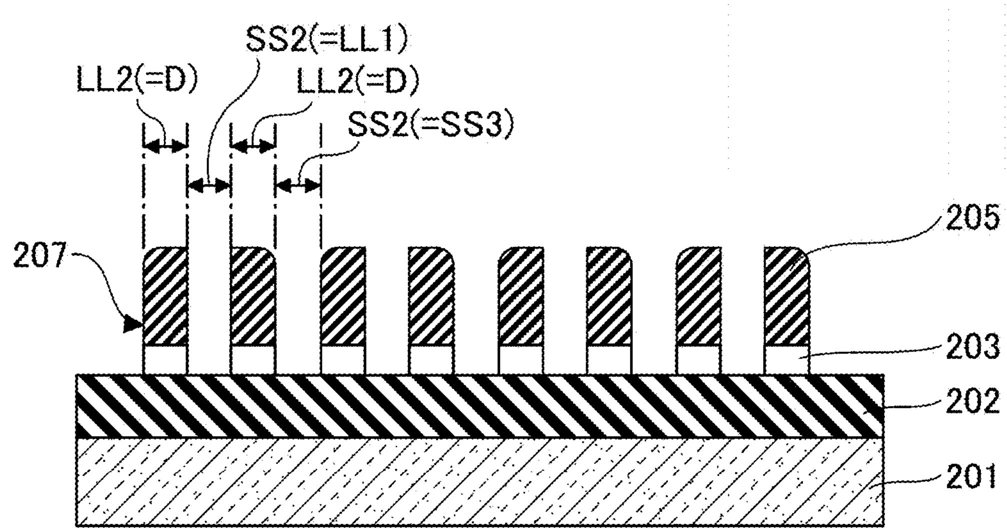

Namely, in step S117, the aluminum oxide film may remain as side walls on the side faces of the resist pattern (the first resist pattern (line part)). It is an oxide film etching step which etches an aluminum oxide film, and is the same as that of step S17 in the first embodiment. FIG. 22G is a cross-sectional view illustrating the configuration of the fine pattern after step S117 is performed.

The second pattern 207 in which the line width is equal to D and the space width LL1 and the space width SS3 appear alternately is formed. Similar to the first embodiment, the space width can be set to SS2 equal to LL1 or SS3, and the line width equal to D can be set to LL2. The second pattern 207 includes the wall part 205*a* and the organic film (coating) 203, and is equivalent to the mask pattern in the claims. Then, it is the same as that of the first embodiment to use the second pattern 207 as a mask, and to etch the thin film 202. That is, step S118 is performed.

Figure 22H:
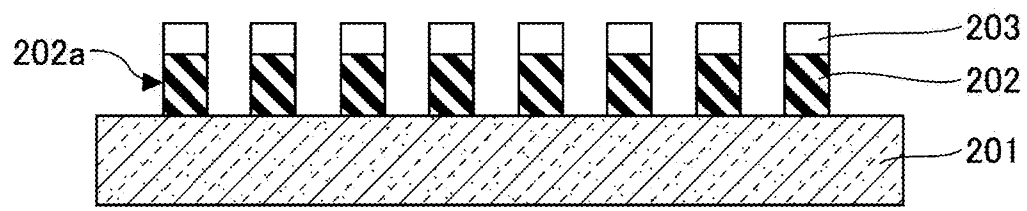

In step S118, the thin film (film to be etched) 202 is processed using the second pattern (mask pattern) 207, and as illustrated in FIG. 22H, the pattern 202*a* which includes the thin film (film to be etched) 202 is formed. The organic film (coating) 203 may remain in the upper part of the pattern 202*a*. The etching of the thin film 202 may be performed using a gas containing CF base gas, CHF base gas, CH base gas, or oxygen gas.

The film forming method which includes the processes from the process (step S111) which forms the organic film (coating) 203 to the process (step S117) which forms the mask pattern which includes the wall part 205*a* and the organic film (coating) 203 is defined as the mask pattern forming method in the claims.

The film forming method which includes the mask pattern forming method and includes the processes from the process (step S111) which forms the thin film (film to be etched) 202 to the process (step S118) which forms the pattern 202*a* from the thin film (film to be etched) 202 is defined as the fine pattern forming method in the claims.

Figure 23:
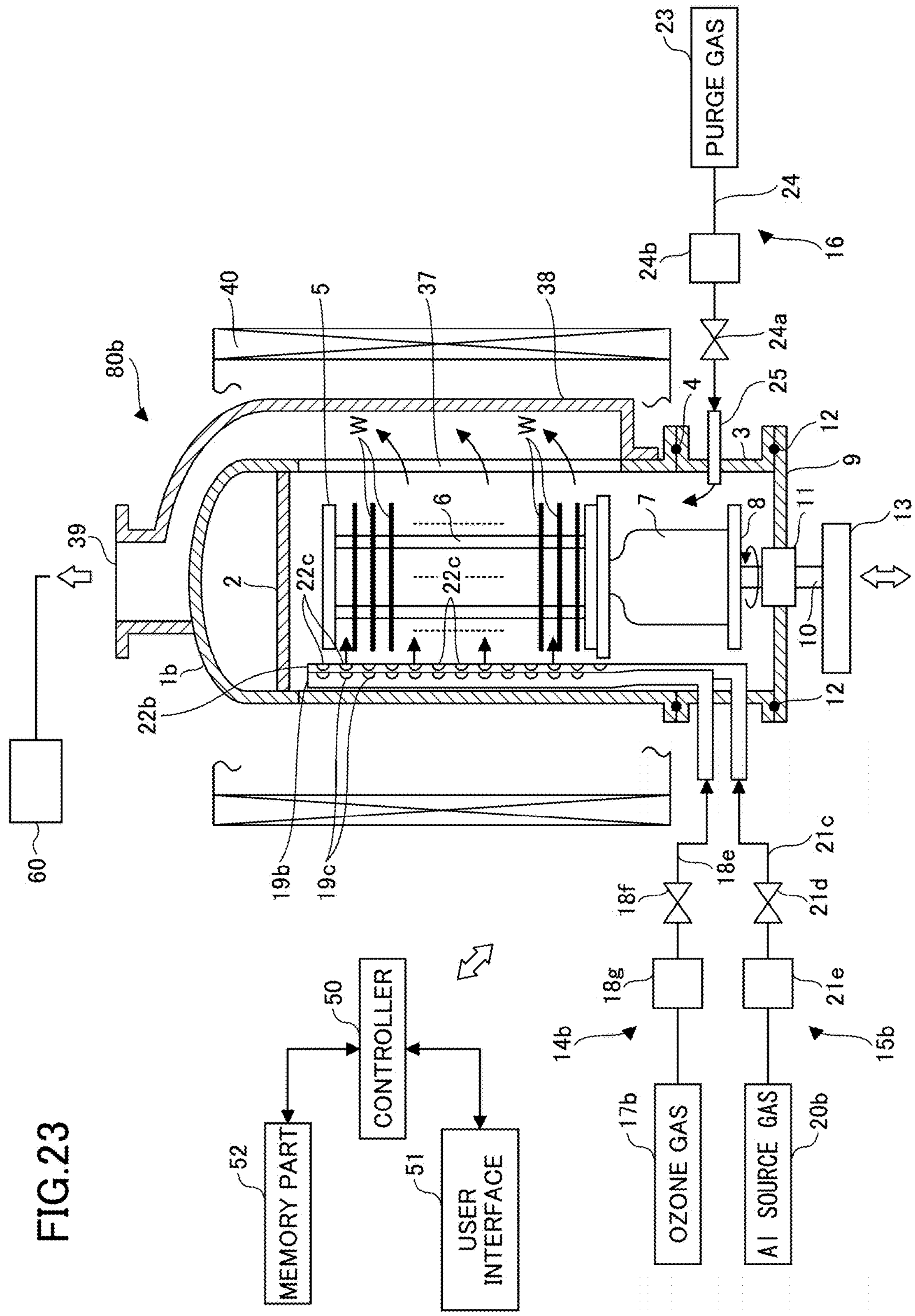
FIG. 23 is a vertical cross-sectional view illustrating the structure of a film deposition apparatus used for the fine pattern forming method of the fifth embodiment.
Figure 24:
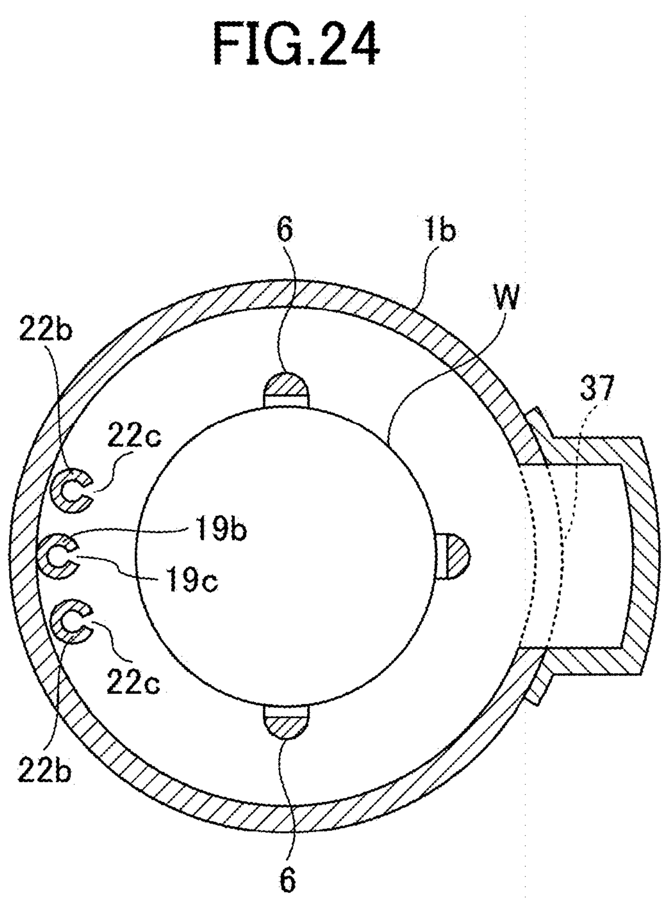
FIG. 24 is a horizontal cross-sectional view illustrating the structure of the film deposition apparatus used for the fine pattern forming method of the fifth embodiment.

Next, with reference to FIG. 3 and FIGS. 4, 23 and 24, the film deposition apparatus used for the fine pattern forming method of this embodiment will be described. FIG. 23 is a vertical cross-sectional view illustrating the structure of the film deposition apparatus used for the fine pattern forming method of this embodiment. FIG. 24 is a cross-sectional view illustrating the typical structure of the film deposition apparatus used for the fine pattern forming method of this embodiment. The heating apparatus is omitted in FIG. 24.

When performing the film deposition process of this embodiment using the film deposition apparatus 80 illustrated in FIGS. 3 and 4, consecutive processing of the slimming process and the film deposition process can be performed in the same film deposition apparatus.

On the other hand, in this embodiment, the film deposition apparatus which has a process chamber which is different from the process chamber which is used to perform the slimming process. The example of the film deposition apparatus is illustrated in FIGS. 23 and 24.

The film deposition apparatus 80*b* illustrated in FIGS. 23 and 24 removes the plasma generating device 30 and the relevant portion in the film deposition apparatus 80 illustrated in FIGS. 3 and 4. In FIGS. 23 and 24, the elements which are the same as corresponding elements of the film deposition apparatus 80 in FIGS. 3 and 4 are designated by the same reference numerals, and a description thereof will be omitted.

On the other hand, instead of the oxygen-containing gas supplying device 14 of the film deposition apparatus 80, the ozone gas supplying device 14*b* is formed in the film deposition apparatus 80*b*. The gaseous ozone piping 18*e* through which the ozone gas supplying device 14*b* draws the ozone gas from the ozone gas supply source 17*b* and the ozone gas supply source 17*b*, connects with the ozone gas piping 18*e*, and has the ozone gas dispersion nozzle 19*b* which includes the quartz tube which penetrates the side attachment wall of the manifold 3 to the inside, is bent upward, and extends vertically. Two or more gas discharge holes 19*c* are separated with a predetermined spacing in the vertical portion of the ozone gas dispersion nozzle 19*b*, it can be formed in it, and discharge of the ozone gas can be horizontally performed uniformly towards the process chamber 1*b* from each gas discharge hole 19*c*. Instead of the Si source gas supplying device 15 of the film deposition apparatus 80, the Al source gas supplying device 15*b* is formed in the film deposition apparatus 80*b*. The Al source gas supplying device 15*b* includes the Al source gas supply source 20*b*, the Al source gas piping 21*c* which draws the Al source gas from the Al source gas supply source 20*b*, connects with the Al source gas piping 21*c*, and has the Al source gas dispersion nozzle 22*b* which includes the quartz tube which penetrates the side attachment wall of manifold 3 to the inside, is bent upward, and extends vertically. Along the device direction, two or more gas ejection holes 22*c* are separated with a predetermined spacing for the Al source gas dispersion nozzle 22*b*, and it is formed in it. Discharge of the Al source gas which contains an organoaluminum compound in the process chamber 1*b* horizontally from each gas discharge hole 22*c* can be performed.

As illustrated in FIG. 24, the two Al source gas dispersion nozzles 22*b* may be formed. Alternatively, only one Al source gas dispersion nozzle may be provided. The gaseous ozone supplying device 14*b* is equivalent to the oxygen radical supplying unit in the claims, and the Al source gas supplying device 15*b* is equivalent to the source gas supplying unit in the claims. The ozone gas piping 18*e*, the Al source gas piping 21*c*, the purge gas piping 24, the valves 18*f*, 21*d*, and 24*a* and the flow control devices 18*g*, 21*e* and 24*b* are formed, and can supply the ozone gas, the Al source gas, and the purge gas, respectively. The component equivalent to the plasma generating device 30 which forms the plasma of oxygen-containing gas with film deposition apparatus 80 is not provided in the film deposition apparatus 80*b*.

Next, with reference to FIG. 25, the process in the slimming process and film deposition process of a fine pattern forming method of this embodiment will be described. FIG. 25 is a diagram for explaining the fine pattern forming method in this embodiment, and is a timing chart which illustrates the timing of supplying of the gas in a slimming process and a film deposition process. The timing of supplying of the gases in the slimming process and the film deposition process of the fine pattern forming method of this embodiment is as illustrated in FIG. 25. Except for the fact that the Si source gas is replaced with the oxygen-containing gas using the Al source gas, and the plasma is not used in the film deposition process using the ozone gas, the processes are the same as those of the first embodiment. Steps S1 and S2 are the same as those of the first embodiment.

However, in carrying out steps S1 and S2 using the film deposition apparatus which does not have the plasma generating device which illustrates the film deposition process in FIGS. 23 and 24, step S1 is performed within another process chamber which has the plasma generating device, a wafer is carried to the film deposition apparatus in step S2, and the purge gas is supplied. Then, step S3' which supplies the Al source gas containing an organoaluminum compound to the process chamber 1*b* and the aluminum source is made to stick to the substrate, and step S4' which supplies the ozone gas to the process chamber 1*b* and oxidizes the Al source gas are repeated alternately.

In this embodiment, in step S3', via the Al source gas piping 21*c* and the Al source gas dispersion nozzle 22*b*, TMA as the Al source gas from the Al source gas supply source 20*b* of the Al source gas supplying device 15*b* is supplied to the inside of the process chamber 1*b* from the gas discharge hole 22*c* at the time T3'. Thereby, the Al source gas is made to stick to the semiconductor wafer. The time T3' in a range of 1 to 600 sec is illustrated. The flow rate of the Al source gas in a range of 10-500 mL/min (sccm) is illustrated. The pressure in the process chamber 1*b* in a range of 13.3-665 Pa is illustrated.

The ozone gas is discharged from the gas discharge hole 19*c* in the process which supplies the ozone gas of step S4' via the ozone gas piping 18*e* and the ozone gas dispersion nozzle 19*b* from the ozone gas supply source 17*b* of the ozone gas supplying device 14*b*. The Al2O3 film in which the aluminum source adsorbed by the semiconductor wafer W is oxidized is formed. The time T4' in a range of 1 to 600 sec is illustrated. The flow rate of the ozone gas in a range of 100-20000 mL/min (sccm) is illustrated. The pressure in the process chamber 1*b* in a range of 13.3-665 Pa is illustrated.

It can replace with the ozone gas and the steam oxidation raw gas mentioned above can be used. Step S5 which is performed between step S3' and step S4' is the same as that of the first embodiment. If the film deposition process in this embodiment is performed, the source gas which contains the organoaluminum compound as the aluminum source will be used. Since the reaction advances by supplying the ozone gas or steam oxidation raw gas without raising the temperature in the oxidation process, the Al2O3 film can be formed at a low temperature, such as 100 degrees C. or less or at room temperature.

In this embodiment, the slimming process and the film deposition process are performed within the same process chamber of the film deposition apparatus, and it is possible to reduce the cost of the processes as in the first embodiment.

Next, with reference to FIG. 26 and FIG. 34, in this embodiment, the configuration of the resist pattern processed at the slimming process does not change before and after the film deposition process. By measuring the width dimensions of the resist pattern after the film deposition process, the evaluation result will be described.

FIGS. 26A and 26B are photographs and schematic diagrams of the resist patterns after the aluminum oxide films in Example 2 and Comparative Example 2 are formed.

In Example 2, the Al source gas and the ozone gas are supplied alternately on the resist pattern after performing the slimming process, and the film deposition process which forms the aluminum oxide film is performed. The Si source gas and the oxygen-containing gas plasma are supplied alternately on the resist pattern after performing a slimming process as Comparative Example 2, and the film deposition process which forms silicon oxide is performed. The film deposition conditions of the film deposition process in Example 2 and Comparative Example 2 are illustrated below.

Example 2

(1) Source Gas Supplying Conditions
 Source gas: TMA
 Substrate temperature: no heating
 Internal pressure of film deposition apparatus: 39.9 Pa
 Gas mass flow: 100 sccm
 Supplying time: 5 sec
(2) Oxidizing Gas Supplying Conditions
 Oxidizing gas: ozone gas+oxygen gas
 Substrate temperature: no heating
 Internal pressure of film deposition apparatus: 133 Pa
 Ozone gas flow rate: 200 g/m3
 Oxygen gas mass flow: 10.0 slm
 Supplying time: 15 sec
(3) Repetition Conditions
 Sum cycle: 210 cycles Comparative Example 2

(1) Source Gas Supplying Conditions
 Source gas: DIPAS (LTO520)
 Substrate temperature: no heating
 Internal pressure of film deposition apparatus: 26.7-227 Pa
 Gas mass flow: 50-1000 sccm
 Supplying time: 1-10 sec
(2) Oxidizing Gas Supplying Conditions
 Oxidizing gas: oxygen gas
 Substrate temperature: no heating Internal pressure of film deposition apparatus: 66.7-227 Pa Gas mass flow: 5-30 slm Supplying time: 5-30 sec RF generator frequency: 13.56 MHz RF generator power: 50-500 W (3) Repetition Conditions Total cycle: 140-150 cycles As illustrated in FIGS. 26A and 26B, the thickness of the oxide film is set to D. The height dimension of the resist pattern is set to H, the top width dimension of the resist pattern is set to T, the width dimension of the resist pattern in the location of an intermediate height, which is half of the height from the bottom to the top, is set to M, and the bottom width dimension of the resist pattern is set to B.

Next, the dimensions H, T, M, B, and the ratio T/B of the top width and the bottom width of the resist pattern obtained in Example 2 and Comparative Example 2 are illustrated in FIG. 35.

As illustrated in FIG. 35, in Example 2 and Comparative Example 2, D is 30 nm, respectively. As illustrated in FIG. 35, when the aluminum oxide film is formed, the decrement of the dimensions of the resist pattern before and after the aluminum oxide film is formed in Example 2 is smaller than the decrement of the dimensions of the resist pattern before and after the silicon oxide film is formed in Comparative Example 2.

As illustrated in FIG. 35, when the aluminum oxide film is formed, the ratio T/B of the top width and the bottom width of the resist pattern increases to be larger than in the case when the silicon oxide film is formed, and serves as the value near 1. That is, when the aluminum oxide film is formed, the difference between the top width and the bottom width can be smaller than in the case where the silicon oxide film is formed.

Next, with reference to FIGS. 27A-27B and FIG. 36, the effect of decreasing the damage (breakage) to the resist pattern processed at the slimming process at the film deposition process in this embodiment will be described.

Examples 3 and 4 are illustrated. In Examples 3 and 4, the photoresist film is formed but the slimming process of the resist pattern is not performed, and the thickness of the photoresist film after the oxide film is formed is measured and the measured thickness is compared with that of Comparative Example 3. The evaluation result will be described. FIGS. 27A and 27B are cross-sectional views illustrating the configuration of the film for measuring the amount of ashing of the resists in Examples 3 and 4 and Comparative Example 3.

Figure 27A:
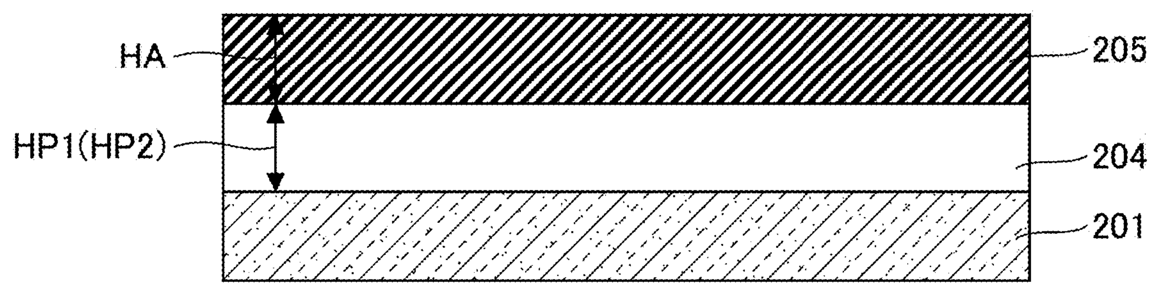
FIGS. 27A and 27B are cross-sectional views illustrating the configuration of the films for measuring the amounts of ashing of the resists in Examples 3 and 4 and Comparative Example 2.

In Example 3, as illustrated in FIG. 27A, the photoresist film 204 which is about 300 nm thick is formed on the semiconductor substrate 201, the thickness of the photoresist film 204 is measured, and this thickness is referred to as HP1.

Next, the film deposition process which forms the Al2O3 film 205 on the photoresist film 204 by supplying the Al source gas and the ozone gas alternately is performed. At this time, the supplying cycle at which the Al source gas and the ozone gas are supplied alternately is changed, and the thickness HA of the Al2O3 film 205 is changed to 5 nm, 10 nm, 15 nm and 20 nm.

Next, the fluoric acid (HF) washing is performed, the Al2O3 film 205 is removed, the thickness of the photoresist film 204 exposed to the surface is measured, and this thickness is referred to as HP2. The amount of ashing calculated from the amount of decrement of the resist thickness is set to a difference HP1-HP2 between HP1 and HP2.

It is assumed that (1) the source-gas supplying conditions and (2) the oxidizing-gas supplying conditions of Example 3 are the same as those of Example 2, and (3) the repetition conditions are set to 35 to 140 cycles.

In Example 4, instead of the ozone gas in Example 3, a steam oxidation raw gas is used. In Example 4, the thickness of the photoresist film 204 exposed to the surface is measured for only the case in which the thickness HA of the Al2O3 film 205 is equal to 10 nm.

Figure 27B:
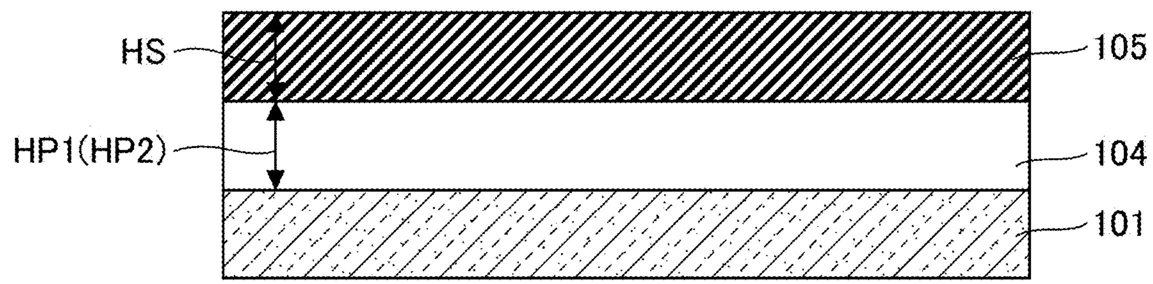

In Comparative Example 3, as illustrated in FIG. 27B, the photoresist film 104 which is about 300 nm thick is formed on the semiconductor substrate 101, the thickness of the photoresist film 104 is measured, and this thickness is referred to as HP1.

Next, the film deposition process which forms the SiO2 film 105 on the photoresist film 104 by supplying the Si source gas and the oxygen-containing gas alternately is performed. The thickness of the SiO2 film 105 at this time is referred to as HS.

Next, the fluoric acid (HF) washing is performed, the SiO2 film 105 is removed, the thickness of the photoresist film 104 exposed to the surface is measured, and it is referred to as HP2. The amount of asking calculated from the amount of decrement of the resist thickness is set to a difference HP1-HP2 between HP1 and HP2 similar to Example 3.

It is assumed that (1) the source-gas supplying conditions and (2) oxidizing-gas supplying conditions of Comparative Example 3 are the same as those of Comparative Example 2, and (3) the repetition conditions are set to 23 cycles or less.

Next, the thickness dimensions and the amount of ashing HP1-HP2 of the Al2O3 film obtained in Example 3, Example 4, and Comparative Example 3 are illustrated in FIG. 36.

As illustrated in FIG. 36, when the aluminum oxide film is formed and the ozone gas and the steam oxidation raw gas are used, the amount of ashing HP1-HP2 is smaller than in the case where the silicon oxide film is formed. That is, the amount of ashing does not increase with the increase of the film deposition time and film deposition thickness of the aluminum oxide film. Therefore, the ashing of the resist is not performed by the film deposition of the aluminum oxide film. It appears that when the aluminum oxide film is formed, the oxygen plasma does not arise.

As mentioned above, apart from the first embodiment in which the silicon oxide film is formed, because the configuration of the resist pattern after the end of the slimming process in this embodiment does not change before and after the film deposition process, this embodiment has the effect that the configuration of the resist pattern is precisely controllable.

As explained with reference to FIGS. 23 and 24, when performing the slimming process within a different process chamber from the film deposition apparatus which performs the film deposition process, the configuration of the resist pattern can be precisely controlled in this embodiment.

Next, with reference to FIGS. 28 to 29J, a fine pattern forming method of a sixth embodiment of this invention will be described.

Figure 28:
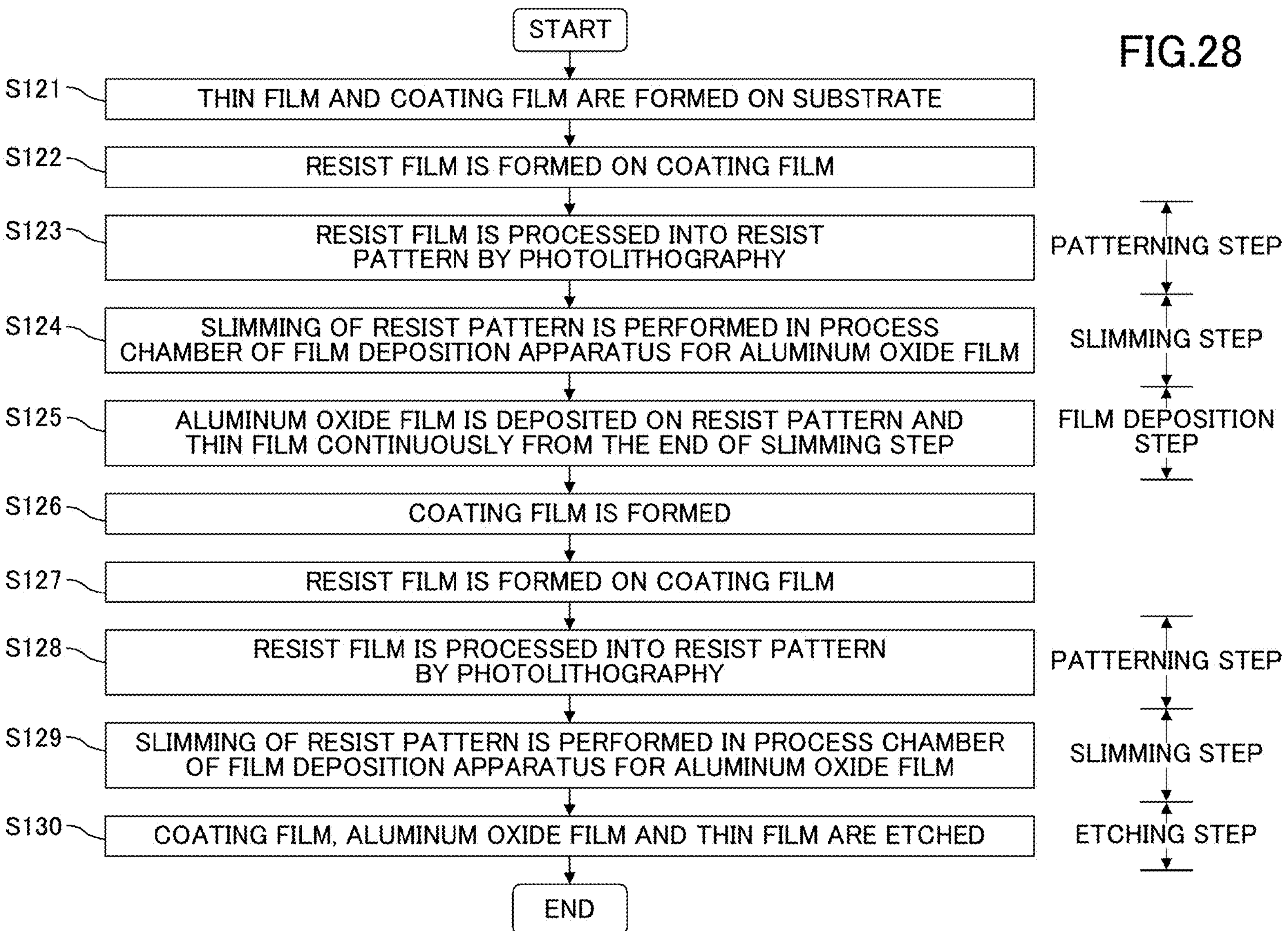
FIG. 28 is a flowchart for explaining the procedure of respective steps of a fine pattern forming method of a sixth embodiment of the invention.

FIG. 28 is a flowchart for explaining the procedure of each process of the fine pattern forming method of this embodiment. FIGS. 29A to 29J are cross-sectional views illustrating the configuration of the fine pattern in each of the respective steps of the fine pattern forming method of this embodiment.

The configuration of the fine pattern after the steps S121 to S130 of FIG. 28 are performed is equivalent to the configuration illustrated in FIGS. 29A to 29J. The fine pattern forming method of this embodiment is different from the previously described third embodiment in that an aluminum oxide film is formed instead of the silicon oxide film.

The fine pattern forming method of this embodiment includes, as illustrated in FIG. 28: the process which forms a thin film and a coating on a semiconductor substrate; the process which forms a resist film on the thin film and the coating; the patterning process which processes the resist film into resist patterns arranged at a first pitch (the first resist pattern (line parts)) by using the photolithographic technique (first patterning process); the slimming process (first slimming process) of processing the configuration of the resist pattern (the first resist pattern); and the film deposition process which forms an aluminum oxide film at room temperature on the thin film and the resist pattern after the end of the slimming process (first slimming process) by supplying the source gas and the oxygen-containing gas (the first resist pattern) to the process chamber. Thereafter, the process which forms a coating on the aluminum oxide film; the process which forms a resist film (the second resist film), and the second patterning process using the photolithography technique are performed. In the second patterning process, the resist film (the second resist film) is processed into second resist patterns having a second pitch equal to the first pitch, and second resist patterns are shifted by half of the first pitch so that the first resist patterns and the second resist patterns are arrayed alternately. Thereafter, the slimming process (second slimming process) of processing the configuration of the second resist patterns is performed, and the etching step is further performed.

The process which forms the thin film includes step S121, and the process which forms the resist film includes the first resist film forming step S122 and the second resist film forming step S127. The patterning process includes the first patterning step S123 and the second patterning step S128. The slimming process includes the first slimming step S124 and the second slimming step S129. The film deposition process includes the step S125 and the etching process includes the step S130.

Figure 29A:
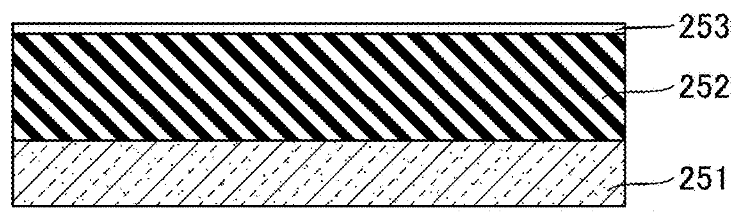
FIGS. 29A to 29J are cross-sectional views illustrating the configuration of the fine pattern in each of the respective steps of the fine pattern forming method of the sixth embodiment.

Step S121 is the same process as step S21 in the third embodiment, and as illustrated in FIG. 29A, the thin film 252 is formed on the semiconductor substrate 251 in this step S121. The thin film 252 is a film which will be processed into fine patterns later, and the thin film 252 may be an insulating layer of SiN or SiO2, and may be an electric conduction film like conductive polysilicon. Similar to the third embodiment, the thin film 252 may an insulating layer of SiN. That is, the material of the thin film 252 is not limited, and a film which contains any of silicon nitride, silicon oxide, oxynitriding silicon, amorphous silicon, or polysilicon can be used as the thin film 252. Similar to the third embodiment, the semiconductor substrate 251 may also include a structure in which the electric conduction film and the interlayer insulation film are formed. Similar to the third embodiment, the coating (BARC) 253 is formed on the thin film 252 by applying the acid resisting material. The thin film of this embodiment is equivalent to the film to be etched in the claims.

Figure 29B:
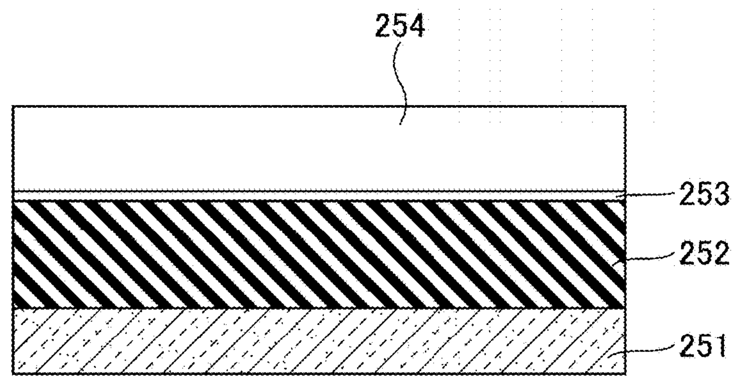
Figure 29C:
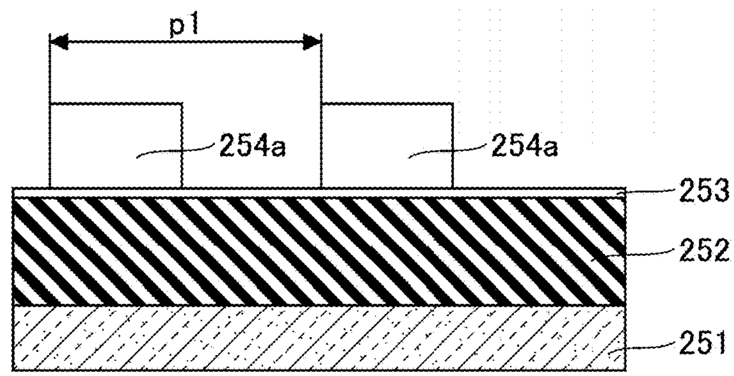

Step S122 is the same process as step S22 in the third embodiment, and as illustrated in FIG. 29B, the photoresist is applied and the photoresist film 254 is formed on the coating 253. Step S123 is the same process as step S23 in the third embodiment, and as illustrated in FIG. 29C, by using the photolithography technique, the photoresist film 254 is exposed and developed, and the resist patterns 254*a* having a predetermined pitch p1 are formed.

The resist pattern 254*a* and the patterning process (step S123) of this embodiment are equivalent to the first resist pattern and the first patterning process in the claims, respectively. The pitch p1 of this embodiment is equivalent to the first pitch in the claims. Therefore, the patterning process (first patterning process) of step S123 is a process processed into the first resist pattern that arranges a resist film in the first pitch by using the photolithographic technique.

Figure 29D:
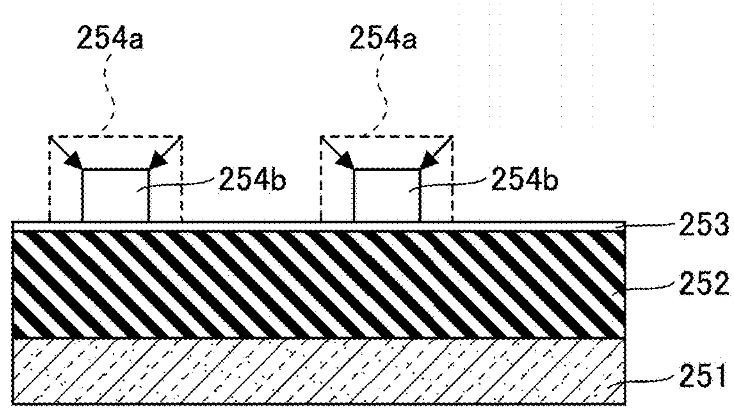

Step S124 is the same process as step S24 in the third embodiment, and as illustrated in FIG. 29D, in this step S124, the slimming process of the resist patterns 254*a* of the photoresist film 254 is performed to form the resist patterns 254*b* of the photoresist film 254 (the first slimming process). The method of the slimming process is not limited, and can be performed in the atmosphere containing the oxygen radical or the ozone gas, and the temperature is in a range of room temperature to 100 degrees C. The slimming process (step S124) of this embodiment is equivalent to the first slimming process in the claims.

Step S124 may be performed within the process chamber of the film deposition apparatus for performing the film deposition process of step S125 performed continuously after that, and may be performed within a process chamber different from the film deposition apparatus for performing the film deposition process of step S125.

Figure 29E:
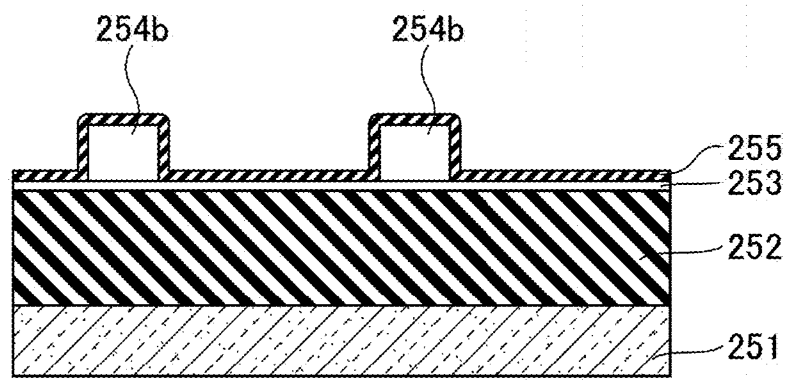

Step S125 is the same process as step S25 in the third embodiment, and as illustrated in FIG. 29E, in this step S125, an Al2O3 film 255, which is different from the thin film 252, the coating 253 and resist patterns 254*b*, is formed on the coating 253 and the resist patterns 254*b* after the end of the slimming process. In the step S125, the Al2O3 film 255 is formed in order to protect the resist patterns 254*b* from the second photolithography process which will be performed later. Similar to the fifth embodiment, by supplying alternately the source gas and the ozone gas (or steam oxidation raw gas) containing the organoaluminum compound, the Al2O3 film 255 is formed on the resist patterns 254*b* after the slimming process is performed, and on the coating 253.

Similar to the third embodiment, the film deposition process of step S125 may also be called hardening process. Similar to the fifth embodiment, the Al2O3 film 255 is equivalent to the aluminum oxide film in the claims, an AlOx film or other may be used instead as the Al2O3 film 255, and the aluminum oxide film may be formed at room temperature. An oxide film of another metal other than aluminum may be used if it does not damage the resist patterns at the time of film deposition.

Figure 29F:
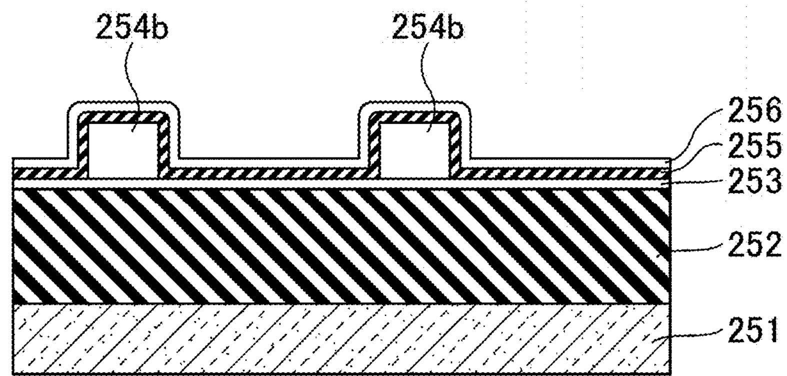

Step S126 is the same process as step S26 in the third embodiment, and as illustrated in FIG. 29F, in this step S126, the acid resisting material is applied and the coating (BARC) 256 is formed on the Al2O3 film 255. However, formation of the second coating 256 in step S126 may be omitted after the end of step S125, and step S127 may be performed.

When step S126 is skipped, the coating 253 formed in step S121 functions as a coating in the case of the exposure in step S128 which is the second patterning process.

Figure 29G:
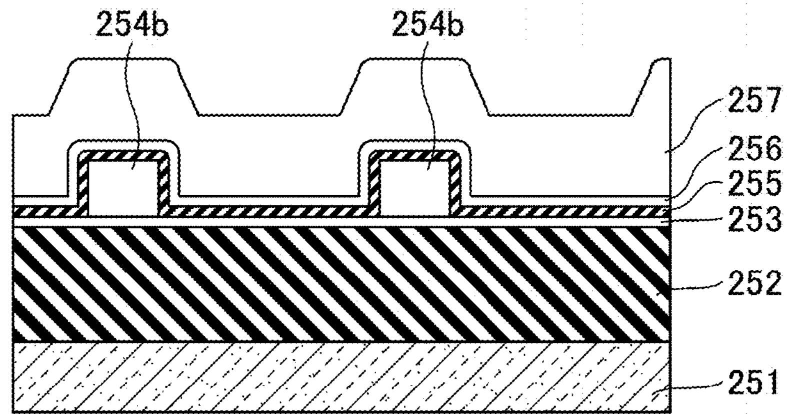

Step S127 is the same process as step S27 in the third embodiment, and as illustrated in FIG. 29G, in this step S127, the photoresist is applied and the photoresist film 257 is formed on the Al2O3 film 255. The photoresist film 257 of this embodiment is equivalent to the second resist film in the claims.

Figure 29H:
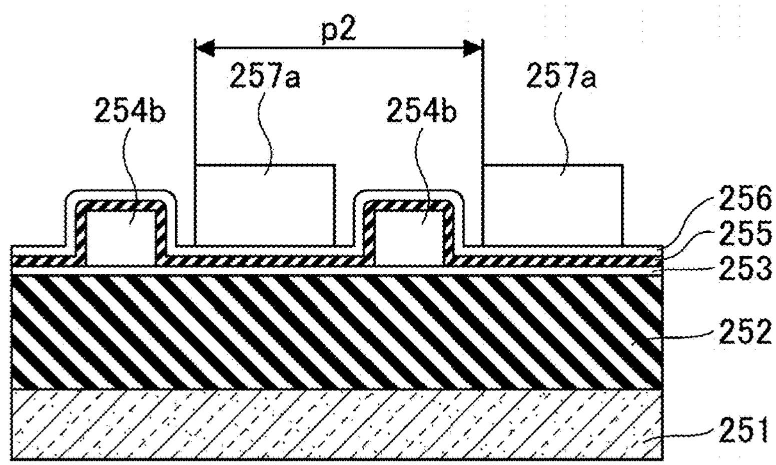

Step S128 is the same process as step S28 in the third embodiment, and as illustrated in FIG. 29H, in this step S128, the formed photoresist film 257 is exposed and developed so that the resist patterns 257*a* of the photoresist film 257 having a predetermined pitch p2 are formed. At this time, the pitch of resist patterns 257*a* is equal to the predetermined pitch p2.

In this embodiment, the resist patterns 257*a* are the same as the line and space patterns of the resist patterns 254*a* formed by the first photolithographic process and the slimming process. Moreover, the resist patterns 257*a* are arranged between the resist patterns 254*b* after the end of the slimming process so that the resist patterns 254*b* and the resist pattern 257*a* are arrayed alternately.

The resist pattern 257*a* and the patterning process (step S128) of this embodiment are equivalent to the second resist pattern and the second patterning process in the claims, respectively. The pitch p2 of this embodiment is equivalent to the second pitch in the claims, which is equal to the pitch p1 (the first pitch).

Figure 29I:
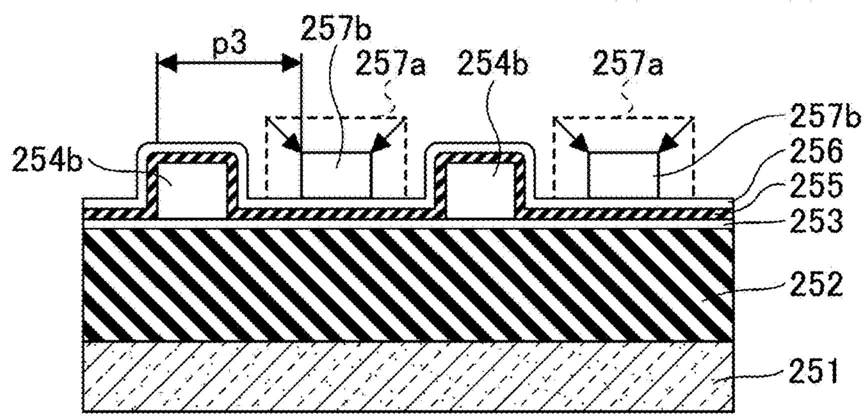

Step S129 is the same as the step S29 in the third embodiment, and, as illustrated in FIG. 29I, this step is a process which performs the slimming process of the resist patterns 257*a* of the photoresist film 257 to form the resist patterns 257*b* of the photoresist film 257 (the second slimming process).

The method of the slimming process is not limited, and can be performed in the atmosphere containing the oxygen radical or the ozone gas. The temperature is in a range of room temperature to 100 degrees C.

Step S129 may be performed within the process chamber of the film deposition apparatus for performing the film deposition process of step S125, and may be performed within a process chamber different from the film deposition apparatus for performing the film deposition process of step S125. Of the second slimming process, the resist pattern which includes the resist patterns 254*b* and 257*b* is formed.

The resist pattern is a pattern in which the patterns 254*b* and 257*b* are arranged alternately, and the pitch p3 is smaller than the pitch p1 or p2, and, in this embodiment, the pitch p3 is equal to about one half of the pitch p1 or p2. Thus, the resist pattern which has a pitch below the resolution limit can be formed by arranging alternately the resist patterns 254*b* in the pitch p1 and arranging the resist patterns 257*b* in the pitch p2 which is equal to the pitch p1.

The slimming process (step S129) of this embodiment is equivalent to the second slimming process in the claims. Step S129 may be performed within different equipment from the film deposition apparatus which may carry out within the film deposition apparatus which forms an aluminum oxide film, or forms an aluminum oxide film.

Figure 29J:
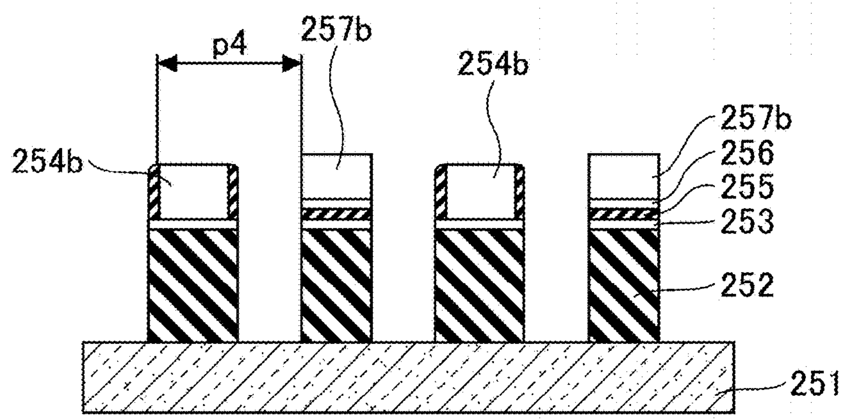

Step S130 is the same as the step S30 in the third embodiment, and as illustrated in FIG. 29J, in this step S130, the resist patterns 254*b* and 257*b* are used for the mask of etching, the coatings 256 and 253, the Al2O3 film 255, and the thin film 252 are etched and processed into the desired fine patterns of the thin film 252. The coating 256, the Al2O3 film 255, and the coating 253 are etched by using as a mask the resist pattern (the first resist pattern) 254*b* into which the configuration is processed, and the resist pattern (the second resist pattern) 257*b* into which the configuration is processed. What is necessary is just to etch the Al2O3 film 255 and the coating 253, when the coating 256 is omitted. Thereby, it arranges in pitch of the abbreviated half of predetermined pitch p1 (the first pitch), and the mask pattern which includes the photoresist film (the first resist film) 254 and photoresist film (the second resist film) 257 is formed.

Next, the thin film (film to be etched) 252 is etched using the mask pattern, and the thin film pattern (etching film pattern which includes the film to be etched) which includes the thin film 252 is formed. Since the pitch p4 of the thin film 252 processed by performing step S30 is almost equal to the pitch p3 of the resist patterns 254*b* and 257*b*, the pitch p4 of the fine patterns which includes the thin film 252 is made to be below the resolution limit. Thus, in this embodiment, the fine pattern which has pitch below the resolution limit can be formed.

In this embodiment, the configuration of the fine pattern formed of the LLE process is more controllable to precision.

Next, with reference to FIGS. 30 to 33, a fine pattern forming method of a seventh embodiment of the invention will be described.

Figure 31A:
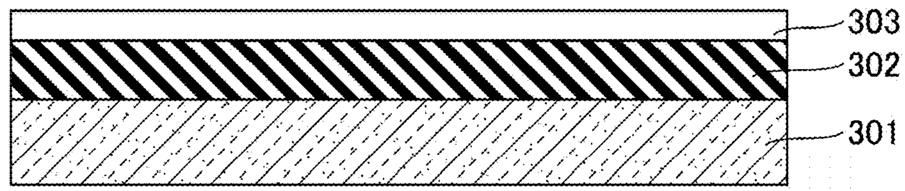
FIGS. 31A to 31I are cross-sectional views illustrating the configuration of the fine pattern in each of the respective steps of the fine pattern forming method of the seventh embodiment.
Figure 31B:
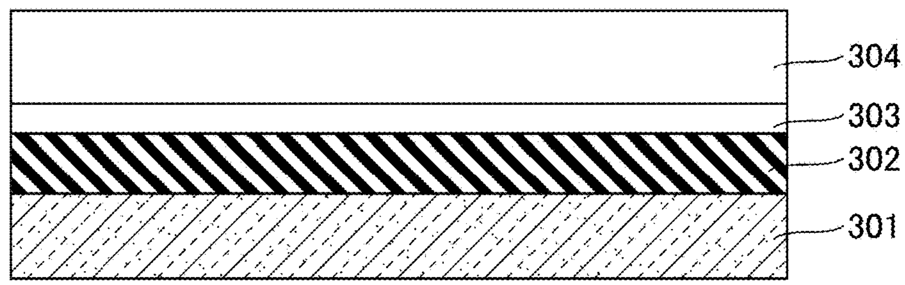
Figure 31C:
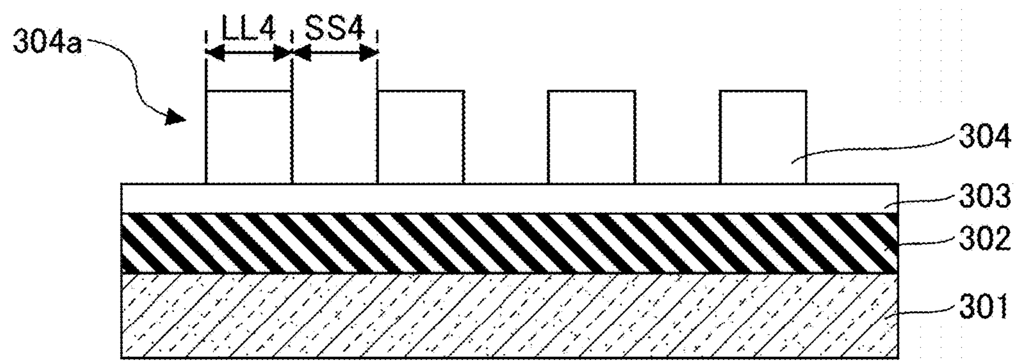

FIG. 30 is a flowchart for explaining the procedure of each process of the fine pattern forming method of this embodiment. FIGS. 31A to 31C are cross-sectional views illustrating the configuration of the fine pattern in each process of the fine pattern forming method of this embodiment.

The configuration of the fine pattern after the steps S211 to S218 of FIG. 30 are performed is equivalent to the configuration illustrated in FIGS. 31A to 31I. The fine pattern forming method of this embodiment is different from the fifth embodiment in that it forms a silicon oxide film as an oxide film after an aluminum oxide film is formed.

The fine pattern forming method of this embodiment as illustrated in FIG. 30 includes: the process which forms a thin film on a semiconductor substrate; the process which forms a resist film on the thin film; the patterning process which processes the resist film into resist patterns arrayed at a first pitch (the first resist pattern (line part)) by using the photolithographic technique (first patterning process); the slimming process of processing the configuration of the first resist patterns (first slimming process); the film deposition process which forms an aluminum oxide film at room temperature on the thin film and the resist patterns (the first resist patterns) after the end of the first slimming process by supplying the source gas and the oxygen radical; the silicon oxide film deposition process which forms a silicon oxide film on the aluminum oxide film after the end of the film deposition process by supplying the source gas and the oxygen radical containing organic silicon; the oxide film etching step which etches the aluminum oxide film and the silicon oxide film so that the silicon oxide film and the aluminum oxide film remain as side wall parts on the side faces of the line parts of the resist pattern; and the process which removes the resist pattern and etches the organic film.

The process which forms the thin film includes the step S211 and the process which forms the resist film includes the step S212. The patterning process includes the step S213, the slimming process includes the step S214, the film deposition process includes the step S215, the silicon oxide film deposition process includes the step S216, the etching step includes the S217, the process which removes the resist pattern and etches the organic film includes the step S218, and the process which etches the thin film includes the step S219. The etching step in FIG. 30 is equivalent to the oxide film etching step in the claims.

Similar to the fifth embodiment, as illustrated in FIG. 30, consecutive processing of the step S214 and the step S215 does not have to be performed within the same chamber (process chamber) in this embodiment.

Step S211 is the same process as step S111 in the fifth embodiment, and as illustrated in FIG. 31A, in this step S211, the thin film 302 and the organic film 303 are formed on the semiconductor substrate 301 sequentially from the bottom thereof. The semiconductor substrate 301, the thin film 302, and the organic film 303 are the same as in the fifth embodiment. The thin film and the organic film of this embodiment are equivalent to the film to be etched and the coating in the claims, respectively.

The material of the thin film 202 is not limited, and a film containing any of silicon nitride, silicon oxide, oxynitriding silicon, amorphous silicon, or polysilicon can be used as the thin film 202. Step S212 is the same process as step S112 in the fifth embodiment, and as illustrated in FIG. 31B, in this step S212, the photoresist film 304 is formed. Step S213 is the same process as step S113 in the fifth embodiment, and as illustrated in FIG. 31C, in this step S213, the formed photoresist film 304 is exposed and developed, and the resist pattern 304*a* of the photoresist film 304 is formed. Moreover, the resist pattern 304*a* of the photoresist film 304 having the line width LL4 and the space width SS4 is formed.

In this embodiment, each line which has the line width LL4 and constitutes the resist pattern is defined as a line part. Therefore, the patterning process of this embodiment is a process which processes the resist film into the resist patterns having the line parts arrayed at a predetermined pitch by using the photolithographic technique.

Figure 31D:
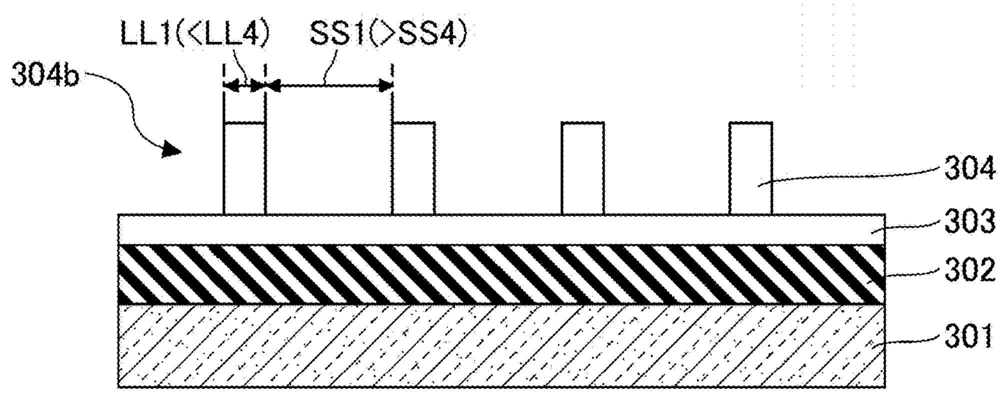

Step S214 is the same process as step S114 in the fifth embodiment, and as illustrated in FIG. 31D, in this step S214, the slimming process of the resist pattern 304*a* of the photoresist film 304 is performed to form the resist pattern 304*b* of the photoresist film 304.

Similar to the fifth embodiment, the step S214 in this embodiment may be performed within the process chamber of the film deposition apparatus which is used to perform the film deposition process of step S215. Alternatively, the step S214 in this embodiment may be performed within a process chamber which is different from the process chamber of the film deposition apparatus which is used to perform the film deposition process of step S215.

The method of the slimming process may be performed similar to the fifth embodiment, and the line width LL1 and the space width SS1 of the resist pattern 304*b* after the end of the slimming process are set to LL1<LL4 and SS1>SS4.

Figure 31E:
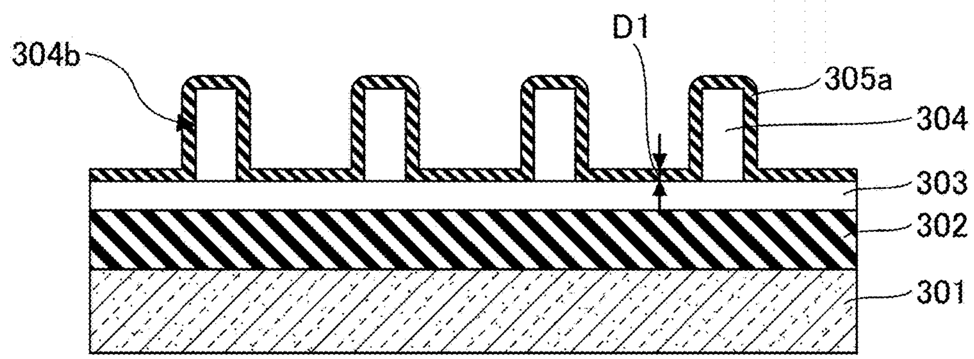

As illustrated in FIG. 31E, step S215 is a film deposition process which forms the Al2O3 film 305*a* on the organic film 303 and the resist patterns 304*b* after the end of the slimming process. However, the Al2O3 film 305*a* is formed for covering the resist patterns 304*b* and the organic film 203, and the thickness of the Al2O3 film 305*a* may be smaller than that of the Al2O3 film 205 in the fifth embodiment.

The thickness of the Al2O3 film 305*a* is set to D1. The Al2O3 film (aluminum oxide film) may be a film of another material, such as an AlOx film instead of the Al2O3 film. The Al2O3 film 305*a* is equivalent to the aluminum oxide film in the claims. The film deposition process of the Al2O3 film 305*a* may be performed similar to the fifth embodiment.

Figure 31F:
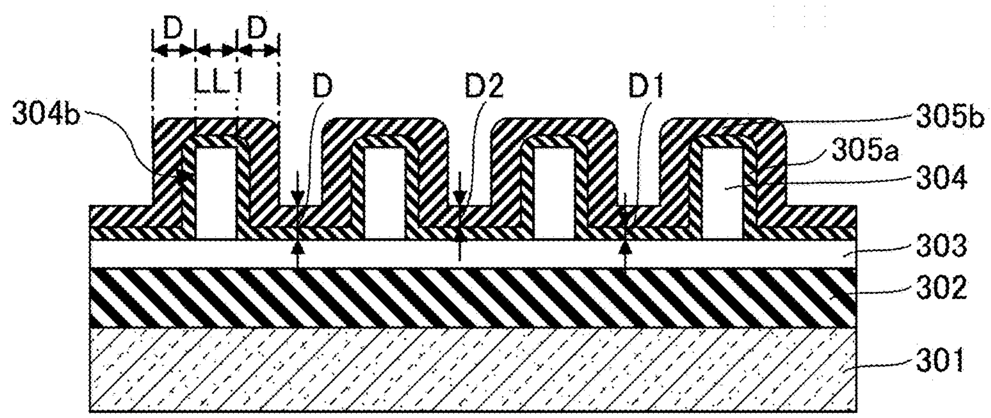

Step S216 is a process which is not included in the fifth embodiment, and as illustrated in FIG. 31F, this step S216 is a silicon oxide film deposition process which forms the SiO2 film 305*b* on the Al2O3 film 305*a* after the end of the film deposition process of step S215. The silicon oxide film deposition process may be performed similar to the step S15 in the first embodiment. The thickness of the SiO2 film 305*b* is set to D2. The thickness D of the sum of the lamination layer of the Al2O3 film 305*a* and the SiO2 film 305*b* is set to D=D1+D2. The width of the lamination layer of the Al2O3 film 305*a* and the SiO2 film 305*b* which cover the side faces of the resist pattern 304*b* is also set to D, and this width D can set to 30 nm.

By performing the etching step, the oxide film is etched to remain as side wall parts on the side faces of the line part of the resist pattern after the slimming process is performed. The etching step is a process which etches the oxide film to remain as side walls on the side faces of the line part of the resist pattern after the slimming process is performed.

Figure 31G:
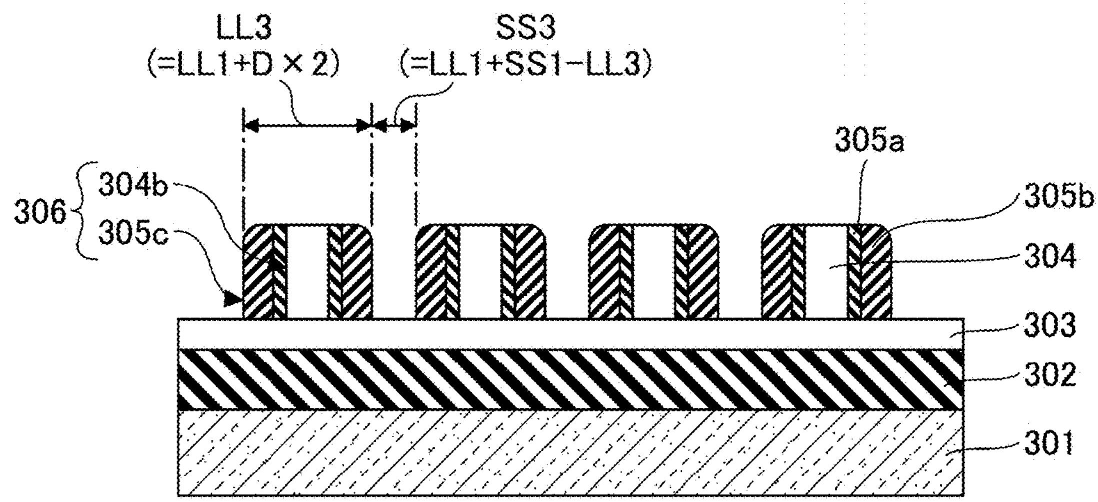

Step S217 is the same process as step S116 in the fifth embodiment, and as illustrated in FIG. 31G, this step S217 is an etching step which etches the oxide film so that the lamination layer which includes the SiO2 film 305*b* and the Al2O3 film 305*a* may remain only as side wall parts 305*c* of the resist pattern 304*b* (etch back).

The third pattern 306 that includes the resist pattern 304*b* and the wall part 305*c* is formed. If the line width of the third pattern 306 is set to LL3 and the space width is set to SS3, the line width and the space width are set to LL3=LL1+D×2 and SS3=LL1+SS1−LL3.

Figure 31H:
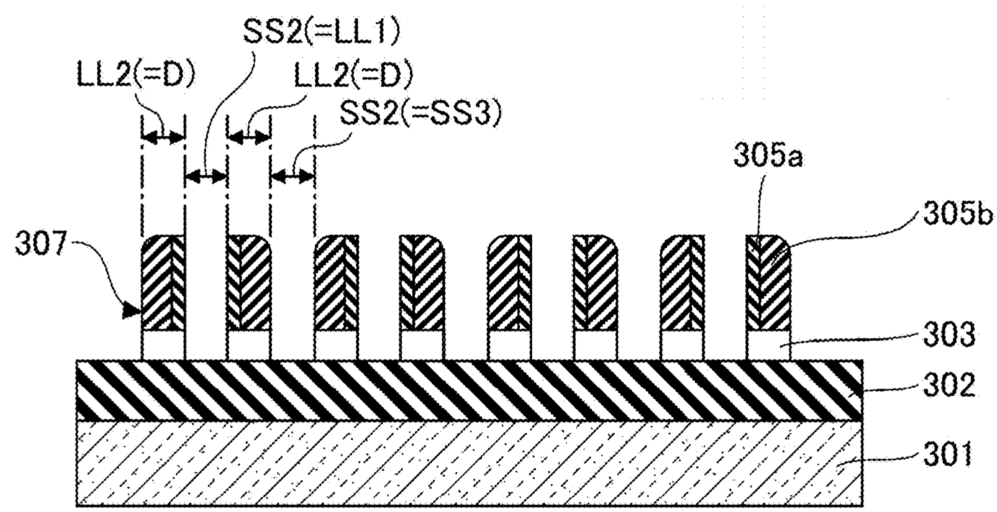

Step S218 is the same process as step S117 in the fifth embodiment, and as illustrated in FIG. 31H, this step S218 includes a process which removes the resist pattern 304*b* and forms the side wall parts 305*c*, and a process which etches the organic film 303 by using the side wall parts 305*c* as a mask. The second pattern 307 in which the line width is equal to D and the space width LL1 and the space width SS3 appear alternately is formed. Similar to the fifth embodiment, the space width may be set to SS2 that is equal to LL1 or SS3, and the line width which is equal to D may be set to LL2 anew.

The second pattern 307 includes the wall parts 305*c* and the organic film (coating) 303, and is equivalent to the mask pattern in the claims.

Subsequently, the thin film 302 is etched by using the second patterns 307 as a mask, which is the same as that of the fifth embodiment. That is, step S219 is performed.

Figure 31I:
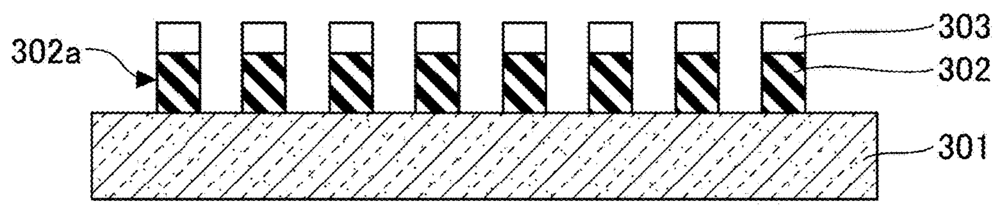

In step S219, the thin film (film to be etched) 302 is processed using the second patterns (mask patterns) 307, and as illustrated in FIG. 31I, the pattern 302*a* including the thin film (film to be etched) 302 is formed. The organic film (coating) 303 may remain in the upper part of the pattern 302*a*. The etching of the thin film 302 may be performed using a gas containing a CF base gas, a CHF base gas, a CH base gas, or an oxygen gas.

In this embodiment, the film deposition process of step S215 may be performed using the film deposition apparatus explained using FIGS. 23 and 24 by the fifth embodiment. The silicon oxide film deposition process of step S216 may be performed using the film deposition apparatus explained using FIGS. 3 and 4 explained by the first embodiment. Alternatively, the film deposition process of step S215 may be performed, and the silicon oxide film deposition process of step S216 continuously using the film deposition apparatus illustrated in FIGS. 3 and 4. In that case, the processes from the slimming process of step S214 to the silicon oxide film deposition process of step S216 may be continuously performed within the same film deposition apparatus. The silicon oxide film can be formed while keeping the surface of the resist pattern pure, and uniformity in the surface of the semiconductor substrate of the configuration of fine patterns having the pitch below the resolution limit can be made better.

Since the processes which use the processing unit which carries out slimming process of the resist pattern are reducible, the cost of the process which forms a fine pattern can be reduced.

Next, as illustrated in FIG. 32 and FIG. 37, the configuration of the resist pattern after the slimming process in this embodiment does not change before and after the film deposition process, and it is possible to control the configuration of the resist pattern precisely. In the following, the width dimensions of the resist pattern after the film deposition process are measured and estimated, and the evaluation result will be described. FIG. 32 is a photograph and a schematic diagram of the resist pattern after the aluminum oxide film and the silicon oxide film in Example 5 are formed.

In Example 5, the film deposition process which forms the aluminum oxide film on the resist pattern after the slimming process by supplying the Al source gas and the ozone gas alternately is performed, and the silicon oxide film deposition process which forms the silicon oxide film on the resist pattern by supplying the Si source gas and the oxygen-containing gas alternately is performed. The evaluation result of Example 5 is compared with that of Comparative Example 3 described in the fifth embodiment.

The film deposition conditions of the film deposition process in Example 5 are illustrated below.

Example 5

(A) Film Deposition Conditions of Aluminum Oxide Film
(1) Source Gas Supplying Conditions
Source gas: TMA
Substrate temperature: no heating
Internal pressure of film deposition apparatus: 39.9 Pa
Gas mass flow: 100 sccm
Supplying time: 5 sec
(2) Oxidizing Gas Supplying Conditions
Oxidizing gas: ozone gas+oxygen gas
Substrate temperature: no heating
Internal pressure of film deposition apparatus: 133 Pa
Ozone gas flow rate: 200 g/m3
Oxygen gas mass flow: 10.0 slm
Supplying time: 15 sec
(3) Repetition Conditions
Total cycle: 35 cycles
(B) Film Deposition Conditions of Silicon Oxide Film
(1) Source Gas Supplying Conditions
Source gas: DIPAS (LTO520)
Substrate temperature: no heating
Internal pressure of film deposition apparatus: 26.7-667 Pa
Gas mass flow: 50-1000 sccm
Supplying time: 1-10 sec
(2) Oxidizing Gas Supplying Conditions
Oxidizing gas: oxygen gas
Substrate temperature: no heating
Internal pressure of film deposition apparatus: 66.7-227 Pa
Gas mass flow: 5-30 slm
Supplying time: 5-30 sec
RF generator frequency: 13.56 MHz
RF generator power: 50-500 W
(3) Repetition Conditions
Total cycle: 120-130 cycles FIG. 32 is a SEM photograph (left-hand side) and its schematic diagram (right-hand side) of the resist pattern after the aluminum oxide film in Example 5 is formed. As illustrated in FIG. 32, D denotes the thickness of the aluminum oxide film, H denotes the height of the resist pattern, T denotes the top width of the resist pattern, M denotes the width of the resist pattern at the position of a height which is equal to half of the bottom to top height of the resist pattern, and B denotes the bottom width of the resist pattern.

Next, FIG. 37 illustrates the dimensions H, T, M, B, and the ratio T/B of the top width to the bottom width of the resist pattern obtained in Example and Comparative Example 2. As illustrated in FIG. 37, D1, D2 and D of Example 5 are 5 nm, 25 nm and 30 nm, and D of Comparative Example 2 is 30 nm.

As illustrated in FIG. 37, the height H, the top width T and the bottom width B of the resist pattern when the lamination layer of the aluminum oxide film and the silicon oxide film is formed are larger than in the case where only the silicon oxide film is formed. That is, the decrement of the dimensions of the resist pattern before and after the lamination layer of the aluminum oxide film and the silicon oxide film is formed is smaller than the decrement of the dimensions of the resist pattern before and after the silicon oxide film is formed.

Next, as illustrated in FIG. 33 and FIG. 38, it is possible to prevent the resist pattern after the slimming process in this embodiment from being damaged.

In Examples 6 and 7, the photoresist film is formed, and the thickness of the photoresist film after the oxide film is formed is measured without processing the configuration of the photoresist film and the measured thickness is estimated. The evaluation results of Examples 6 and 7 are compared with that of Comparative Example 3.

FIG. 33 is a cross-sectional view illustrating the configuration of the films for measuring the amount of ashing of the resists in Examples 6 and 7 and Comparative Example 3.

In Example 3, as illustrated in FIG. 33, the photoresist film 304 which is about 300 nm thick is formed on the semiconductor substrate 301, and the thickness of the photoresist film 304 is measured. HP1 denotes the thickness of the photoresist film 304.

Next, the film deposition process which forms the Al2O3 film 305*a* on the photoresist film 304 by supplying the Al source gas and the ozone gas alternately is performed. At this time, the supplying cycle at which the Al source gas and the ozone gas are supplied is changed, and the thickness HA1 of the Al2O3 film 305*a* is changed to 5 nm, 10 nm, 15 nm and 20 nm.

Next, the film deposition process is performed which forms the SiO2 film 305*b* on the Al2O3 film 305*a* by supplying the Si source gas and the oxygen-containing gas alternately is performed. At this time, the supplying cycle at which the Si source gas and the oxygen-containing gas are supplied alternately is changed, and the thickness HS1 of the SiO2 film 305*b* is equal to 5 nm.

Next, the fluoric acid (HF) washing is performed, the SiO2 film 305*b* and the Al2O3 film 305*a* are removed, and the thickness of the photoresist film 304 is measured. HP2 denotes the thickness of the photoresist film 304.

The amount of ashing calculated from the amount of decrement of the resist thickness is set to a difference HP1-HP2 between HP1 and HP2. It is assumed that (1) the source-gas supplying conditions and (2) the oxidizing-gas supplying conditions for the aluminum oxide film of Example 6 are the same as those of Example 2, and (3) the repetition conditions are set to to 140 cycles. It is assumed that (1) the source-gas supplying conditions and (2) the oxidizing-gas supplying conditions for the silicon oxide film of Example 6 are the same as those of Comparative Example 2, and (3) the repetition conditions are set to 23 cycles or less.

In Example 7, instead of the ozone gas in the film deposition process of the aluminum oxide film of Example 6, the steam oxidation raw gas is used. In Example 7, the thickness of the photoresist film 304 is measured for only the case in which the thickness HA1 of the Al2O3 film 305*a* is set to 10 nm.

Next, the thickness dimensions and the amount of ashing HP1-HP2 of the Al2O3 film obtained in Example 6, Example 7, and Comparative Example 3 are illustrated in FIG. 38.

As illustrated in FIG. 38, when the aluminum oxide film and the silicon oxide film are formed and the ozone gas and the steam oxidation raw gas are used, the amount of ashing HP1-HP2 can be reduced. That is, the amount of ashing does not increase with the increase of the film deposition time and film deposition thickness of the aluminum oxide film. Therefore, ashing of the resist is not performed by the film deposition of the aluminum oxide film. It appears that when the aluminum oxide film is formed, the oxygen plasma does not arise. In addition, when the aluminum oxide film and the silicon oxide film are formed, the amount of ashing is smaller than the case where the silicon oxide film is formed. Therefore, when forming the silicon oxide on the resist, the block performance against the oxygen plasma can be improved and the reduction of the thickness of the silicon oxide due to the asking of the resist by the oxygen plasma can be prevented. It is easy to make the deposition rate which forms the silicon oxide film larger than the deposition rate which forms the aluminum oxide film. Therefore, when the aluminum oxide film and the silicon oxide film are formed, throughput can be improved compared to the case where only the aluminum oxide film is formed independently.

As mentioned above, in this embodiment, rather than the fifth embodiment that forms independently the first embodiment and aluminum oxide that form silicon oxide independently, while the configuration of a resist pattern is precisely controllable, the effect is that throughput can be raised. In this embodiment, since a resist pattern is protected when forming the oxide film, the configuration of the resist pattern is easy to be maintained. As illustrated in FIGS. 23 and 24, when performing a slimming process within a process chamber different from the film deposition apparatus which performs a film deposition process, the configuration of the resist pattern can be controlled precisely. The method of using the lamination layer of the aluminum oxide film and the silicon oxide film in this embodiment is applicable also to the LLE process in the third embodiment and the sixth embodiment.

In the embodiments of the invention, when forming mask patterns (or fine patterns) from the silicon oxide film formed on the pattern organic film, the cost of the process or apparatus for performing the slimming process of the resist patterns can be reduced, and the cost of the entire mask pattern (or fine pattern) forming process can be reduced. Moreover, it is possible for the embodiments of the invention to perform the slimming process or the film deposition process while ensuring that the difference between the top width and the bottom width of each of the resist patterns is made small, and it is possible to form mask patterns (or fine patterns) with a good configuration.

The present invention is not limited to the above-described embodiments, and variations and modifications may be made without departing from the scope of the invention.

What is claimed is:

1. A film deposition apparatus comprising:

a process chamber configured to process a substrate including a pattern on a thin film, the pattern having lines and spaces therein;

a source gas supplying device configured to supply a source gas to the process chamber;

an oxygen-containing gas supplying device configured to supply an oxygen-containing gas to the process chamber;

a plasma generating device configured to generate a given plasma in the process chamber;

a heating device configured to heat the substrate; and a controller configured to:

(a) slim the pattern in the process chamber using a first oxygen-containing gas plasma generated by the plasma generating device while causing the heating device to heat the substrate at a first temperature of 100 degrees Celsius or less;

(b) cause the heating device to heat the substrate at a second temperature of room temperature to 300 degrees C.; and (c) form an oxide film on the slimmed pattern and the thin film in the process chamber by adsorbing the source gas on the slimmed pattern and the thin film and oxidizing the source gas using a second oxygen-containing gas plasma generated by the plasma generating device while causing the heating device to heat the substrate at the second temperature, the adsorbing the source gas and the oxidizing the source gas being performed alternately, and generating the second oxygen-containing gas plasma being performed intermittently.

2. The film deposition apparatus according to claim 1, wherein the slimming of the pattern and the forming of the oxide film are performed in the same process chamber.

3. The film deposition apparatus according to claim 1, wherein the slimming of the pattern and the forming of the oxide film are consecutively performed in the same film deposition apparatus.

4. The film deposition apparatus according to claim 1, wherein the source gas supplying device is configured to supply the source gas to the process chamber periodically.

5. The film deposition apparatus according to claim 1, wherein the pattern is a resist pattern.

6. The film deposition apparatus according to claim 1, further comprising:

a heating device configured to heat the substrate.

7. The film deposition apparatus according to claim 1, wherein the heating device is configured to heat the substrate at temperatures 100 degrees Celsius or less.

8. The film deposition apparatus according to claim 1, wherein the source gas supplying device is configured to supply the source gas including silicon.

9. The film deposition apparatus according to claim 1, wherein the source gas supplying device is configured to supply the source gas including an aminosilane precursor.

10. The film deposition apparatus according to claim 1, wherein the source gas supplying device is configured to supply the source gas, wherein the source gas is at least one gas selected from the group consisting of bis-tertiary-butylamino silane, bis-dimethylamino silane, bis-diethylamino silane, dipropyl amino silane, butylamino silane, diisopropyl amino silane and tri-dimethyl amino silane.

11. The film deposition apparatus according to claim 1, wherein the source gas supplying device is configured to supply the source gas including bis-diethylamino silane.

12. The film deposition apparatus according to claim 1, wherein the source gas supplying device is configured to supply the source gas including diisopropyl amino silane.

13. The film deposition apparatus according to claim 1, wherein the source gas supplying device is configured to supply the source gas including organic metal.

14. The film deposition apparatus according to claim 1, wherein the oxygen-containing gas supplying device is configured to supply the oxygen-containing gas, wherein the oxygen-containing gas is at least one gas selected from the group consisting of O2 gas, NO gas, N2O gas, H2O gas and O3.

15. The film deposition apparatus according to claim 1, wherein the oxygen-containing gas supplying device is configured to supply an O2 gas to the process chamber.

16. The film deposition apparatus according to claim 1, wherein the oxide film comprises silicon oxide.

17. The film deposition apparatus according to claim 1, wherein the oxide film comprises metal oxide.

18. The film deposition apparatus according to claim 1, wherein the oxide film comprises silicon oxide and metal oxide.

19. The film deposition apparatus according to claim 1, further comprising:

a purge gas supplying device configured to supply a purge gas to the process chamber;

wherein the controller is configured to:

(d) purge the process chamber between the slimming of the pattern and the forming of the oxide film.

20. The film deposition apparatus according to claim 1, further comprising:

an evacuation device configured to evacuate a remaining gas from the process chamber;

wherein the controller is configured to:

(d) evacuate the remaining gas from the process chamber between the slimming of the pattern and the forming of the oxide film.

21. The film deposition apparatus according to claim 1, wherein the plasma generating device comprises a pair of electrodes arranged to form a high frequency electric field between the pair of electrodes.

22. The film deposition apparatus according to claim 1, wherein the plasma generating device is configured to generate the given plasma using an RF generator supplying radio frequency power between 50-500 W at a frequency of 13.56 MHz.

23. The film deposition apparatus according to claim 1, wherein the plasma generating device is configured to generate the given plasma in the process chamber periodically.

24. The film deposition apparatus according to claim 1, wherein the plasma generating device is configured to generate O2 plasma in the process chamber.

25. The film deposition apparatus according to claim 1, wherein the slimmed pattern has lines and spaces, a ratio of a width of the line to a width of the space is 1:3.

* * * * *